United States Patent
Shimbo et al.

(10) Patent No.: US 10,186,360 B2
(45) Date of Patent: Jan. 22, 2019

(54) ARCUATE MAGNET PIECE, PERMANENT MAGNET PIECE, PERMANENT MAGNET ASSEMBLY, PERMANENT MAGNET APPLICATION DEVICE, AND MOTOR

(71) Applicant: TDK CORPORATION, Tokyo (JP)

(72) Inventors: Nobuyuki Shimbo, Tokyo (JP); Masashi Gotoh, Tokyo (JP)

(73) Assignee: TDK CORPORATION, Tokyo (JP)

( * ) Notice: Subject to any disclaimer, the term of this patent is extended or adjusted under 35 U.S.C. 154(b) by 309 days.

(21) Appl. No.: 15/129,799

(22) PCT Filed: Mar. 27, 2015

(86) PCT No.: PCT/JP2015/059787
§ 371 (c)(1),
(2) Date: Sep. 27, 2016

(87) PCT Pub. No.: WO2015/147304
PCT Pub. Date: Oct. 1, 2015

(65) Prior Publication Data
US 2017/0162311 A1  Jun. 8, 2017

(30) Foreign Application Priority Data

Mar. 27, 2014 (JP) .................. 2014-066438

(51) Int. Cl.
*H02K 1/27* (2006.01)
*H01F 7/02* (2006.01)
(Continued)

(52) U.S. Cl.
CPC ........... *H01F 7/021* (2013.01); *G01R 33/383* (2013.01); *H02K 1/2706* (2013.01);
(Continued)

(58) Field of Classification Search
USPC ......................................................... 310/156
See application file for complete search history.

(56) References Cited

U.S. PATENT DOCUMENTS 3,631,277 A    12/1971  Ferdig et al.
4,219,752 A *   8/1980  Katou .................. H02K 1/2786
                                                310/153
(Continued)

FOREIGN PATENT DOCUMENTS

JP    S59-156264 U    10/1984
JP    S63-41166 U     3/1988
(Continued)

OTHER PUBLICATIONS

Jun. 23, 2015 International Search Report issued in International Patent Application No. PCT/JP2015/059787.
(Continued)

*Primary Examiner* — Forrest M Phillips
(74) *Attorney, Agent, or Firm* — Oliff PLC

(57) ABSTRACT

This arcuate magnet piece includes: coupling side surfaces which are coupled with other adjacently joined arcuate magnet pieces; a curved inner peripheral surface; and a curved outer peripheral surface which faces the inner peripheral surface. The coupling side surfaces include tip surfaces which intersect, at prescribed angles, tangents to the direction of curvature of the outer peripheral surface. The coupling side surfaces are polarized such that, in cases when the gaps formed with the coupling side surfaces of the other arcuate magnet pieces are disposed so as to be substantially parallel, the magnetic poles of the other joined arcuate magnet pieces are different.

39 Claims, 37 Drawing Sheets

(51) Int. Cl.
*H02K 15/03* (2006.01)
*G01R 33/383* (2006.01)

(52) U.S. Cl.
CPC ......... *H02K 1/2713* (2013.01); *H02K 1/2786* (2013.01); *H02K 15/03* (2013.01); *H02K 2213/03* (2013.01)

(56) References Cited

U.S. PATENT DOCUMENTS

| | | | |
|---|---|---|---|
| 5,773,908 A | | 6/1998 | Stephens et al. |
| 7,012,349 B1 * | | 3/2006 | Walker ................ H02K 1/2786 310/152 |
| 7,402,930 B2 * | | 7/2008 | Kihara ................ H02K 21/222 310/153 |
| 2005/0040721 A1 | | 2/2005 | Kusase et al. |
| 2010/0127590 A1 | | 5/2010 | Metral et al. |
| 2015/0097642 A1 * | | 4/2015 | Takagi ................ B23K 20/026 335/306 |

FOREIGN PATENT DOCUMENTS

| | | |
|---|---|---|
| JP | H1-114354 A | 5/1989 |
| JP | H05-284721 A | 10/1993 |
| JP | H10-326710 A | 12/1998 |
| JP | H11-136886 A | 5/1999 |
| JP | 2004-259850 A | 9/2004 |
| JP | 2010-233346 A | 10/2010 |
| JP | 2012-074579 A | 4/2012 |
| JP | 2012-228072 A | 11/2012 |
| WO | WO-8300264 A1 * | 1/1983 |

OTHER PUBLICATIONS

Jun. 1, 2016 International Preliminary Report on Patentability issued in International Patent Application No. PCT/JP2015/059787.

* cited by examiner

FIG. 3
(A)
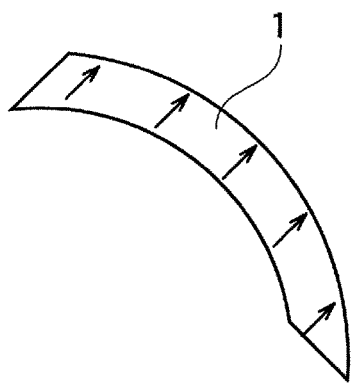
(B)
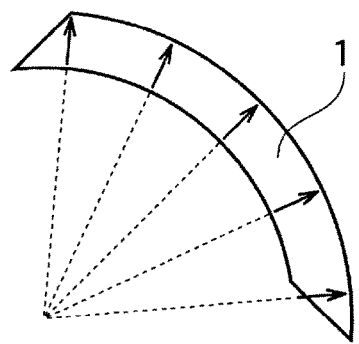
(C)
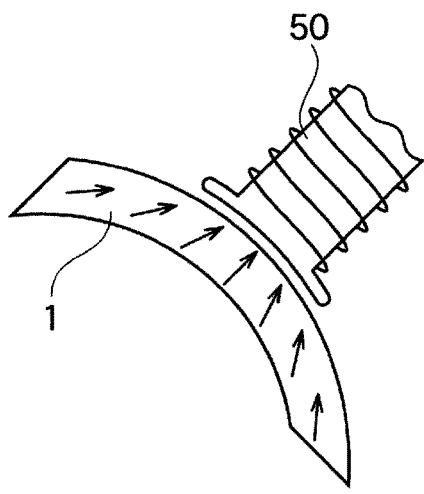
(D)
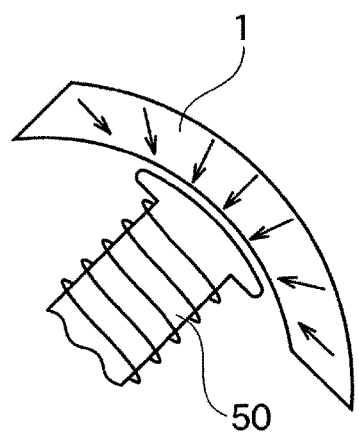

ARCUATE MAGNET PIECE, PERMANENT MAGNET PIECE, PERMANENT MAGNET ASSEMBLY, PERMANENT MAGNET APPLICATION DEVICE, AND MOTOR

TECHNICAL FIELD

The present invention relates to an arcuate magnet piece, a permanent magnet piece, a permanent magnet assembly, a permanent magnet application device and a motor.

DESCRIPTION OF THE RELATED ART

Conventionally, the permanent magnet motor is widely used for various motors such as for the automobile, the office application, and the industrial devices since high efficiency can be obtained easily. To this permanent magnet motor, usually the number of 2n (n is a positive integer) of the arcuate magnet pieces or a ring form magnet having multi polar structure comprising 2n (n is a positive integer) of magnetic poles are assembled to the surface which is relatively rotating with respect to an armature wound with the coils.

The permanent magnet motor used for use has been rapidly become compact and thin, and also has obtained higher performance, and in order to correspond to this, the need to make more compact and thin magnet for mounting to the motor has also increased; and at the same time, further improvements of the magnetic characteristics such as the surface magnetic flux density and the easy production are also in great demand.

On the other hand, for the use of which the reduction of the rotational unevenness, noise and vibration are important, the motor wherein the torque ripple including the cogging torque or so are sufficiently reduced are in great demand.

In order to respond to such demands, for example the patent document 1 as the conventional art discloses the permanent magnet as the magnetizing part which is constituted by the arcuate magnet divided in the circumference direction.

Here, when the permanent magnet as the magnetizing group is constituted by the arcuate magnet, when installing the arcuate magnet to the yoke material, it is necessary to form a space between each arcuate magnet so that the arcuate magnets do not interfere with each other.

In this case, as the magnetic pole of the arcuate magnet pieces adjacent to each other are different, thus the attractive torque acts between the connecting side surfaces of the adjacent arcuate magnet pieces. Here, when focusing on one arcuate magnet piece, in general one of the connecting side surfaces thereof is adjacent to other arcuate magnet piece while taking certain amount of space between, and certain amount of the attractive torque acts; and other one of the connecting side surface is adjacent to further other arcuate magnet piece while taking different space between, and different amount of the attractive torque is acting.

That is, one of the arcuate magnet pieces which are focused in the above tends to be attracted to other arcuate magnet piece having larger attractive torque among the attractive torques acting to two connecting side surfaces. Therefore, the space between each arcuate magnet pieces tends to be uneven, and the mounting accuracy is deteriorated, and the periodic change of the magnetic flux density of each magnetic pole is disordered. Also, the connecting side surface of each arcuate magnet piece is almost perpendicular with respect to the tangent line in the curving direction of the outer circumference surface, hence the change of the radial direction component of the magnetic flux density between the magnetic poles are steep. As a result, cogging torque, vibration was large and noises were loud.

Also, in order to mount each arcuate magnet pieces with high accuracy, it is necessary to produce the equipment such as the mounting jigs or so in high accuracy in order to the balance of the attractive torque acting and the connecting side surface of the plurality of adjacent arcuate magnet pieces, thus the production cost was high.

Furthermore, on the other hand, particularly in recent years, the large scale magnets wherein plurality of magnets is assembled are not only used for motors but also for linear motor cars along the development of the traffic technology or so. Also, the large scale magnets are used for MRI along with the development of the medical technologies, and also used for the wind power generation along with the use of the renewable energy.

As the large scale magnets used for such machines and devices, it is known to magnetize the magnet assembly using the magnetizing device as shown in the patent document 2 which is adhered by the adhesive in advance. Also, it is known to produce the magnet assembly using the magnet pieces magnetized in advance using the assembling jigs as shown in the patent document 3. Further, as shown in the patent document 4, it is known to produce the magnet assembly by forming the groove portion to the yoke, and then embedding the permanent magnets therein.

However, in case of the magnet assembly wherein plurality of permanent magnet pieces are adhered by the adhesive, after being magnetized, there is a repulsive force between the adjacent permanent magnet pieces, thus even with various arrangements, it is disadvantageous from the point of the mechanical strength. Particularly, when the magnet assembly is expected to be used under harsh condition, or when the strength requirements are strict, this was difficult to be used.

Also, in the method disclosed in the patent document 3, the repulsive force is generated in the space between the permanent magnet pieces when adhering these, thus the stress condition inside the adhesive is not good, thus it was difficult to secure the mechanical strength.

Further, in case of any of the patent documents 2 to 4, the degree of evenness of the magnetic field as the magnet assembly deteriorates at the connecting part between the adjacent permanent magnet pieces, thus uneven magnetic flux was formed.

PRIOR ART

[Patent document 1] JP Patent Application Laid Open No. H11-136886
[Patent document 2] JP Patent Application Laid Open No. H05-284721
[Patent document 3] JP Patent Application Laid Open No. H10-326710
[Patent document 4] JP Patent Application Laid Open No. 2012-74579

DISCLOSURE OF INVENTION

Problem to be Solved by the Invention

The present invention is attained in view of such situation, and the first object is to provide an arcuate magnet pieces and the motor comprising said magnet pieces capable of improving torque characteristics by sufficiently suppressing the cogging torque and torque ripple when used for the motor. Such object is attained by using the magnet material selected in accordance with the demanded cost and the characteristics or so to attain simple structure and improved accuracy thereby enhancing the cost performance and the productivity; and also attained by making the change of the radial direction component of the magnetic flux density between magnetic poles less steep.

The second object of the present invention is to provide the permanent magnet piece suitable for easy assembling of the large scale magnet while suppressing the repulsive forces between the permanent magnet pieces against each other, in order to assemble or adhere two or more of the permanent magnets; and further to provide the permanent magnet assembly and the permanent magnet application devices comprising the permanent magnet pieces thereof wherein said permanent magnet piece is suppressed with the unevenness of the magnetic flux at the connection portion between the permanent magnet pieces by using said permanent magnet pieces.

The third object of the present invention is to provide the motor or the generator comprising the permanent magnet assembly capable of improving the torque characteristics by sufficiently suppressing the cogging torque and torque ripple when used for the motor and the generator. Such object is obtained by using the permanent magnet piece, or the permanent magnet assembly using said permanent magnet assembly to attain simple structure and accurate assembly to enhance the cost performance and the productivity; and further by making the change of the perpendicular direction component of the magnetic pole surface of the magnetic flux density between the magnetic poles less steep.

In order to attain the first object of the present invention, the arcuate magnet piece of the present invention comprises a connecting side surface connecting with other arcuate magnet pieces which are assembled with adjacent ones, an inner circumference surface which is curved and an outer circumference surface which is curved and opposes against said inner circumference surface; wherein said connecting side surface comprises a tip surface intersecting at a predetermined angle with a tangent line of a curving direction of said outer side surface, when said connecting side surface is arranged to have a space and be approximately parallel with the connecting side surface of said other arcuate magnet pieces, a magnetizing direction near the connecting side surface of said arcuate magnet piece and of other arcuate magnet pieces are substantially parallel, and also magnetic poles of said inner circumference surface and the inner circumference surface of other arcuate magnetic piece which are assembled with adjacent ones are different, or the magnetic poles of said outer circumference surface and said outer circumference surface of other arcuate magnet pieces which are assembled with adjacent ones are different.

In the arcuate magnet piece of the present invention, the connecting side surface comprises the tip surface intersecting at preferable predetermined angle with the tangent line of the curving direction of the outer circumference surface. Therefore, when the space is provided between connecting side surfaces of adjacent other arcuate magnet pieces to make the connecting side surfaces approximately parallel, the attractive torque acting to said arcuate magnet piece (the torque acting in the direction making one of space narrower between said connecting side surface which is already narrow, and also making other one of space wider which is already wide) will act smaller compared to conventional example. As a result, the positioning of the arcuate magnet piece is easier than the conventional arts, and the positioning during the assembling can be made simple, hence the cost performance and productivity can be enhanced.

Further in the present invention, because the connecting side surface comprises the tip surface intersecting at the further preferable predetermine angle with the tangent line of the curving direction of the outer circumference surface, when providing the space between the connecting side surface of other adjacent arcuate magnet pieces to make the connecting side surfaces approximately parallel, the repulsive torque acts to the arcuate magnet piece towards the direction to widen one of space of said connecting side surface of which has become narrow, and also towards the direction to narrow other space which has become wide.

In case the space is provided between the connecting side surface of other adjacent arcuate magnet pieces, then the repulsive torque acts to the arcuate magnet piece towards the direction to widen one of space of said connecting side surface of which has become narrow, and also towards the direction to narrow other space which has become wide. As a result, at the both sides of the curving direction of the arcuate magnet piece, the force is acting to even out the space between the connecting side surfaces. That is, this allows the self-aligning positioning of the arcuate magnet piece, and the positioning during the assembling can be simplified, thus the cost performance and the productivity can be enhanced.

Preferably, a corner part having the acute angle where said connecting side surface and said inner circumference surface or said outer circumference surface intercepts comprises a curved surface or a chamfering surface. By taking such constitution, the trouble such as the chipping of the corner part having the acute angle of the arcuate magnet piece can be prevented, and the production yield can be improved; thus the cost performance and the productivity can be improved.

In the arcuate magnet piece of the present invention, the connecting side surface comprises the tip surface intersecting at the predetermined angle with the tangent line of the curving direction of the outer circumference surface, hence when the space is provided between the connecting side surface of adjacent other arcuate magnet to make the connecting side surfaces approximately parallel, the space thereof is not perpendicular with respect to the tangent line of the curving direction. As a result, when the arcuate magnet piece of the present invention is used for the magnet of the motor, the radial direction component of the magnetic flux near the connecting side surface changes gradually compare to the conventional arts, thus the cogging torque or the torque ripple can be reduced.

Preferably, said predetermined angle is 60 degrees or less, or 120 degrees or more. When the predetermined angle is within such range, compared to the conventional arts, the smaller attractive torque will act on the arcuate magnet piece towards the direction making one space of the connecting side surface which is already narrow even narrower, and also making other space of the connecting side surface which is already wide even wider. Alternatively, the repulsive torque act on the arcuate magnet piece towards the direction making one space of the connecting side surface which is already narrow to be wider, and making other space of the connecting side surface which is already wide to be narrower; therefore it is even more easy to determine the position, and also the cogging torque and the torque ripple are even more reduced.

Further preferably, said predetermined angle is 45 degrees or less, or 135 degrees or more. When the predetermined angle is within such range, the self-aligning positioning comes into effect, and also the cogging torque and the torque ripple are even more reduced.

If said predetermined angle is too small, or too large, the shape of the arcuate magnet piece cannot be shaped.

In the arcuate magnet piece of the present invention, preferably said connecting side surface comprises a first connecting side surface and a second connecting side surface which are positioned in opposite direction along said curving direction. Further, preferably, one of said connecting side surface comprises the first tip surface intersecting at a first predetermined angle with the tangent line of the curving direction of said outer circumference surface; and other one of the said second connecting side surface comprises the second tip surface intersecting at the second predetermined angle with the tangent line of the curving direction of said outer circumference surface.

Here, the first tip surface intersecting with said first connecting side surface at the first predetermined angle with the tangent line of the curving direction of said outer circumference surface of said arcuate magnet piece opposes against the second tip surface (2a) intersecting with said second connecting side surface (2a) at the second predetermined angle (2a) with the tangent line of the curving direction of said outer circumference surface of other arcuate magnet piece adjacent to said arcuate magnet piece. These are formed so that the sum of the first predetermined angle and the second predetermined angle (2a) is approximately 180 degrees.

Also, the second tip surface intersecting with said second connecting side surface at the second predetermined angle with the tangent line of the curving direction of said outer circumference surface of said arcuate magnet piece opposes against the first tip surface (1b) intersecting with said first connecting side surface (1b) at the first predetermined angle (1b) with the tangent line of the curving direction of said outer circumference direction of other arcuate magnet piece adjacent to said arcuate magnet piece. These are formed so that the sum of said second predetermined angle and the first predetermined angle (1b) are approximately 180 degrees. Thereby, the space can be provided between said first connecting side surface and said second connecting side surface (2a), and between said second connecting side surface and said first connecting side surface (1b) which make the connecting side surfaces approximately parallel.

Further preferably, the first predetermined angle and the first predetermined angle (1b) are approximately the same, and the second predetermined angle and the second predetermined angle (2a) are approximately the same; and the sum of the first predetermined angle and the second predetermined angle are made to be approximately 180 degrees.

The material of the arcuate magnet piece of the present invention may be various materials such as isotropic ferrite sintered magnets, anisotropic ferrite sintered magnets, anisotropic rare earth sintered magnets, and a ferrite bond magnet or rare earth bond magnets wherein magnet powders are kneaded with the resin and then molded.

The arcuate magnet piece of the present invention can be obtained by processing the connecting side surface part of the sintered magnet such as isotropic ferrite sintered magnets, anisotropic ferrite sintered magnets, and anisotropic rare earth sintered magnets or so.

The arcuate magnet piece of the present invention can be obtained from the bond magnets forming the connecting side surface part by the compression molding or the injection molding; such as the isotropic ferrite bond magnet, the anisotropic ferrite bond magnet, the isotropic rare earth bond magnet and the anisotropic rare earth bond magnet or so wherein the magnet powders are kneaded with the resin and then molded.

Preferably, said arcuate magnet piece can be obtained by sintering the mold obtained by CIM molding or MIM molding.

In the arcuate magnet piece of the present invention, the mold comprising the connecting side surface having the tip surface of the acute angle can be easily molded by the injection molding according to CIM (ceramic injection molding) method, without increasing the number of the components, and also the processing cost can be significantly reduced, and the production process can be simplified. Furthermore, the production yield and the magnetic characteristic can be improved, thus the cost performance and the productivity can be enhanced. Also, at the connecting side surface, the high anisotropic ferrite sintered magnet wherein the orientation degree of the magnet is 90% or more can be obtained.

Furthermore, in the arcuate magnet piece of the present invention, the mold comprising the connecting side surface having the tip surface of the acute angle can be easily molded by the injection molding according to MIM (metal injection molding) method, without increasing the number of the components, and also the processing cost can be significantly reduced, and the production process can be simplified. Furthermore, the production yield and the magnetic characteristic can be improved, thus the cost performance and the productivity can be enhanced. Also, at the connecting side surface, the high anisotropic rare earth sintered magnet wherein the orientation degree of the magnet is 90% or more can be obtained.

Further, in the arcuate magnet piece of the present invention, by the injection molding such as CIM method or MIM method, the positioning projection part or the positioning depression part may be formed on at least one end surface of the axial core direction of the arcuate magnet piece from the end surface towards the axial core O direction. By taking such constitution, the positioning projection part or depression part can be used for determining the position of the arcuate magnet piece when adhering to the yoke, thus the mounting accuracy can be further improved.

By taking such constitution, plurality of the arcuate magnet piece having the same constitution can be arranged along the circumference direction while providing a predetermined space; thereby the motor magnet can be assembled. Note that, in the present invention, the both side of the tip surface of the arcuate magnet piece may be formed with the first connecting side surface and the second connecting side surface which forms the acute predetermined angle; and the both sides of the tip surface of other arcuate magnet piece adjacent to said arcuate magnet piece may be formed with the first connecting side surface and the second connecting side surface which forms the obtuse predetermined angle. In such case, the arcuate magnet formed with the tip surface of the acute angle at the both sides, and the arcuate magnet formed with the tip surface of the obtuse angle at the both sides are arranged in an alternating manner, thereby the magnet assembly is preferably formed.

The motor according to the present invention comprises the magnet of which a cylindrical body is constituted by assembling even numbers of the arcuate magnet described in the above.

According to the motor comprising the magnet having the arcuate magnet piece of the present invention, the number of $2n$ (n is the positive integer) of the arcuate magnet pieces are arranged on the surface along the circumference direction which rotates relatively with respect to the armature wound with coils; thus the cost can be easily reduced, and higher output can be attained by sufficiently exhibiting the magnetic characteristics comprised by the magnet while reducing the cogging torque and the torque ripple, and it can be designed even more freely.

In order to attain the second object, the permanent magnet piece according to the first aspect of the present invention comprises a first surface, a second surface opposing said first surface, and an inclined surface formed to connect said first surface and said second surface while intersecting at the acute angle with said first surface and at an obtuse angle with said second surface; wherein said permanent magnet piece is magnetized to have approximately perpendicular magnetization to said first surface and/or said second surface. Here, the magnetic pole of the main part at said inclined surface of the permanent magnet piece according to the present invention is the same as the magnetic pole of said second surface, and the magnetic pole of said first magnetic pole exhibits opposite polarity.

In the permanent magnet piece according to the present invention, the inclined surface can be used as the connecting side surface. The magnetic pole of the main part at the inclined surface is same as the magnetic pole of said second surface, thus when preparing two or more of the permanent magnet pieces of the present invention and then connecting these, the following described effects can be expected.

That is, first, in order to form a single magnetic pole surface having relatively large area, for example having the longitudinal length of 100 mm, the two arbitrary permanent magnets can be arranged by connecting the corner part having the obtuse angle of the permanent magnet piece and the corner part having the acute angle of other permanent magnet piece. In this case, when the first surface of one of the permanent magnet piece and the second surface of other permanent magnet piece are magnetized to have same magnetic pole, the main parts of both of the inclined surface shows opposite polarity, thus the attractive force is generated between each other.

For example, when the first surface of one of the permanent magnet piece is N pole, then the main part of the inclined surface of the permanent magnet piece is S pole; and when the second surface of other permanent magnet piece is N pole, then the main part of the inclined surface of other permanent magnet piece is N pole. Therefore, the main part of the inclined surfaces of the both shows the opposite polarity. Thus, it is easy to assemble the magnet assembly having single magnetic pole surface having the relatively large area by assembling plurality of the permanent magnets. That is, the cost performance and the productivity can be improved, when assembling the magnet assembly having single magnetic pole surface having the relatively large area. Further, by connecting multiple permanent magnet pieces, the longitudinal length of 1 m or longer can be easily attained.

Note that, according to the conventional art, the magnet assembly wherein plurality of permanent magnets is adhered in advance can be magnetized afterwards; and in this case, a large scale magnetizer will be needed. On the contrary to this, the permanent magnet piece according to the first aspect of the present invention can form the magnet assembly by combining the permanent magnet pieces which are already magnetized, thus the large permanent magnet assembly can be made without using the large scale magnetizer.

Also, the inclined surface of the connected permanent magnet piece has larger area than the conventional ones, thus in case of adhering using the adhesive, the adhesive strength as the permanent magnet assembly can be improved.

Said first surface and second surface may be parallel. Also, at least one of said first surface and second surface may be a curved surface.

Preferably, the sum of said predetermined angle of the obtuse angle and said predetermined angle of the acute angle is approximately 180 degrees. When such relation is satisfied, the first surface and the second surface can be considered to be substantially continuous.

Said first surface and the said second surface may be a cylindrical surface.

At least one of the first surface and the second surface of said one permanent magnet piece and said other permanent magnet piece may be adhered to the substrate.

Preferably, the second surface of said other permanent magnet piece is adhered to said substrate. The angle between the inclined surface and the first surface of said other permanent magnet piece forms the acute angle, and the second surface and the inclined angle forms the obtuse angle. Therefore, when the attractive force acts between the inclined surfaces of two adjacent permanent magnet pieces, one permanent magnet piece is applied with the force which acts to place it between the substrate and the inclined surface of other permanent magnet, thus it is prevented from being released towards the direction away from the substrate.

Preferably, said substrate is made of a magnetic material. By constituting the substrate by the magnetic material, the substrate functions as the yoke and the magnetic force when assembled can be increased. Also, by constituting the substrate by the magnetic material, the magnet piece is adhered to the substrate by magnetic force.

When said predetermined angle forms an acute angle, it is preferably 60 degrees or less. When the predetermined angle is an obtuse angle, it is preferably 120 degrees or more. When such relation is satisfied, the repulsive force against other permanent magnet piece which is assembled with adjacent ones is significantly reduced compared to the conventional arts. As a result, the cost performance and the productivity can be enhanced even more.

Further preferably, said predetermined angle is 30 to 50 degrees, or 130 to 150 degrees. When the predetermined angle is within such ranges, the repulsive force between other permanent magnet pieces which is assembled with adjacent ones is significantly reduced compared to the conventional arts, or the attractive force is suppressed from increasing. As a result, the cost performance and the productivity can be further enhanced. Also, along with this, when the permanent magnet is adhered to the substrate, the shear strength applied to the adhesive can be suppressed; hence this functions to maintain the mechanical strength.

Preferably, the a coercivity $H_{CJ}$[A/m] of said permanent magnet with respect to the remaining magnetic flux density $B_r$[T] satisfies $H_{CJ} \geq 1.3 \times B_r/\mu_0$ (note that, $\mu_0$ is a magnetic permeability in vacuo, the coercivity $H_{CJ}$ and a residual magnetic flux density $B_r$ are the values at 20° C.). When such relation is satisfied, after the permanent magnet is magnetized, the permeance coefficient becomes small by forming a tip part having the acute angle, thus even if the flow of the magnetic flux is opposite of the magnetizing direction, the magnetization is not reversed thus there is no risk of demagnetization.

The permanent magnet assembly according to the second aspect of the present invention assembles the aforementioned permanent magnet pieces. Preferably, the space between the inclined surfaces of the adjacent two permanent magnets is 0.2 mm or less.

The permanent magnet assembly constituted by assembling two or more permanent magnets placed adjacent to each other, and also adhering at least the second surface to the magnetic material, allows to enlarge the size easily, the cost reduced, and higher output can be attained by sufficiently exhibiting the magnetic characteristics of the magnet and it can be designed even more freely. Furthermore, even if the adhesive strength between the assembled permanent magnets is deteriorated, since the repulsive force is suppressed, there is only little risk that the connecting part becoming wider, hence the amounts of the magnetic flux hardly declines. Also, a large magnet can be produced easily in short period of time, while having high size accuracy, and also since the space between the magnets can be made small, the unevenness of the magnetic field caused in this space can be made as small as possible.

In order to attain the third object of the present invention, the permanent magnet according to the third aspect of the present invention comprises a first surface, a second surface opposing said first surface, and a connecting side surface of other permanent magnet which is assembled with adjacent ones, and formed to connect said first surface and said second surface while intersecting at the acute angle with said first surface and at obtuse angle with said second surface, wherein when said connecting side surface is arranged with a space and making the connecting side surface of said other permanent magnet approximately parallel, a magnetizing direction near the connecting side surfaces of said arcuate magnet piece and of other arcuate magnet piece are substantially parallel, and the magnetizing direction is approximately perpendicular with said first surface and/or the second surface, furthermore said first surface and said second surface of other permanent magnet piece assembled with other ones, or said second surface and said first surface of other permanent magnet piece assembled with other ones are magnetized to have different magnetic poles.

In the permanent magnet piece according to the third aspect of the present invention, when the first surface of one magnet piece and the second surface of other magnet piece are magnetized to have different magnetic pole, the connecting side surface of one magnet and the connecting side surface of other magnet piece are formed with the part which shows the same magnetic pole, and the repulsive force is generated therebetween. Therefore, it is easy to assemble the plurality of magnet pieces and to have predetermined space while having the magnetic pole surface which changes in the alternating manner in the connecting direction.

When said predetermined angle is the acute angle, the angle is preferably 60 degrees or less. When the predetermined angle is the obtuse angle, the angle is preferably 120 degrees or more. When such relation is satisfied, the attractive force between other permanent magnet piece which is assembled with adjacent ones is reduced significantly compared to the conventional arts. As a result, the cost performance and the productivity can be further enhanced.

Further preferably, said predetermined angle is 30 to 50 degrees, or 130 to 150 degrees. When the predetermined angle is within such range, the attractive force between other permanent magnet piece which is assembled with the adjacent ones is significantly reduced compared to the conventional art, or the repulsive force is suppressed from increasing. As a result, the cost performance and the productivity can be further enhanced. Also, along with this, when the permanent magnet is adhered to the substrate, the shear strength applied to the adhesive can be suppressed; hence this functions to maintain the mechanical strength.

At the corner part having the acute angle where said connecting side surface and said first surface or said second surface intercepts may comprise the curved surface or the chamfered surface. When comprising the curved surface or the chamfered surface, in case the second surface is adhered to the magnetic material by adhesive, the adhesive oozes and rises towards the corner part of the curved surface or chamfered surface, thereby the movement of the permanent magnet piece to the corner direction is limited, and functions to suppress the position shifting. Further, in case the corner part has the acute angle, this will prevent the chipping during the assembling, hence the production yield can be improved, and therefore the cost performance and the productivity can be enhanced.

The permanent magnet piece according to the third aspect of the present invention can be used for the permanent magnet assembly of the second aspect of the present invention.

The permanent magnet piece and the permanent magnet assembly according the above mentioned aspects of the present invention can be used for the wide range of the technical field such as Mill magnetic field generator, a magnetic field generator for the plasma device, a magnetic circuit of the rotary machine, a linear motor, a linear transportation system or so. Also, the permanent magnet piece and the permanent magnet assembly according to the aforementioned aspects of the present invention are not only used alone respectively, but also by combining these.

For example, in case of placing the large magnet on the magnetic material which is formed as one body, that is on the large yoke made of carbon steel for machine structure use (for example S45C), or on the yoke formed as one body by stacking and adhering the multilayer steel board; or in case of the magnetic pole of the linear motor, considering the difference between the thermal expansion coefficient of the yoke material and the permanent magnet assembly, there is a possibility that excessive stress might be applied to the adhesive between the yoke material and the permanent magnet assembly. In order to release such stress, a space may be provided between the permanent magnet pieces. In such case, by using the present invention, the different poles will not attract each other, and the same pole does not repulse each other, thereby the magnet groups which respectively have a large area can be easily assembled to the magnet group.

BRIEF DESCRIPTION OF DRAWINGS

FIG. 3(A) to FIG. 3(D) are the schematic view showing the variations of the magnetizing direction of the arcuate magnet piece of the present invention.

EMBODIMENTS OF CARRYING OUT THE INVENTION

Hereinafter, the present invention will be described based on the embodiments shown in the figures. Note that, for the same element, the same number is given, and the overlapping description is omitted. Also, the relation of the position such as above, below, left and right are only relative positions and it is not limited thereto; thus above, below, left and right may be reversed. However, in the below description, it will be explained based on above, below, left and right of the figures. Further, the size ratio of the figures is not to be limited to the ratio shown in the figures. Also, the embodiment discussed in below is merely an example to explain the present invention, and the present invention is not to be limited thereto.

The First Embodiment

Figure 1A:
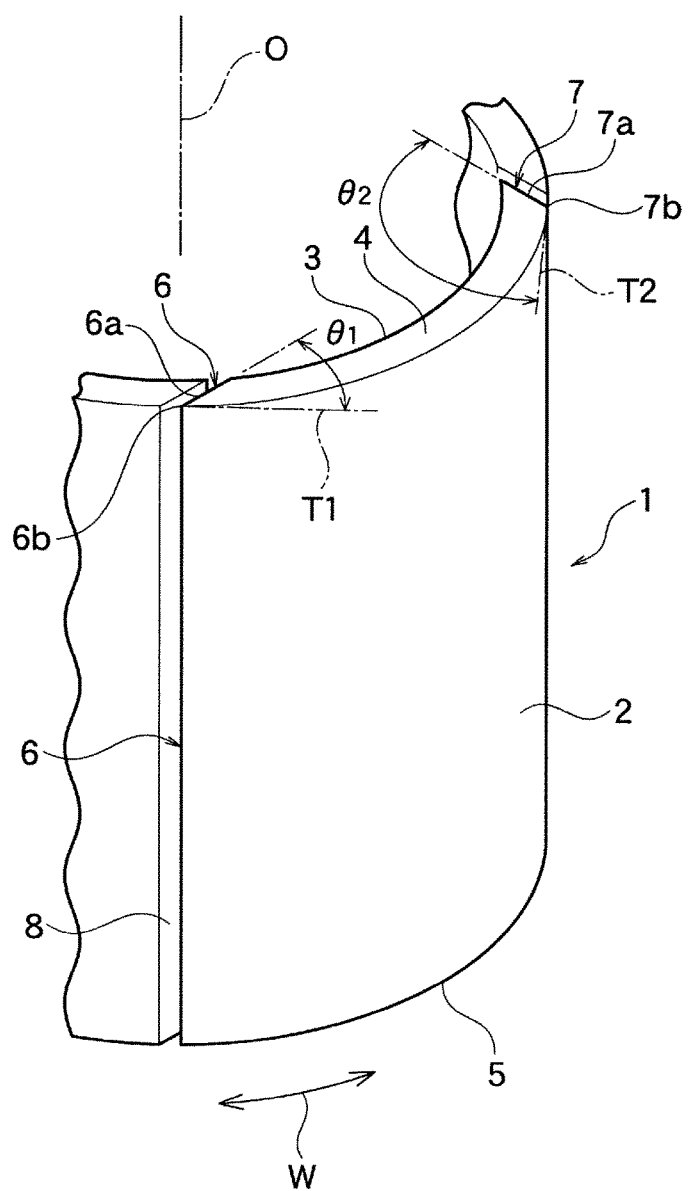
FIG. 1A is the perspective view of the arcuate magnet piece according to one embodiment of the present invention.

FIG. 1A is the schematic perspective view of the arcuate magnet piece according to one embodiment of the present invention. The arcuate magnet piece 1 comprises the outer circumference surface 2 curved in the circumference direction W with respect to the axis O of the rotating axis of the motor which is not shown in the figure, and the inner circumference surface 3 opposing to said outer circumference 2 and curved while having the same axis O; and as a whole, it forms the arcuate form.

This arcuate magnet 1 comprises the top end surface 4 and the bottom end surface 5 which are perpendicular faces to the axis O, and these end surfaces 4 and 5 are approximately perpendicular with respect to the outer circumference surface 2 and the inner circumference surface 3. Also, the arcuate magnet piece 1 comprises the first connecting side surface 6 and the second connecting side surface 7 which are parallel with respect to the axis O. The second connecting side surface 7 opposes the first connecting side surface 6 while being spaced apart in the circumference direction W.

The first connecting side surface 6 comprises the tip surface 6a intersecting at the first predetermined angle θ1 with the tangent line T1 of the curving direction of the outer circumference surface 2. The tip corner part 6b where the tip surface 6a and the outer circumference surface 2 intersects forms the corner part of the acute angle of the first predetermined angle θ1, and the corner part 6b may comprises, if needed, the chamfered surface or the curved surface.

Figure 1B:
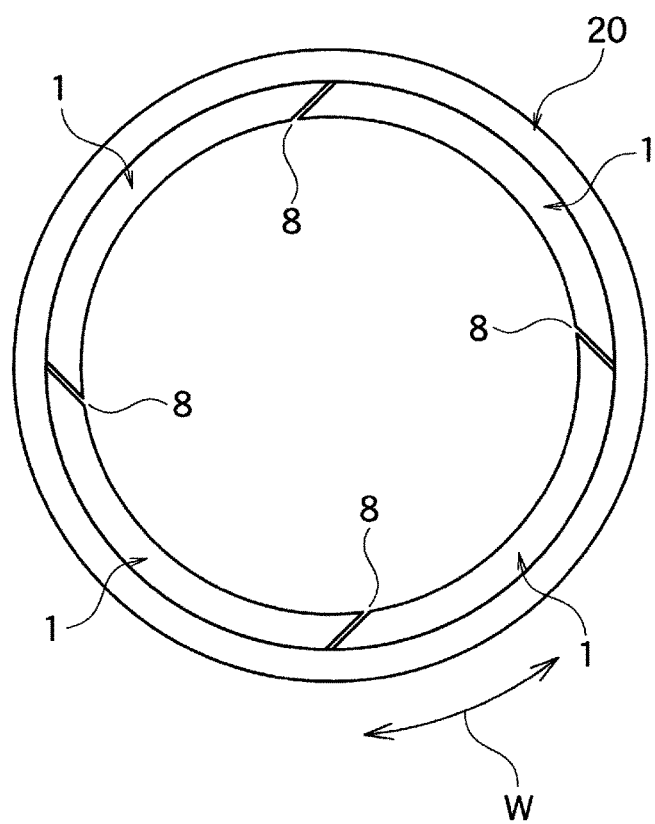
FIG. 1B is the schematic top view showing the state wherein plurality of arcuate magnet pieces shown in FIG. 1A on the yoke while equally spacing out along the circumference direction.
Figure 1C:
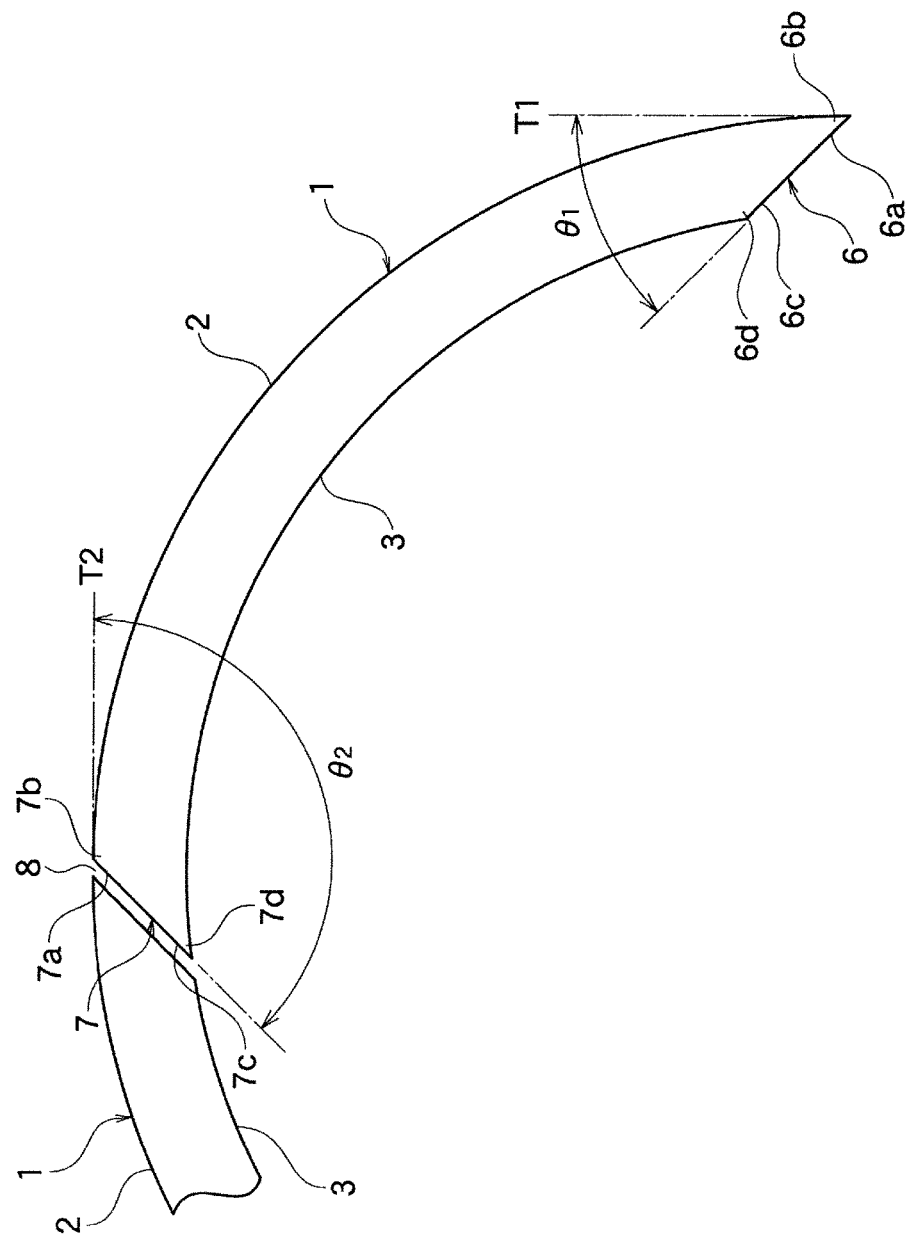
FIG. 1C is the partial top view showing the details of the connecting side surface shown in FIG. 1A and FIG. 1B.

Also, the first connecting side surface 6 comprises, as shown in FIG. 1C, the base end surface 6c which intersects at the obtuse angle with the tangent line of the curving direction of the inner circumference surface 3. The base end corner part 6d where the base end surface 6c and the inner circumference surface 3 intersects is similarly an obtuse angle, and the corner part 6d may comprise, if needed, the chamfered surface or the curved surface.

In the present embodiment, the base end surface 6c and the tip surface 6a are formed as one surface; hence the sum of the obtuse angle of the base end corner part 6d and the acute angle of the tip corner part 6b is approximately 180 degrees; however the present invention is not limited thereto. For example, between the base end surface 6c and the tip surface 6a, the corner part having the projected shape or the depressed shape may be formed. Alternatively, between the base end surface 6c and the tip surface 6a, the curved surface having the projected shape or the depressed shape may be formed.

Note that, when the corner part of the projected shape or the depressed shape or the curved surface of the projected shape or the depressed shape are formed between the base end surface 6c and the tip surface 6a, the connecting side surface 7, which is the counter part of the connecting side surface 6 formed with these, is also preferably formed with the corner part of the projected shape or the depressed shape or the curved surface of the projected shape or the depressed shape to form the space 8 having the equal width. When forming the base end surface 6c and the tip surface 6a as one surface, with respect to the connecting side surface 7 which is the counter part of the connecting side surface 6 formed with these, the surface corresponding is formed, and the space 8 which makes the connecting side surfaces approximately parallel is preferably provided.

The second connecting side surface 7 comprises the tip surface 7a intersecting at the obtuse angle of the predetermined angle θ2 with respect to the tangent line T2 of the curving direction of the outer circumference surface 2. The tip corner part 7b where the tip surface 7a and the outer circumference surface 2 intersects forms the corner part having the obtuse angle of the predetermined angle θ2, and the corner part 7b may comprise, if needed, the chamfered surface or the curved surface.

Also, the second connecting side surface 7 comprises the base end surface 7c which intersects at the acute angle with respect to the tangent line of the curving direction of the inner circumference surface 3, as shown in FIG. 1C. The base end corner part 7d where the base end surface 7c and the inner circumference surface 3 intersects forms the acute angle similarly, and the corner part 7d may comprises, if needed, the chamfered surface or the curved surface.

In the present embodiment, the base end surface 7c and the tip surface 7a are formed as one surface; hence the sum of the acute angle of the base end corner part 7d and the obtuse angle of the tip corner part 7b is approximately 180 degrees; however the present invention is not limited thereto. For example, between the base end surface 7c and the tip surface 7a, the corner part having the projected shape or the depressed shape may be formed. Alternatively, between the base end surface 7c and the tip surface 7a, the curved surface having the projected shape or the depressed shape may be formed.

Note that, when the corner part of the projected shape or the depressed shape, or the curved surface of the projected shape or the depressed shape are formed between the base end surface 7c and the tip surface 7a, the connecting side surface 7, which is the counter part of the connecting side surface 6 formed with these, is also preferably formed with the corner part of the projected shape or the depressed shape or the curved surface of the projected shape or the depressed shape; to form the space 8 having the equal width. When forming the base end surface 7c and the tip surface 7a as one surface, with respect to the connecting side surface 7 which is the counterpart of the connecting side surface 6 formed with these, the surface corresponding is formed, and the space 8 which makes the connecting side surface approximately parallel is preferably provided.

Figure 1D:
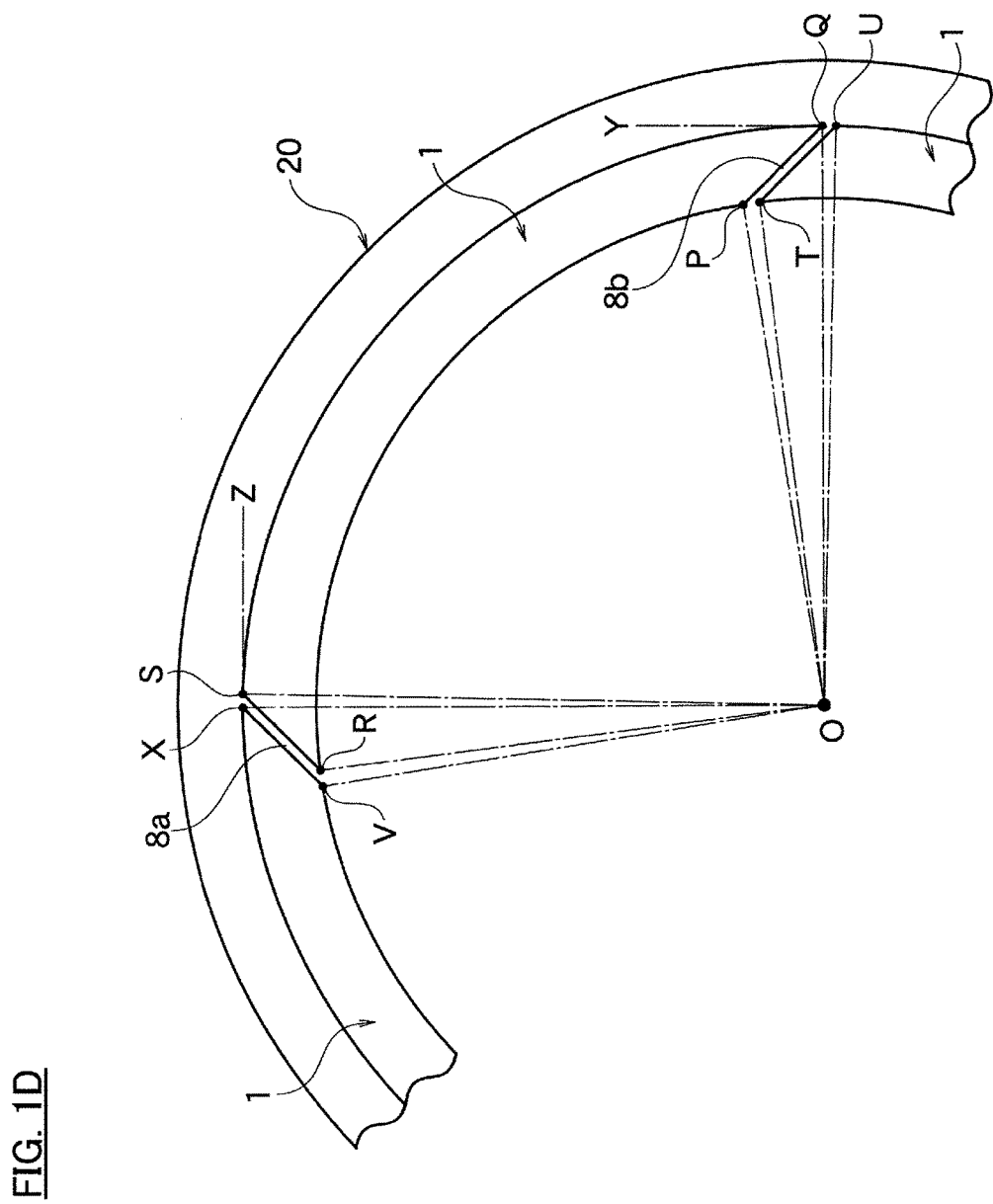
FIG. 1D is the partial top view showing the details of the plurality of the arcuate magnet pieces shown in FIG. 1A.

In the present embodiment, as shown in FIG. 1D, the sum of the first predetermined angle θ1 that is the angle PQY and the second predetermined angle θ2 that is the angle RSZ, in other words θ1+θ2 is preferably approximately 180 degrees. Also, as shown in FIG. 1C, when each of the arcuate magnet piece 1 is assembled in the circumference direction, the first connecting side surface 6 and the second connecting side surface 7 are arranged approximately parallel, and approximately equal width of the space 8 is formed between and along the side surfaces 6 and 7.

Preferably, said first predetermined angle θ1 is 60 degrees or less, or said second predetermined angle θ2 is preferably 120 degrees or more. When these are within such range, the attractive torque acting on the arcuate magnet 1 towards the direction making the space which is already small even smaller, and other space which is already wide even wider will be smaller than the conventional examples. Alternatively, the repulsive torque acting on the arcuate magnet 1 piece towards the direction making one of the space of the connecting side surface which is already small to be wider, and making other space of the connecting side surface which is already wide to be smaller; therefore it is even more easy to determine the position, and also the cogging torque and the torque ripple are even more reduced.

Further preferably, said first predetermined angle θ1 is 45 degrees or less, or said second predetermined angle θ2 is preferably 135 degrees or more. When these are within such range, the repulsive torque acting on the arcuate magnet 1 piece towards the direction making one of the space of the connecting side surface which is already small to be wider, and making other space of the connecting side surface which is already wide to be smaller; therefore it is even more easy to determine the position, and also the cogging torque and the torque ripple are even more reduced.

In the present embodiment, the first connecting side surface 6 and the second connecting side surface 7 are parallel with respect to the axis O; however in the present invention it does not necessarily have to be parallel, these may be inclined and twisted with respect to the axis O. Note that, in case of inclining it, the first connecting side surface 6 and the second connecting side surface 7 which are opposing against each other in the circumference direction are preferably inclined at approximately the same angle. By constituting as such, the cogging torque is expected to be further reduced.

The arcuate magnet piece 1 according to the present invention forms the permanent magnet for the motor by assembling with other arcuate magnet piece 1 at the inner circumference surface of for example the yoke 20 along the circumference direction W, as shown in FIG. 1B. That is, the even number of the arcuate magnet pieces 1 are assembled along the circumference direction so that the connecting side surface 6 of the arcuate magnet piece 1 and the second connecting side surface 7 of other arcuate magnet piece 1 are opposing against each other across the predetermined space 8; thereby the permanent magnet for the motor is constituted.

In the example shown in FIG. 1B, the arcuate magnet piece 1 is arranged so that the N pole and S pole are arranged in the alternating manner along the circumference direction. Here, four arcuate magnet pieces 1 are positioned so that the space 8 is arranged to have equal width.

The arcuate magnet piece 1 constituted as such can be obtained by polishing the connecting side surfaces 6 and 7 made of the sintered magnets such as isotropic ferrite sintered magnet, anisotropic ferrite sintered magnet and anisotropic rare earth sintered magnet or so, then forming the tip surfaces 6a and 7a, the tip corner parts 6b and 7b, the base end surface 6c and 7c, and the tip end corner parts 6d and 7d. Further, the arcuate magnet piece 1 of the present embodiment can be obtained from the bond magnets comprising the connecting side surface parts 6 and 7, the tip surfaces 6a and 7a, the tip corner parts 6b and 7b, the base end surface 6c and 7c, and the tip end corner parts 6d and 7d by the compression molding or the injection molding. The bond magnet can be obtained by kneading and molding the magnet powders; and as such bond magnets for example, the isotropic ferrite bond magnet, the anisotropic ferrite bond magnet, the isotropic rare earth bond magnet and the anisotropic rare earth bond magnet or so may be mentioned.

In the present embodiment, the connecting side surfaces 6 and 7 comprises the tip surfaces 6a and 7a which intersects at the predetermined angles of θ1 and θ2 with the tangent line of T1 and T2 of the curving direction of the outer circumference surface 2, hence when providing the space 8 between the connecting side surfaces 7 and 6 of other adjacent arcuate magnet piece so that the connecting side surfaces 6 and 7 are approximately parallel, the repulsive force of the magnetic force towards the direction to make the space 8 wider will act.

Figure 1E:
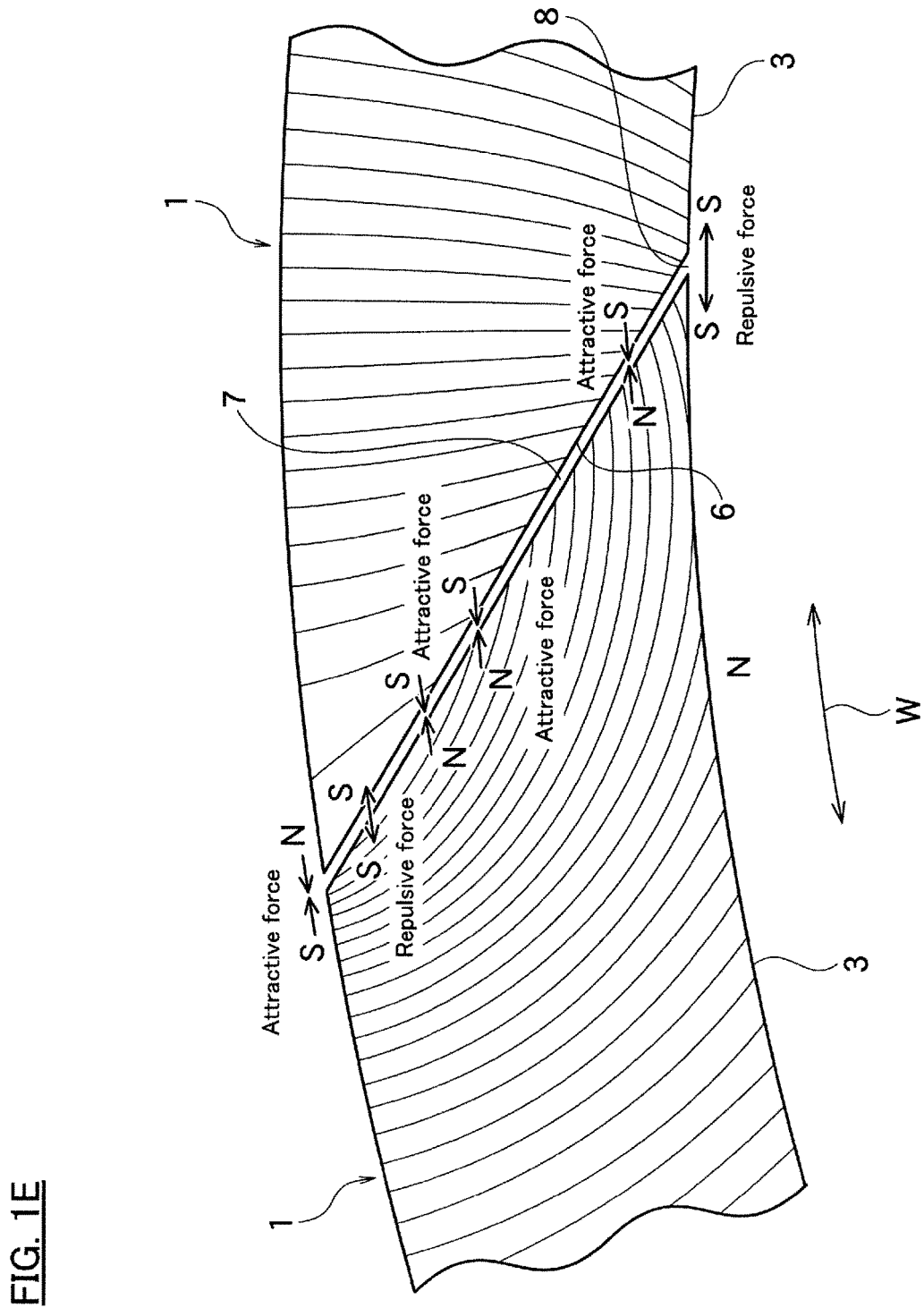
FIG. 1E is the schematic top view showing when the magnetic pole formed the attractive force and the repulsive force of the arcuate magnet piece according to one embodiment of the present invention.
Figure 1F:
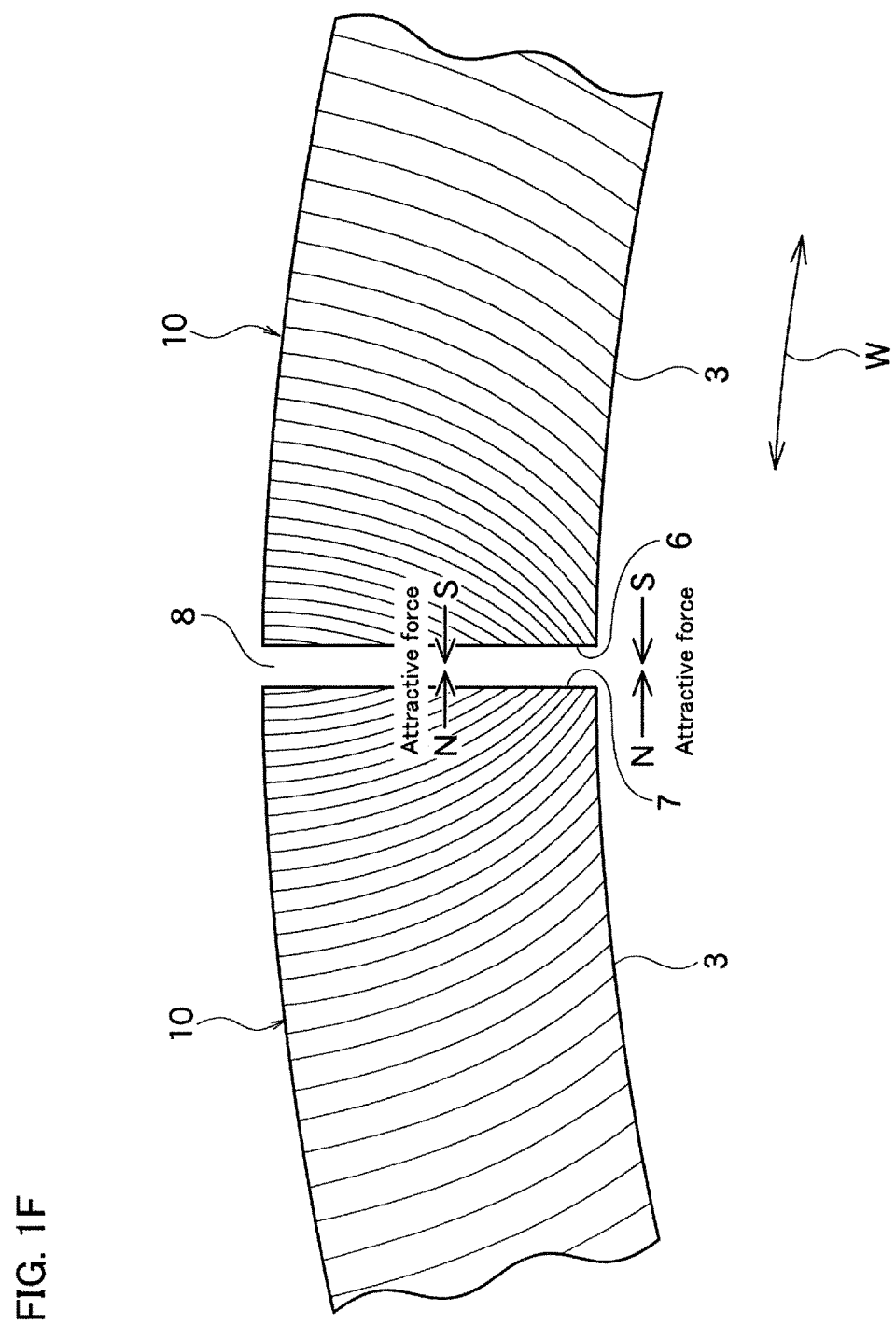
FIG. 1F is the schematic top view showing when the magnetic pole formed the attractive force and the repulsive force of the arcuate magnet piece of the conventional examples.

First, for example in FIG. 1F, in order to constitute the permanent magnet for the conventional motor, the conventional arcuate magnet piece 10 is magnetized so that the inner circumference surface 3 has N pole, and the adjacent other conventional arcuate magnet piece 10 is magnetized so that the inner circumference surface 3 has S pole. Further, for the conventional motor using the conventional arcuate magnet piece 10 wherein each predetermined angle θ1 and θ2 are approximately 90 degrees, the state of the magnetic pole the connecting side surfaces 6 and 7 can be verified from the distribution of the magnetic flux lines, and it shows opposite polarity against each other via the space 8; thus the magnetic force of attracting each other is generated. At the inner circumference surface 3 of the arcuate magnet piece 10, and between the connecting side surfaces 6 and 7, the attractive force towards the direction to make the space 8 smaller is only acting.

On the contrary to this, in the embodiment of the present invention, although it is not shown in the figure, as similar to the conventional arcuate magnet piece 10, one of the arcuate magnet piece 1 is magnetized so that the inner circumference surface 3 has N pole, and other arcuate magnet piece 1 is magnetized so that the inner circumference surface 3 has S pole. However, as shown in FIG. 1E, the magnetic pole generated can be verified from the distribution of the magnetic flux lines; and the present inventors have found that a part of the inner circumference surface 3, and a part of the connecting side surfaces 6 and ∂show the same polarity, and the repulsive force is acting therebetween. Here, the arcuate magnet piece 1 is arranged in the radial direction, and in case of the magnetized anisotropic magnet, the magnetizing direction near the connecting side surfaces 6 and 7 is opposite against each other, and substantially parallel to each other. Also, in case the arcuate magnet piece 1 is the isotropic magnet, by magnetizing in the radial direction, the magnetizing direction near the connecting side surfaces 6 and 7 are substantially parallel.

When the space 8 is provided between the connecting side surfaces 6 an 7 of other adjacent permanent magnet piece 1 and making the connecting side surfaces approximately parallel, the repulsive force of the magnetic force acts partially to the direction to make said space 8 wider, thereby at the connecting side surfaces 6 and 7 formed at the both sides of the curving direction (the circumference direction W) of the arcuate magnet piece 1, the repulsive force acts partially to the connecting side surfaces 6 and 7 of other arcuate magnet piece 1. As a result, at the both side of the arcuate magnet piece 1 along the circumference direction W, due to the repulsive force which decrease the attractive force, the attractive force acting to the direction making the space 8 between the approximately parallel connecting side surfaces 6 and 7 small is weakened.

That is, the attractive force acting to the arcuate magnet piece 1 is reduced, and the load during the assembling can be decreased. Further, when the first predetermined angle θ1 is smaller than the certain range, and the second predetermined angle θ2 is larger than certain range, along with the repulsive force being larger than the attractive force, the self-aligning positioning can be done, and the positioning during the assembling can be simplified, thus the cost performance and the productivity can be enhanced.

Specifically, the below can be described.

Here, four arcuate magnet pieces 1 are constituted by the magnetized anisotropic ferrite sintered magnet which is molded by the usual molding method for the sintered magnet and then arranged in radial direction.

Also, in the present embodiment, the arcuate magnet piece 1 is formed so that the inner circumference surface has the radius of curvature of 15.5 mm, the outer circumference surface has the radius of curvature of 17.5 mm, and the length is 30 mmm; and it is adhered to the inner circumference surface of the yoke 20 having the thickness of 2 mm which is made of the magnetic material such as the cold rolled steel sheet (SPCC). The connecting side surfaces 6 and 7 of the arcuate magnet piece 1 of the present embodiment can be formed by polishing so as to form the predetermined angle of θ1 and θ2 with respect to the tangent line of the outer circumference surface 2.

Figure 2A:
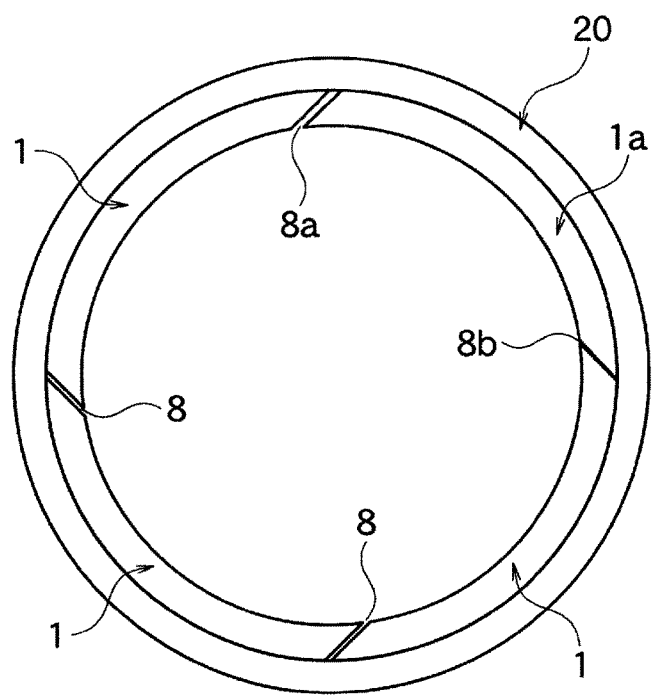
FIG. 2A is the schematic top view showing the state wherein one of the pluralities of arcuate magnet pieces shown in FIG. 1A is mounted on the yoke while the position is shifted in the clock wise direction along the circumference direction.
Figure 2B:
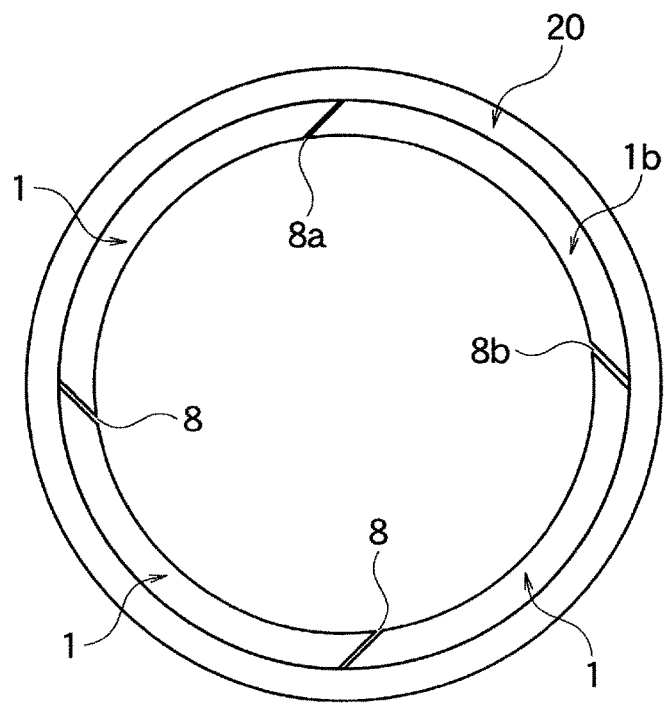
FIG. 2B is the schematic top view showing the state wherein one of the plurality of arcuate magnet pieces shown in FIG. 1A is mounted on the yoke while the position is shifted in the counter clock wise direction along the circumference direction.
Figure 2C:
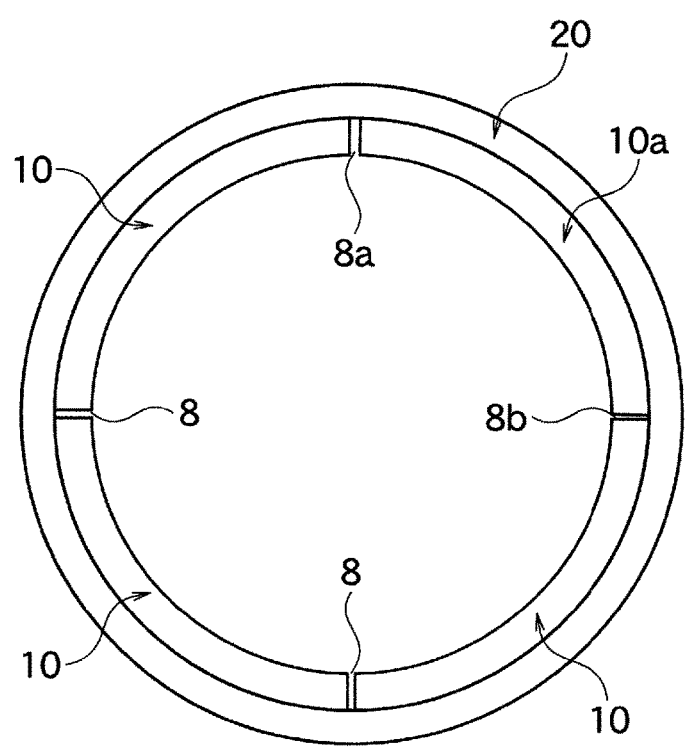
FIG. 2C is the schematic top view showing the state wherein one of the plurality of arcuate magnet pieces according to the conventional examples is mounted on the yoke while the position is shifted in the clock wise direction along the circumference direction.

First, for comparison, the case shown in FIG. 2C is considered wherein the four conventional arcuate magnet pieces 10 are arranged at the inner circumference surface of the yoke 20 so that N pole and S pole are arranged alternatingly along the circumference direction. In case the space 8 of the four arcuate magnet pieces 10 are positioned to have equal size, then the torques of attracting and/or repulsing the arcuate magnet pieces against each other will not act to any of the arcuate magnet pieces. However, in general, it is difficult to produce the four arcuate magnet pieces 10 having the completely same circumference length, thus even if the position is determined, it is difficult to arrange the space 8 to have the same size.

Here, as shown in FIG. 2C, the case wherein one of the arcuate magnet piece 10a among the four arcuate magnet pieces 10, 10a is arranged by shifting by 0.5 degrees will be considered. At this point, the two spaces 8 are as designed, however the space 8a is larger than it is designed, and other space 8b is smaller than it is designed.

Here, the first predetermined angle θ1=90 degrees and the second predetermined angle θ2=90 degrees, that is the angle PQY=90 degrees and the angle RSZ=90 degrees in terms of FIG. 1D, of said arcuate magnet piece 10a which corresponds to the arcuate magnet piece 1 shown in FIG. 1C. Also, if the constitution of the space 8 is described using FIG. 1D, then the angle ROV=the angle SOX=1.5 degrees which constitutes the space 8, and the angle POT=the angle QOU=0.5 degrees which constitutes the space 8b; and for the space 8 which is not shown in the figures is 1.0 degrees. Thus, the side RS and the side VX constituting the space 8a and the side PQ and the side TU constituting the space 8b are approximately parallel, and the space 8 which is not shown in the figure also makes the sides approximately parallel. Also, the opening angle of the magnet is the angle POR=the angle QOS=89 degrees.

When the torque acting on the arcuate magnet piece 10a arranged as shown in FIG. 2C was determined from the finite element method, it was −10.2 mNm. Here, the minus means that the torque acting on clockwise direction is generated. That is, the arcuate magnet piece 10a shifted to the clockwise direction will be applied with the clockwise direction torque, hence the attractive torque is acting on the arcuate magnet piece 10a towards the direction making the shifting even larger, in other words to the direction making one of the space 8a of the connecting side surface which is already large to be even larger, and to the direction making the other space 8b which is already small even smaller.

Similarly, although it is not shown in the figure, for the conventional arcuate magnet piece 10, the torque acting in case the arcuate magnet piece 10a is shifted by 0.5 degrees in the counter clockwise direction which is the opposite as shown in FIG. C was +10.2 mNm. Here, the two spaces 8 are the same as the two spaces 8 of FIG. 2C, however the space 8a is smaller than the space 8 of FIG. 2C, and other space 8b is larger. Here, the plus means that the torque acting in the counter clockwise direction is generated. That is, the arcuate magnet piece 10a is shifted in the counter clockwise direction, and thus the torque of the counter clockwise direction is applied, hence the attractive torque is acting on the arcuate magnet piece 10a towards the direction making the shifting even larger, in other words, to the direction making the space 8a of the connecting side surface which is already small even smaller, and to the direction making other space 8b which is already large even larger.

Here, if the constitution of the space 8 is described using FIG. 1D, then the angle ROV=the angle SOX=0.5 degrees which constitutes the space 8a, the angle POT=the angle QOV=1.5 degrees which constitutes the space 8b, and the two spaces 8 which are not shown in the figure are 1.0 degrees. Similarly, the side RS and the side VX which constitutes the space 8a, and the side PQ and the side TU which constitutes the space 8b are approximately parallel, and the rest of the spaces 8 also makes the sides approximately parallel although it is not shown in the figure.

On the other hand, as shown in FIG. 1B, in the preset embodiment, the four arcuate magnet pieces 1 arranges the space 8 to have equal width. In this case, four arcuate magnet pieces 4 has the equal size of the space 8, thus the torques of attracting and/or repulsing the arcuate magnet pieces against each other will not act to any of connecting side surfaces 6 and 7 of the arcuate magnet piece because equal attractive force and/or the repulsive force are acting to all of the arcuate magnet pieces 1.

Here, if the constitution of the space 8 is described using FIG. 1D, then the angle ROV=the angle SOX=the angle POT=the angle QOU=1.0 degrees; and the rest of two spaces 8 which are not shown in the figure are 1.0 degrees. Therefore, the side RS and the side VX, and the side PQ and the side TU which constitutes the space 8 are approximately parallel to each other, and the rest of the spaces 8 which are not shown in the figure also makes the sides approximately parallel. Also, the opening angle of the magnet is the angle POR=the angle QOS=89 degrees.

From the above reason, the size of the spaces 8, 8, 8a and 8b are different. Here, the case is considered wherein one of the arcuate magnet piece 1a among four arcuate magnet pieces 1 are shifted by 0.5 degrees in the clockwise direction. Here, the two spaces 8 are the same as the two spaces 8 of FIG. 1B; however the space 8a is larger than the space 8 of FIG. 1B, and other space 8b is smaller.

Here, if the constitution of the space 8 is described using FIG. 1D, then the angle ROV=the angle SOX=1.5 degrees which constitutes the space 8a, the angle POT=the angle QUO=0.5 degrees which constitutes the angle 8b, and the two spaces 8 which are not shown in the figure are 1.0 degrees. Therefore, the side RS and the side VX constituting the space 8a, and the side PQ and the side TU constituting the space 8b are approximately parallel, and the rest of the spaces 8 which are not shown in the figure also makes the sides approximately parallel. Also, the opening angle of the magnet is the angle POR=the angle QOS=89 degrees.

On the other hand, the four arcuate magnet pieces 1 of the present invention comprises the first predetermine angle θ1 of 60 degrees, and the second predetermined angle θ2 of 120 degrees; that is in case the angle PQY=60 degrees, and the angle RSZ=120 degrees of FIG. 1D, and when the torque acting to the arcuate magnet piece 1a arranged as shown in FIG. 2A was obtained from the finite element method, it was −3.3 mNm. Here, the two spaces 8 are the same as the two spaces 8 of FIG. 1B, however the space 8a is larger than FIG. 1B, and other space 8b is smaller. Here, the minus means that the torque acting on clockwise direction is generated. That is, the attractive torque towards the same direction as the conventional examples is acting, however the value of this attractive torque is 33% of said conventional examples, that is the attractive torque is decreased, and thus the load during the assembling can be made smaller.

Similarly, as shown in FIG. 2B, the torque acting in case of arranging the arcuate magnet piece 1b by shifting by 0.5 degrees in counter clockwise direction was +3.3 mNm. Here, the two spaces 8 are the same as the two spaces 8 of FIG. 1B, however the space 8a is smaller than FIG. 1B and other space 8b is larger. Here, the plus means that the torque is acting in the counter clockwise direction is generated. That is, the attractive torque as same as the conventional direction is acting, however the value of this attractive torque is 33% of said conventional examples, that is the attractive torque is decreased, thus the load during the assembling can be made smaller.

Here, if the constitution of the space 8 is described using FIG. 1D, then the angle ROV=the angle SOX=0.5 which constitutes the space 8a, and the angle POT=the angle QOU=1.5 degrees which constitutes the space 8b, and for the rest of two space 8 which is not shown it is 1.0 degrees. Therefore, the side RS and the side VX constituting the space 8a, and the side PQ and the side TU constituting the space 8b are approximately parallel, and the rest of the spaces 8 which are not shown in the figure also makes the sides approximately parallel.

Similarly, in case the first predetermine angle θ1 is 45 degrees, and the second predetermined angle θ2 is 135 degrees of the arcuate magnet piece as shown in FIG. 1C; that is in case the angle PQY=45 degrees, and the angle RSZ=135 degrees, and when the torque acting to the arcuate magnet piece 1a arranged as shown in FIG. 2A was obtained from the finite element method, it was +1.7 mNm. Here, the two spaces 8 are the same as the two spaces 8 of FIG. 1B, however the space 8a is larger than FIG. 1B, and other space 8b is smaller. Here, the plus means that the torque acting in the counter clockwise direction is generated. That is, the arcuate magnet piece 1a shifted in the clockwise direction is applied with the torque to the counter clockwise direction, hence the repulsive torque acts towards the direction making the shifting smaller, in other words, the arcuate magnet piece 1a is pushed away from the adjacent arcuate magnet piece 1 in the direction making the space 8b larger, hence since the repulsive pulse is acting, the self-aligning positioning comes into effect.

Similarly, as shown in FIG. 2B, the torque acting in case of arranging the arcuate magnet piece 1b by shifting by 0.5 degrees in counter clockwise direction was −1.7 mNm. Here, the two spaces 8 are the same as the two spaces 8 of FIG. 1B, however the space 8a is smaller than FIG. 1B and other space 8b is larger. Here, the minus means that the torque acting in the clockwise direction is generated. That is, the arcuate magnet piece 1b shifted in the counter clockwise direction as shown in FIG. 2B is applied with the torque of the clockwise direction, hence the repulsive torque acts towards the direction to make the shifting smaller, in other words, the arcuate magnet piece 1b is pushed away from the adjacent arcuate magnet piece 1 in the direction to make the space 8b larger, hence since the repulsive pulse is acting, the self-aligning positioning comes into effect.

In order to show the comparison between the conventional examples and the present embodiment described based on FIG. 2A to FIG. 2C, FIG. 6 show the change of the torque acting to the arcuate magnet piece 1a of FIG. 2A when the first predetermined angle θ1 of the connecting side surface 6 of FIG. 1C is changed from 90 degrees (the conventional examples) to 30 degrees. Note that, the arcuate magnet piece 1a shown in FIG. 2A considered to be shifted by 0.5 degrees (the shifting of −0.5 degrees) in the clockwise direction.

Also, here it is set so that the second predetermined angle θ2 of the connecting side surface 7 shown in FIG. 1C is θ2=(180-θ1).

Figure 6:
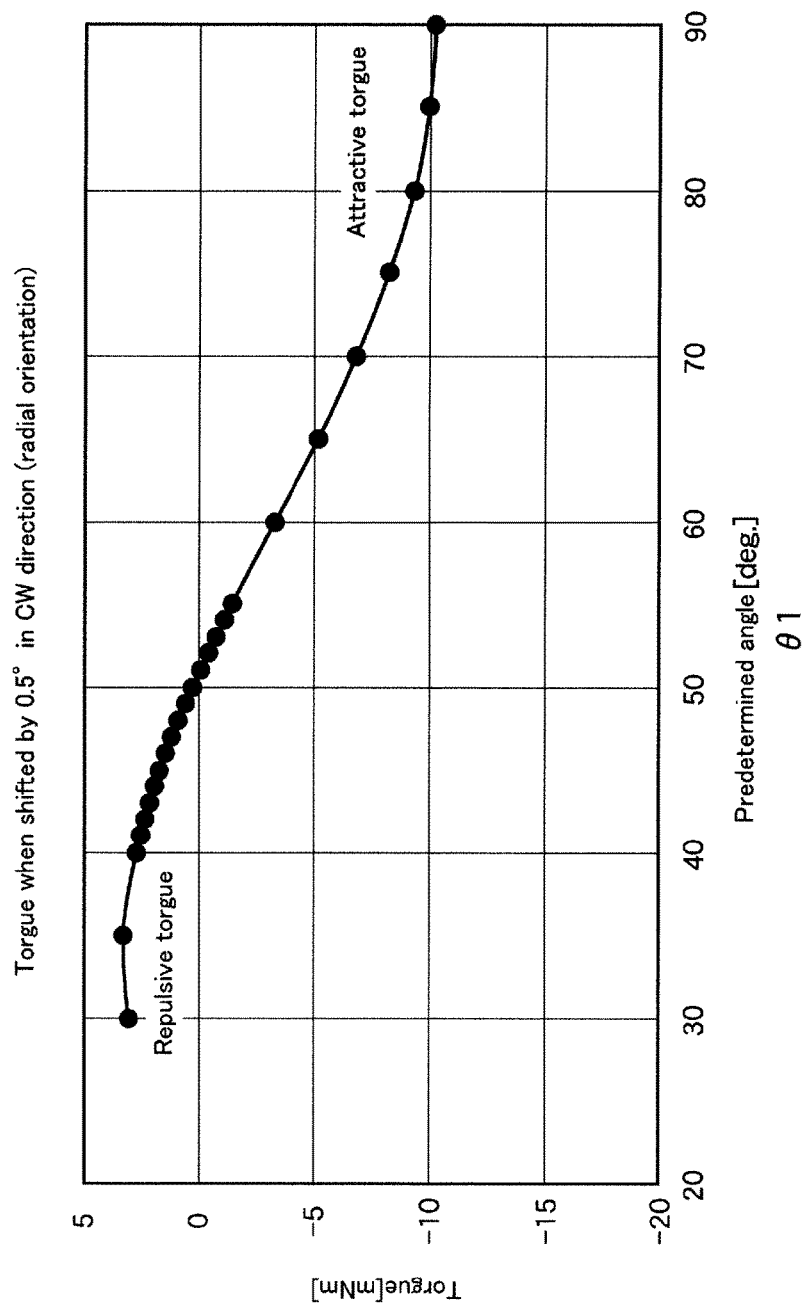
FIG. 6 is the graph showing the change of the torque when the predetermined angle of the acute angle is changed.

As shown in FIG. 6, in the present embodiment, compared to the conventional examples (90 degrees), the attractive torque begins to decrease around the first predetermined angle θ1 of 80 degrees or so, and the smaller the first predetermined angle θ1 is, and as the larger the second predetermined angle θ2 is, which is not shown in the figure, compared to the conventional examples, the weaker the attractive torque is. When the first predetermined angle θ1 is at 60 degrees, that is when the second predetermined angle θ2 is 120 degrees, the attractive torque is decreased by 33% compared to the conventional examples, thus the position of the arcuate magnet piece 1a can be corrected and the desired positioning can be attained easily. Further preferably, when it is less than 50 degrees, it was confirmed that the repulsive torque is acting in the direction to resolve the position shifting (the self-aligning positioning torque).

Note that, if the first predetermined angle θ1 is too small or the second predetermined angle θ2 is too large; it fails to form the arcuate magnet piece from the point of designing. From this point of view, the lower limit of said predetermined angle is 25 degrees, and the upper limit is 155 degrees.

Figure 5:
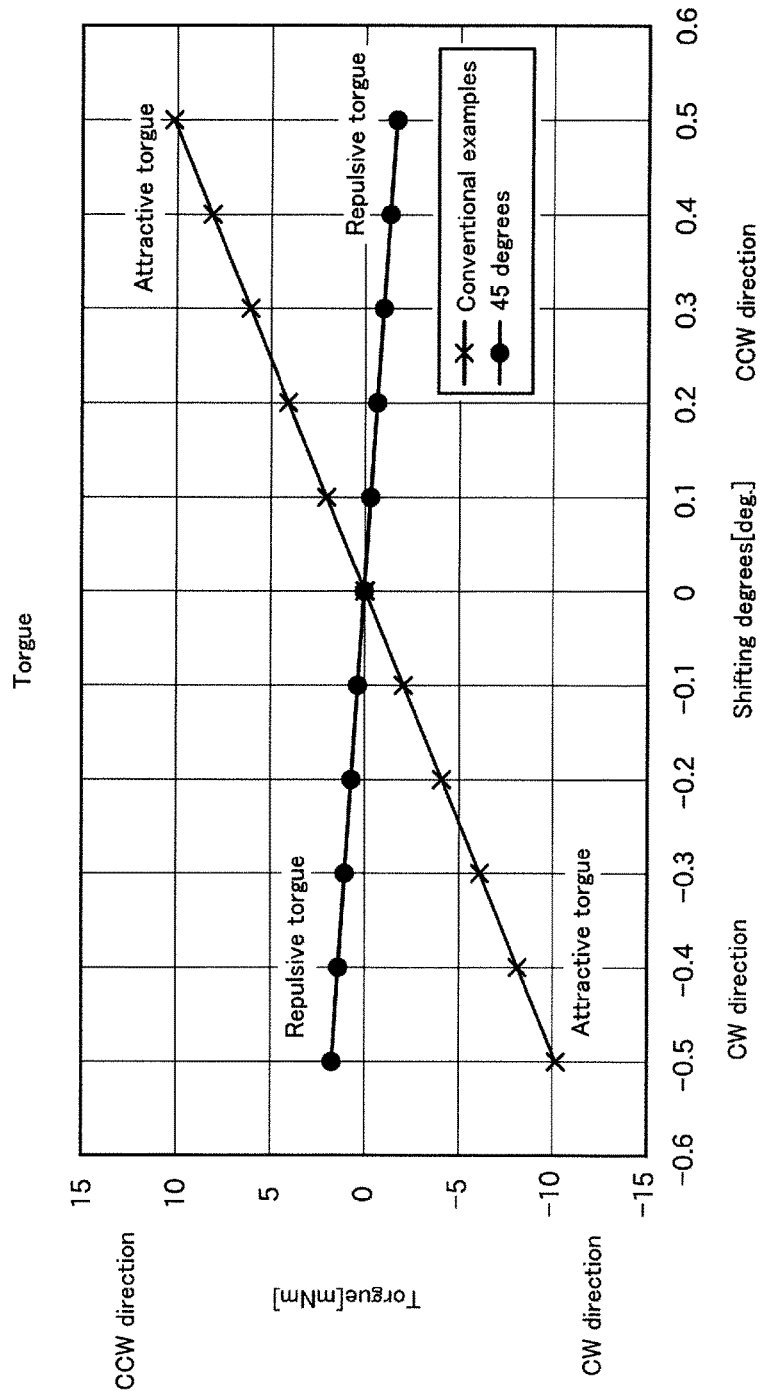
FIG. 5 is the graph comparing the repulsive torque when the arcuate magnet piece according to one example of the present invention is shifted by the predetermined shifting angle, and the attractive torque when the arcuate magnet piece according to the conventional example is shifted by the predetermined shifting angle.

Also, FIG. 5 is the graph of the torque showing the comparison between the conventional example and the above embodiment described based on FIG. 2A to FIG. 2C. As shown in FIG. 5, in the conventional example, in case the arcuate magnet piece 10a is arranged by shifting the position just by 0.1 degrees in the clockwise (CW) direction, the attractive torque in the same clockwise (CW) direction is generated, thus the torque is acting towards the direction making the shifting even larger, therefore due to the synergistic effect of increased position shifting, and increased the attractive torque, the arcuate magnet piece 10a eventually contacts with the adjacent arcuate magnet piece 10.

Also, in the conventional examples, in case the arcuate magnet piece 10*a* is arranged by shifting the position just by 0.1 degrees in the counter clockwise (CCW) direction, the attractive torque in the same counter clockwise (CCW) direction is generated, thus the torque is acting towards the direction to make the shifting even larger, therefore due to the synergistic effect of increased position shifting, and increased the attractive torque, the arcuate magnet piece 10*a* eventually contacts with the adjacent arcuate magnet piece 10.

On the contrary, as shown in FIG. 5, in the present embodiment, in case the arcuate magnet piece 1*a* is arranged by shifting the position by 0.5 degrees in the clockwise (CW) direction, then the repulsive torque towards the counter clockwise (CCW) direction which is the opposite thereof is generated, and the torque acts in the direction to resolve the position shifting. Therefore, the arcuate magnet piece 1*a* does not contact the adjacent arcuate magnet piece 1. Also, in the present invention, in case the arcuate magnet piece 1*b* is arranged by shifting the position by 0.5 degrees in the counter clockwise (CCW) direction, then the repulsive torque towards the clockwise (CW) direction which is the opposite thereof is generated, and the torque acts in the direction to resolve the position shifting. Therefore, the arcuate magnet piece 1*b* does not contact the adjacent arcuate magnet piece 1.

Here, as the torque of the present embodiment shown in FIG. 5, the first predetermined angle θ1=45 degrees and the second predetermined angle θ2=135 degrees.

In the present embodiment, the corner part 6*b* and 7*d* of the acute angle shown in FIG. 1C comprises, for example, the curved surface or the chamfered surface, thereby comprises the chamfered surface parts 6*b*1 and 7*d*1, or the curved surface parts 6*b*2 and 7*d*2. By taking such constitution, the corner parts 6*b* and 7*d* of the acute angle of the arcuate magnet piece 1 can be prevented from chipping during the assembling; hence the product yield can be improved and the cost performance and the productivity can be enhanced.

The arcuate magnet piece 1 of the present embodiment, as shown in FIG. 1A, comprises the tip surface 6*b* at one of the connecting side surface 6 positioned at the opposite direction along the circumference direction W, and comprises the tip surface 7*b* at other connecting side surface 7. By taking such constitution, as shown in FIG. 1B, the motor magnet arranging the plurality of the arcuate magnet pieces 1 having the same constitution and placing the space 8 making the connecting side surface approximately parallel along the circumference direction W can be assembled.

Figure 2D:
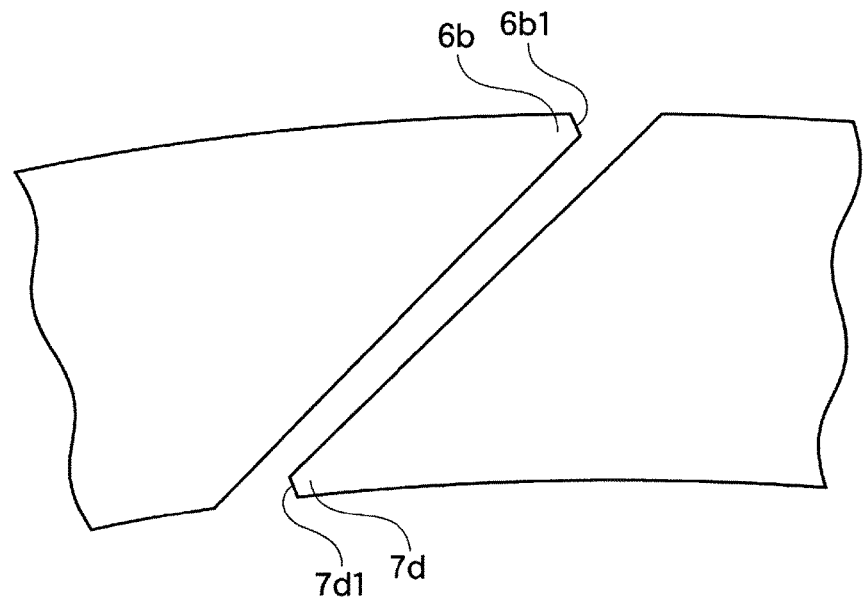
FIG. 2D is the schematic top view showing the shape of the chamfered corner part having the acute angle of the arcuate magnet piece according to one of other embodiment of the present invention.
Figure 2E:
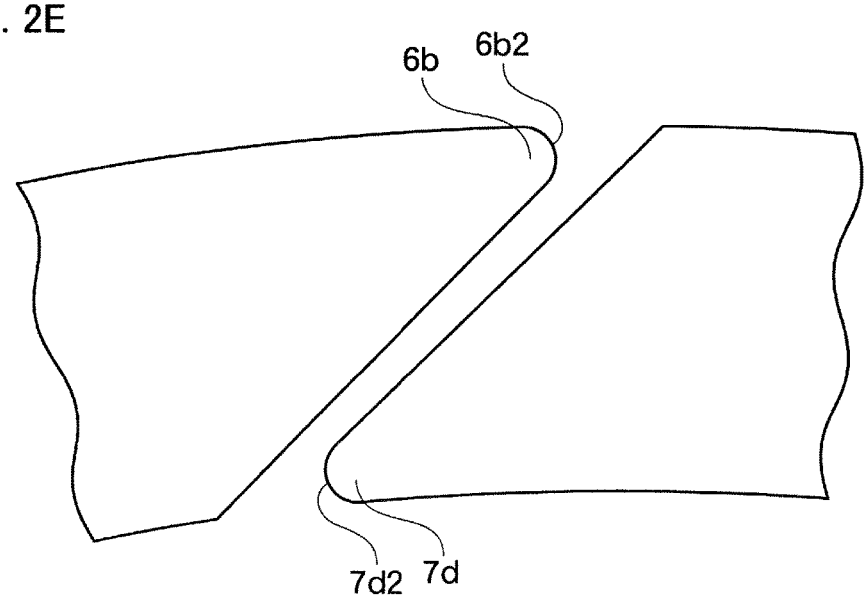
FIG. 2E is the schematic top view showing the shape of the chamfered corner part having the acute angle of the arcuate magnet piece according to one of other embodiment of the present invention.
Figure 2F:
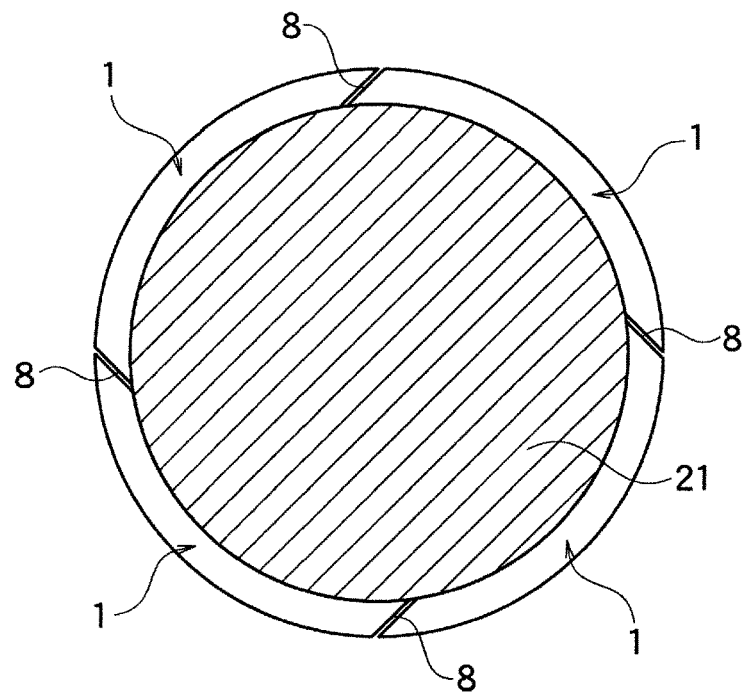
FIG. 2F is the schematic top view showing the state wherein plurality of arcuate magnet pieces according to one of other embodiment of the present invention mounting on the shaft while equally spacing out along the circumference direction.
Figure 2G:
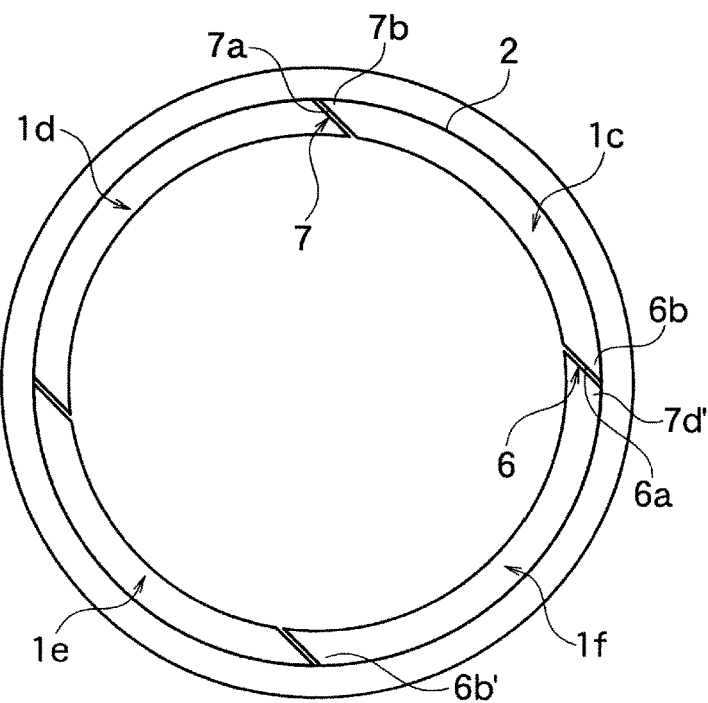
FIG. 2G is the schematic top view showing the state wherein plurality of arcuate magnet pieces according to one of other embodiment of the present invention mounting on the yoke while equally spacing out along the circumference direction.

Note that, as shown in FIG. 2G, in the present invention, the tip surface 6*a* and the tip surface 7*a* forming the predetermined angle θ of the acute angle may be formed to the first connecting side surface 6 and the second connecting side surface 7. In this case, the arcuate magnet piece 1 formed with the tip surface 6*a* and the tip surface 7*a* forming the predetermined angle θ of the acute angle at the both sides, and the tip surface 6*a* and the tip surface 7*a* forming the predetermined angle θ of the obtuse angle at the both sides are arranged in the alternating manner, thereby the magnet assembly is formed.

The motor according to the present embodiment comprises the motor magnet wherein the even number of the above mentioned arcuate magnet pieces 1 are assembled. According to such motor comprising the magnet, the number of 2n (n is the positive integer) of the arcuate magnet pieces 1 are arranged along the circumference direction W at the surface which rotates relatively with respect to the armature wound with the coils, hence the cost can be easily reduced, and higher output can be attained by sufficiently exhibiting the magnetic characteristics of the magnet while reducing the cogging torque and the torque ripple, and it can be designed even more freely.

Further, the arcuate magnet piece 1 of the present embodiment can be magnetized separately before mounting to the motor, thus the non-magnetized portion will not remain and the magnetic characteristic of the arcuate magnet can be sufficiently exhibited.

Note that, the arcuate magnet piece 1 according to the present embodiment may be mounted in the cylindrical form at the outer rotor of the brushless motor, or it may be mounted in the cylindrical form at the inner rotor side of the brushless motor. Also, the arcuate magnet 1 according to the present embodiment may be mounted in a cylindrical form at the armature core side of the brush motor, or it may be mounted in the cylindrical form as the field magnet at the stator side.

Also, the magnetizing direction of the arcuate magnet piece 1 according to the present embodiment is not particularly limited, and as shown in FIG. 3(A), it may be magnetized to be parallel in the thickness direction, or in the radial direction as shown in FIG. 3(B); and further the magnetizing direction may be concentrated towards the stator core of the outside such as a halbach type shown in FIG. 3(C). Furthermore, as shown in FIG. 3(D), the magnetizing direction may be strongly oriented towards the stator core 50 arranged at the inside such as a strongly radial orientation type (or a halbach type). Preferably, it may be substantially radial orientation.

Figure 8A:
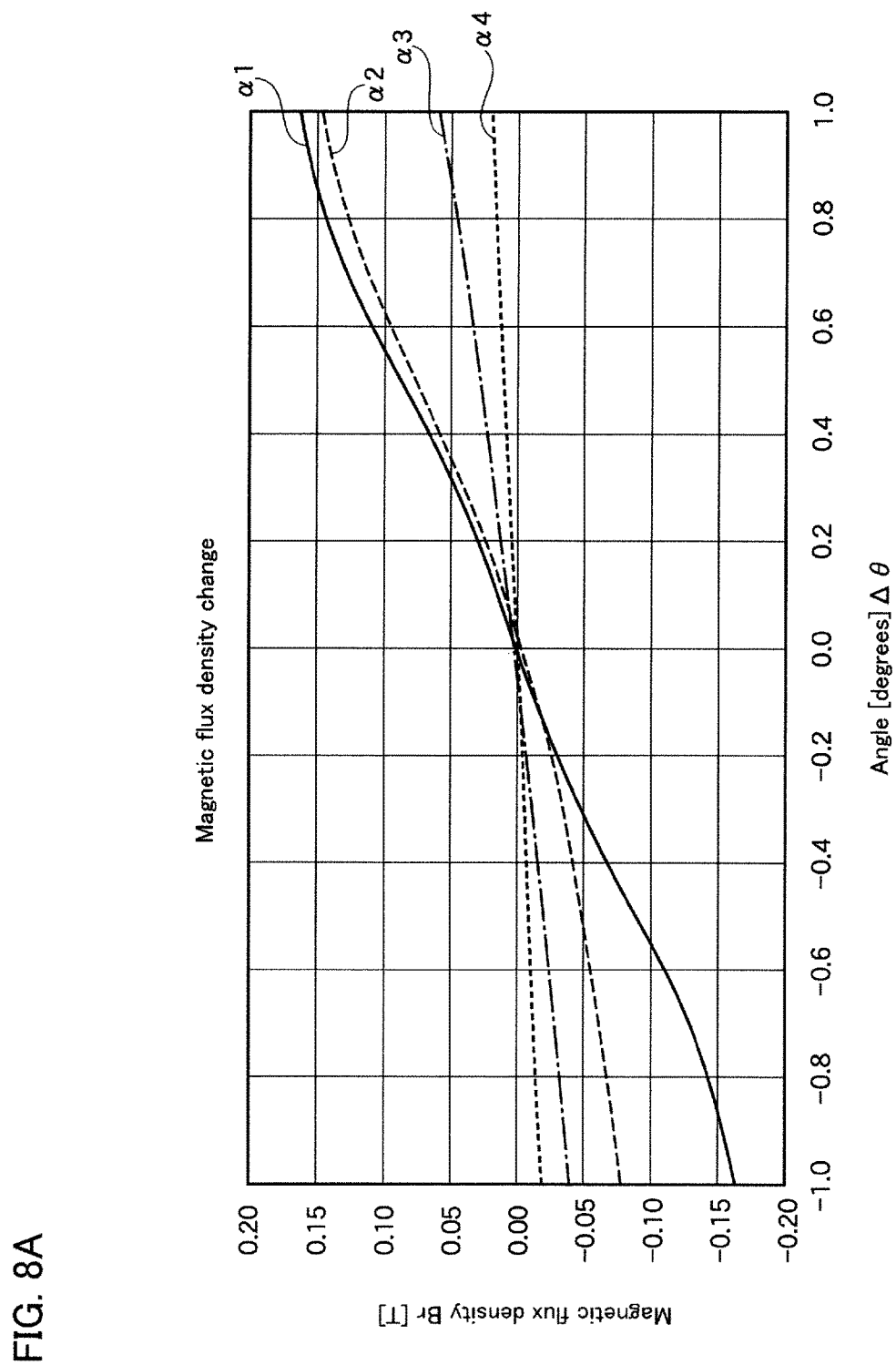
FIG. 8 is the graph showing the distribution of the radial direction component of the magnetic flux density according to the conventional examples and the magnetic flux distribution of the arcuate magnet piece of one embodiment of the present invention.
FIG. 8B describes the horizontal axis of FIG. 8A.
Figure 8B:
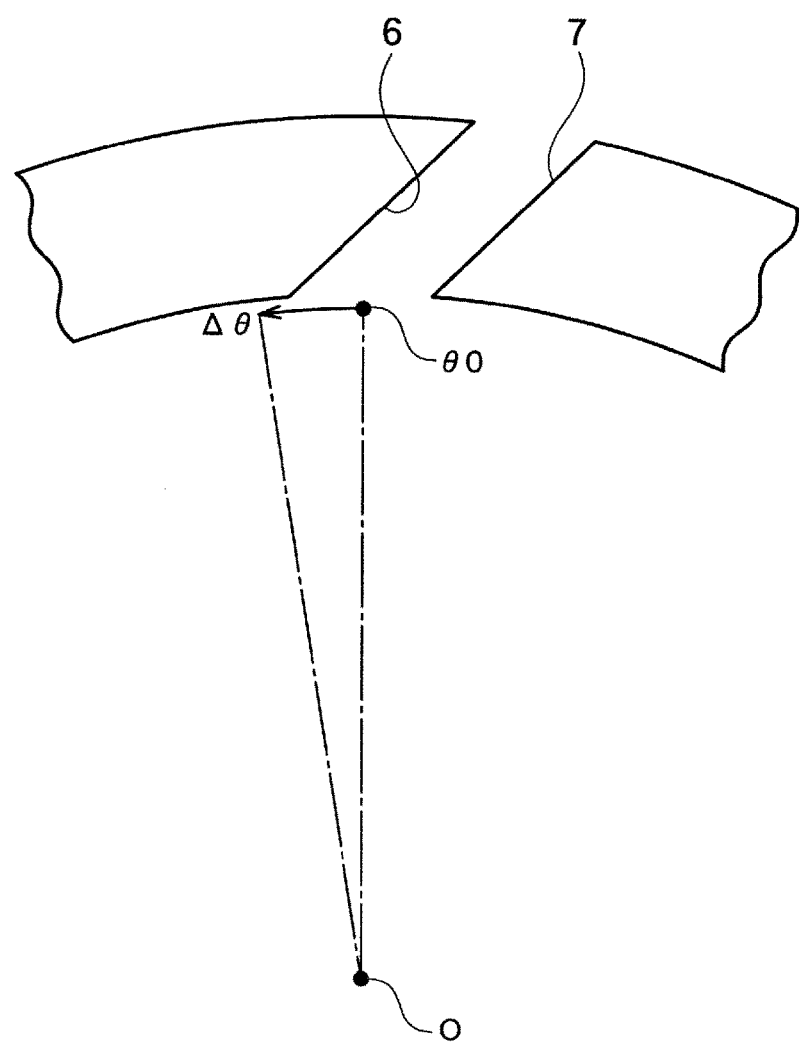

Also, according to the arcuate magnet piece 1 of the present embodiment, the connecting side surfaces 6 and 7 comprises the tip surfaces 6*a* and 7*a* intersecting at the predetermined angles θ1 and θ2 with respect to the tangent lines T1 and T2 of the curving direction of the outer circumference surface 2. Therefore, as shown in FIG. 1B, in case the space 8 which makes the side surfaces approximately parallel is provided between the connecting side surfaces 7 and 6 of the adjacent arcuate magnet piece 1, said space 8 making the connecting side surfaces approximately parallel is not perpendicular with o the tangent lines T1 and T2 of the curving surface, but it forms the angle θ1 and θ2. Along with this, as shown in FIG. 8A, compared to the conventional examples, the change of the radial direction component of the magnetic flux density near the connecting side surfaces 6 and 7 is more moderate, as a result, in case of using the arcuate magnet piece 1 of the present embodiment as the magnet for the motor by arranging it inside the yoke 20 as shown in FIG. 1B, the cogging torque and the torque ripple can be reduced.

Figure 4:
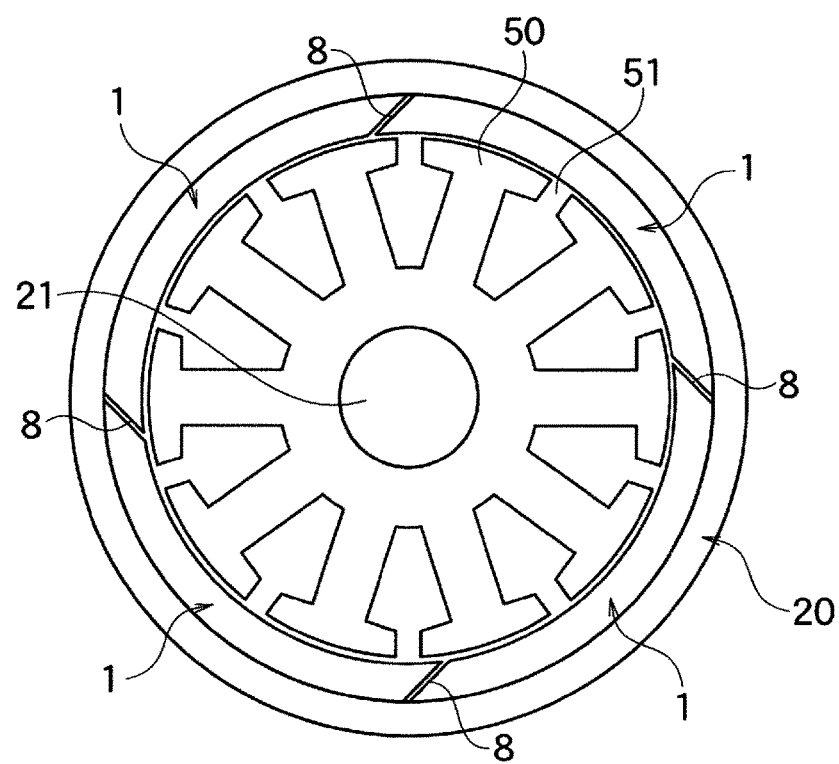
FIG. 4 is the schematic top view of the motor using the arcuate magnet piece of one example of the present invention and the armature.

Specifically, for the motor of the present embodiment wherein four arcuate magnet pieces 1 are arranged at the outer circumference while opposing the armature 50 comprising ten slots 51 (the arcuate magnet piece 1 shown in FIG. 1 is arranged) as shown in FIG. 4, compared to the case of arranging the arcuate magnet piece 10 which does not comprise the tip surface of the acute angle, the cogging torque in terms of peak to peak comparison can be reduced by 3% when θ1 is 60 degrees, by 8% when θ1 is 45 degrees, and by 38% when θ1 is 30 degrees.

Second Embodiment

Although it is not shown in the figures, the arcuate magnet piece according to the second embodiment of the present invention comprises the same constitution and the same effect as the first embodiment, except that it is constituted by the anisotropic rare earth sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

For the purpose of comparison, as shown in FIG. 2C, the attractive torque acting in case the conventional arcuate magnet piece 10a is arranged by shifting by 0.5 degrees in the clockwise direction was −96.3 mNm.

Similarly, the attractive torque acting in case the arcuate magnet piece 10a shown in FIG. 2C is arranged by shifting by 0.5 degrees in the counter clockwise direction was +96.3 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction as shown in FIG. 2A was −39.3 mNm which is 41% of the attractive torque acting to the conventional arcuate magnet piece 10a.

Similarly, the attractive torque acting in case the arcuate magnet piece 1b is arranged by shifting by 0.5 degrees in the counter clockwise direction as shown in FIG. 2B was +39.3 mNm which is 41% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction as shown in FIG. 2A was +5.3 mNm.

Similarly, the repulsive torque acting in case the arcuate magnet piece 1b is arranged by shifting by 0.5 degrees in the counter clockwise direction as shown in FIG. 2B was −5.3 mNm.

Similarly, when the first predetermined angle θ1 is 47 degrees or less, the repulsive torque was confirmed to be acting.

Third Embodiment

Although it is not shown in the figures, the arcuate magnet piece according to the third embodiment of the present invention comprises the same constitution and the same effect as the first embodiment, except that it is constituted by the isotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

For the purpose of comparison, as shown in FIG. 2C, the attractive torque acting in case the conventional arcuate magnet piece 10a is arranged by shifting by 0.5 degrees in the clockwise direction was −2.1 mNm.

Similarly, the attractive torque acting in case the arcuate magnet piece 10a shown in FIG. 2C is arranged by shifting by 0.5 degrees in the counter clockwise direction was +2.1 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction as shown in FIG. 2A was −0.7 mNm which is 33% of the attractive torque acting to the conventional arcuate magnet piece 10a.

Similarly, the attractive torque acting in case the arcuate magnet piece 1b is arranged by shifting by 0.5 degrees in the counter clockwise direction as shown in FIG. 2B was +0.7 mNm which is 33% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction as shown in FIG. 2A was +0.3 mNm.

Similarly, the repulsive torque acting in case the arcuate magnet piece 1b is arranged by shifting by 0.5 degrees in the counter clockwise direction as shown in FIG. 2B was −0.3 mNm.

Similarly, when the first predetermined angle θ1 is 49 degrees or less, the repulsive force was confirmed to be acting.

Fourth Embodiment

Although it is not shown in the figures, the arcuate magnet piece according to the fourth embodiment of the present invention comprises the same constitution and the same effect as the first embodiment, except that it is constituted by the anisotropic ferrite bond magnet which is molded by usually employed molding method for the bond magnet, and oriented substantially in the radial direction and then magnetized. Hereinafter, for the parts which differs from the first embodiment will be discussed, and the common parts will be omitted from explaining. The connecting side surfaces 6 and 7 of the arcuate magnet piece 1 of the present embodiment can be formed by using the mold so to form the predetermined angles θ1 and θ2 with respect to the tangent line of the outer circumference surface 2.

For the purpose of comparison, as shown in FIG. 2C, the attractive torque acting in case the conventional arcuate magnet piece 10a is arranged by shifting by 0.5 degrees in the clockwise direction was −3.1 mNm.

Similarly, the attractive torque acting in case the arcuate magnet piece 10a shown in FIG. 2C is arranged by shifting by 0.5 degrees in the counter clockwise direction was +3.1 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction as shown in FIG. 2A was −1.0 mNm which is 33% of the attractive torque acting to the conventional arcuate magnet piece 10a.

Similarly, the attractive torque acting in case the arcuate magnet piece 1b is arranged by shifting by 0.5 degrees in the counter clockwise direction as shown in FIG. 2B was +1.0 mNm which is 33% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction as shown in FIG. 2A was +0.3 mNm.

Similarly, the repulsive torque acting in case the arcuate magnet piece 1b is arranged by shifting by 0.5 degrees in the counter clockwise direction as shown in FIG. 2B was −0.3 mNm.

Similarly, when the first predetermined angle θ1 is 49 degrees or less, the repulsive torque was confirmed to be acting.

Fifth Embodiment

Although it is not shown in the figures, the arcuate magnet piece according to the fifth embodiment of the present invention comprises the same constitution and the same effect as the first embodiment, except that it is constituted by the anisotropic rare earth bond magnet which is molded by usually employed molding method for the bond magnet, and oriented substantially in the radial direction and then magnetized. Hereinafter, for the parts which differs from the first embodiment will be discussed, and the common parts will be omitted from explaining. The connecting side surfaces 6 and 7 of the arcuate magnet piece 1 of the present embodiment can be formed by molding the using the mold so to form the predetermined angles θ1 and θ2 with respect to the tangent line of the outer circumference surface 2.

For the purpose of comparison, as shown in FIG. 2C, the attractive torque acting in case the conventional arcuate magnet piece 10a is arranged by shifting by 0.5 degrees in the clockwise direction was −62.4 mNm.

Similarly, the attractive torque acting in case the arcuate magnet piece 10a shown in FIG. 2C is arranged by shifting by 0.5 degrees in the counter clockwise direction was +62.4 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction as shown in FIG. 2A was −22.9 mNm which is 37% of the attractive torque acting to the conventional arcuate magnet piece 10a.

Similarly, the attractive torque acting in case the conventional arcuate magnet piece 1b is arranged by shifting by 0.5 degrees in the counter clockwise direction as shown in FIG. 2B was +22.9 mNm which is 37% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction as shown in FIG. 2A was +6.5 mNm.

Similarly, the repulsive torque acting in case the arcuate magnet piece 1b is arranged by shifting by 0.5 degrees in the counter clockwise direction as shown in FIG. 2B was −6.5 mNm.

Similarly, when the first predetermined angle θ1 is 48 degrees or less, the repulsive torque was confirmed to be acting.

Sixth Embodiment

Although it is not shown in the figures, the arcuate magnet piece according to the sixth embodiment of the present invention comprises the same constitution and the same effect as the first embodiment, except that it is constituted by the isotropic rare earth bond magnet which is molded by usually employed molding method for the bond magnet, and oriented substantially in the radial direction and then magnetized. Hereinafter, for the parts which differs from the first embodiment will be discussed, and the common parts will be omitted from explaining. The connecting side surfaces 6 and 7 of the arcuate magnet piece 1 of the present embodiment can be formed by molding the using the mold so to form the predetermined angles θ1 and θ2 with respect to the tangent line of the outer circumference surface 2.

For the purpose of comparison, as shown in FIG. 2C, the attractive torque acting in case the conventional arcuate magnet piece 10a is arranged by shifting by 0.5 degrees in the clockwise direction was −13.4 mNm.

Similarly, the attractive torque acting in case the arcuate magnet piece 10a shown in FIG. 2C is arranged by shifting by 0.5 degrees in the counter clockwise direction was +13.4 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction as shown in FIG. 2A was −4.7 mNm which is 35% of the attractive torque acting to the conventional arcuate magnet piece 10a.

Similarly, the attractive torque acting in case the arcuate magnet piece 1b is arranged by shifting by 0.5 degrees in the counter clockwise direction as shown in FIG. 2B was +4.7 mNm which is 35% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction as shown in FIG. 2A was +1.4 mNm.

Similarly, the repulsive torque acting in case the arcuate magnet piece 1b is arranged by shifting by 0.5 degrees in the counter clockwise direction as shown in FIG. 2B was −1.4 mNm.

Similarly, when the first predetermined angle θ1 is 49 degrees or less, the repulsive torque was confirmed to be acting.

Seventh Embodiment

The arcuate magnet piece according to the seventh embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

In the present embodiment, as shown in FIG. 2F, the inner circumference surface of the arcuate magnet piece 1 is adhered to the outer circumference surface of the shaft 21 made of the magnetic material such as the carbon steel for machine structure use (for example S45C).

For the purpose of comparison, although it is not shown in the figure, the attractive torque acting in case the conventional arcuate magnet piece 10a is arranged by shifting by 0.5 degrees in the clockwise direction was −10.6 mNm.

Similarly, although it is not shown in the figure, the attractive torque acting in case the arcuate magnet piece 10a is arranged by shifting by 0.5 degrees in the counter clockwise direction was +10.6 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction which is not shown in the figure was −3.7 mNm which is 35% of the attractive torque acting to the conventional arcuate magnet piece 10a.

Similarly, the attractive torque acting in case the arcuate magnet piece 1b is arranged by shifting by 0.5 degrees in the counter clockwise direction which is not shown in the figure was +3.7 mNm which is 35% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction which is not shown in the figure was +1.2 mNm.

Similarly, the repulsive torque acting in case the arcuate magnet piece 1b is arranged by shifting by 0.5 degrees in the counter clockwise direction which is not shown in the figure was −1.2 mNm.

Similarly, when the first predetermined angle θ1 is 49 degrees or less, the repulsive torque was confirmed to be acting.

Eighth Embodiment

The arcuate magnet piece according to the eighth embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

In the present embodiment, as shown in FIG. 2D, the acute corner parts 6b and 7d of the arcuate magnet piece 1 comprises the chamfered parts 6b1 and 7d1 of C0.2. Said chamfered parts 6b1 and 7d1 can be formed by polishing the acute corner parts 6b and 7d.

For the purpose of comparison, as shown in FIG. 2C, the attractive torque acting in case the conventional arcuate magnet piece 10a is arranged by shifting by 0.5 degrees in the clockwise direction was −10.2 mNm.

Similarly, the attractive torque acting in case the arcuate magnet piece 10a shown in FIG. 2C is arranged by shifting by 0.5 degrees in the counter clockwise direction was +10.2 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction which is not shown in the figure was −3.9 mNm which is 38% of the attractive torque acting to the conventional arcuate magnet piece 10a.

Similarly, the attractive torque acting in case the arcuate magnet piece 1b is arranged by shifting by 0.5 degrees in the counter clockwise direction which is not shown in the figure was +3.9 mNm which is 38% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction which is not shown in the figure was +1.3 mNm.

Similarly, the repulsive torque acting in case the arcuate magnet piece 1b is arranged by shifting by 0.5 degrees in the counter clockwise direction which is not shown in the figure was −1.3 mNm.

Similarly, when the first predetermined angle θ1 is 49 degrees or less, the repulsive torque was confirmed to be acting.

Ninth Embodiment

The arcuate magnet piece according to the ninth embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

In the present embodiment, as shown in FIG. 2E, the acute corner parts 6b and 7d of the arcuate magnet piece 1 comprises the curved surface parts 6b2 and 7d2 of having the radius of the curvature of 0.2. Said curved surface parts 6b2 and 7d2 can be formed by polishing the acute corner parts 6b and 7d.

For the purpose of comparison, as shown in FIG. 2C, the attractive torque acting in case the conventional arcuate magnet piece 10a is arranged by shifting by 0.5 degrees in the clockwise direction was −10.2 mNm.

Similarly, the attractive torque acting in case the arcuate magnet piece 10a shown in FIG. 2C is arranged by shifting by 0.5 degrees in the counter clockwise direction was +10.2 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction which is not shown in the figure was −4.0 mNm which is 39% of the attractive torque acting to the conventional arcuate magnet piece 10a.

Similarly, the attractive torque acting in case the arcuate magnet piece 1b is arranged by shifting by 0.5 degrees in the counter clockwise direction which is not shown in the figure was +4.0 mNm which is 39% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction which is not shown in the figure was +0.6 mNm.

Similarly, the repulsive torque acting in case the arcuate magnet piece 1b is arranged by shifting by 0.5 degrees in the counter clockwise direction which is not shown in the figure was −0.6 mNm.

Similarly, when the first predetermined angle θ1 is 47 degrees or less, the repulsive torque was confirmed to be acting.

Tenth Embodiment

The arcuate magnet piece according to the tenth embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

In the present embodiment, as shown in FIG. 2G, the corner parts 6b and 7d forms the acute angle which are formed at the outer circumference surface 2 of the arcuate magnet pieces 1c and 1e; and the corner parts 6b' and 7d' forms the obtuse angle which are formed at the outer circumference surface 2 of the arcuate magnet pieces 1d and 1f.

For the purpose of comparison, as shown in FIG. 2C, the attractive torque acting in case the conventional arcuate magnet piece 10a is arranged by shifting by 0.5 degrees in the clockwise direction was −10.2 mNm.

Similarly, the attractive torque acting in case the arcuate magnet piece 10a shown in FIG. 2C is arranged by shifting by 0.5 degrees in the counter clockwise direction was +10.2 mNm.

Similarly, when the corner parts 6b and 7d has the predetermined angle θ=60 degrees and the corner parts 6b' and 7d' has the predetermined angle θ=120 degrees as shown in FIG. 2G, then the attractive torque acting in case the arcuate magnet piece 1c is arranged by shifting by 0.5 degrees in the clockwise direction was −3.4 mNm which is 33% of the attractive torque acting to the conventional arcuate magnet piece 10a.

Similarly, the attractive torque acting in case the arcuate magnet piece 1c is arranged by shifting by 0.5 degrees in the counter clockwise direction as shown in FIG. 2G was +3.4 mNm which is 33% of the attractive torque acting to the conventional arcuate magnet piece 10a.

Similarly, when the corner parts 6b and 7d has the predetermined angle θ=45 degrees and the corner parts 6b' and 7d' has the predetermined angle θ=135 degrees as shown in FIG. 2G, then the repulsive torque acting in case the arcuate magnet piece 1c is arranged by shifting by 0.5 degrees in the clockwise direction was +1.7 mNm.

Similarly, the repulsive torque acting in case the arcuate magnet piece 1c is arranged by shifting by 0.5 degrees in the counter clockwise direction as shown in FIG. 2G was −1.7 mNm.

Similarly, when the predetermined angle θ of the corner parts 6b and 7d are 50 degrees or less, the repulsive torque was confirmed to be acting.

Eleventh Embodiment

The arcuate magnet piece according to the eleventh embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

Figure 2H:
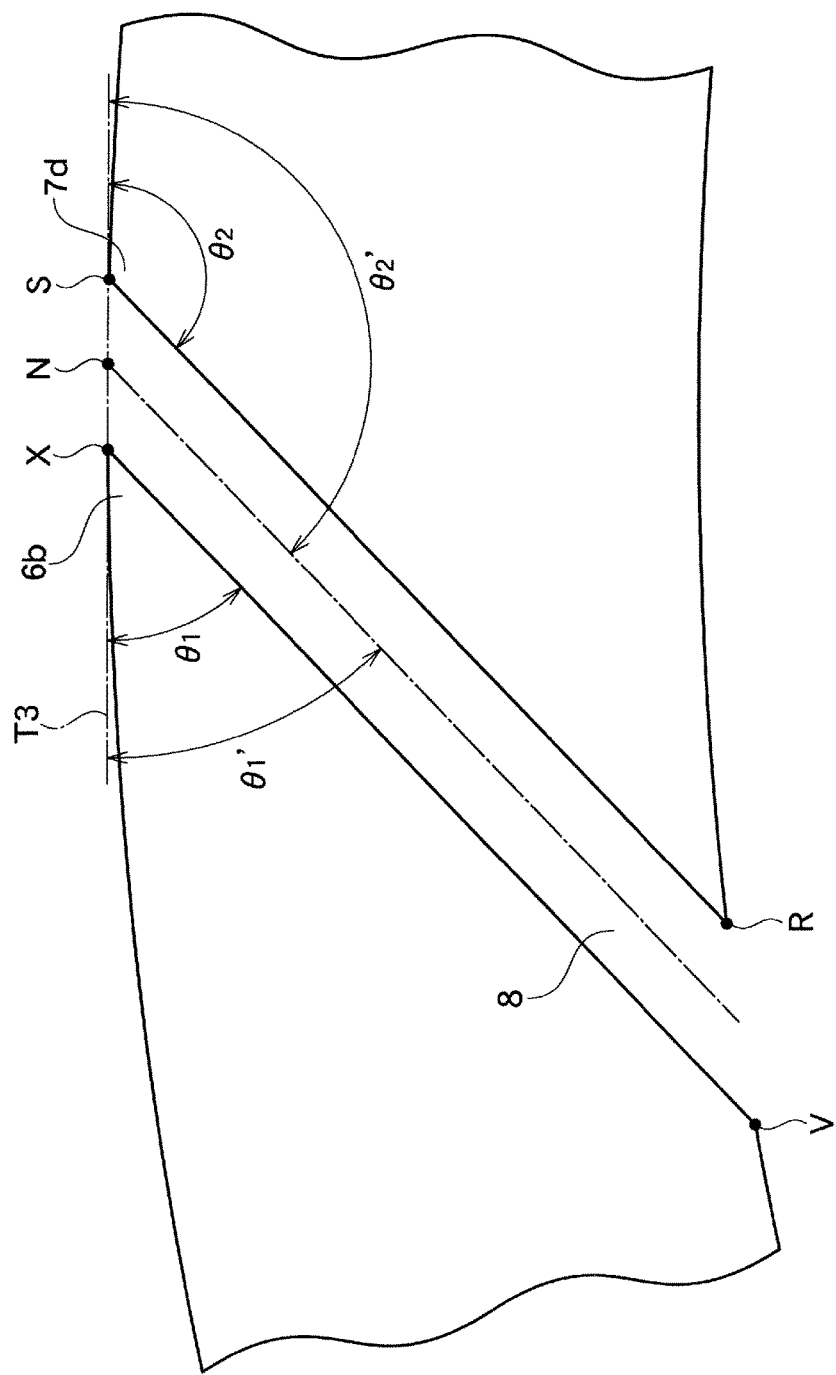
FIG. 2H is the partial top view showing the details of the connecting side surface of the arcuate magnet piece according to one of other embodiment of the present invention.

In the present embodiment, as shown in FIG. 2H, the space 8 is provided so that the width is 0.4 mm and to make the connecting side surfaces are in parallel. That is, the side RS and the side VX, and also the side PQ and the side TU which is not shown in this figure (however, refer to FIG. 1D) are parallel, and the rest of the space 8 which is not shown in this figure has the width of 0.4 mm and the connecting side surfaces are parallel. The angles θ1 and θ2 of the corner parts 6b and 7d are respectively approximately equal to the angles θ1' and θ2' formed between the center line T4 of the space 8 and the tangent line T3 at the point N where the center line T4 of the space 8 intersects with the extension line of the outer circumference surface 2 of the arcuate magnet piece. Thus, the angles θ1' and θ2' can be considered as the first and second angle θ1 and θ2 respectively.

For the purpose of comparison, as shown in FIG. 2C, the attractive torque acting in case the conventional arcuate magnet piece 10a is arranged by shifting by 0.5 degrees in the clockwise direction was −8.7 mNm.

Similarly, the attractive torque acting in case the arcuate magnet piece 10a shown in FIG. 2C is arranged by shifting by 0.5 degrees in the counter clockwise direction was +8.7 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction as shown in FIG. 2A was −3.5 mNm which is 41% of the attractive torque acting to the conventional arcuate magnet piece 10a.

Similarly, the attractive torque acting in case the arcuate magnet piece 1b is arranged by shifting by 0.5 degrees in the counter clockwise direction as shown in FIG. 2B was +3.5 mNm which is 41% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction as shown in FIG. 2A was +0.2 mNm.

Similarly, the repulsive torque acting in case the arcuate magnet piece 1b is arranged by shifting by 0.5 degrees in the counter clockwise direction as shown in FIG. 2B was −0.2 mNm.

Similarly, when the first predetermined angle θ1 is 46 degrees or less, the repulsive torque was confirmed to be acting.

Twelfth Embodiment

The arcuate magnet piece according to the twelfth embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

Figure 2I:
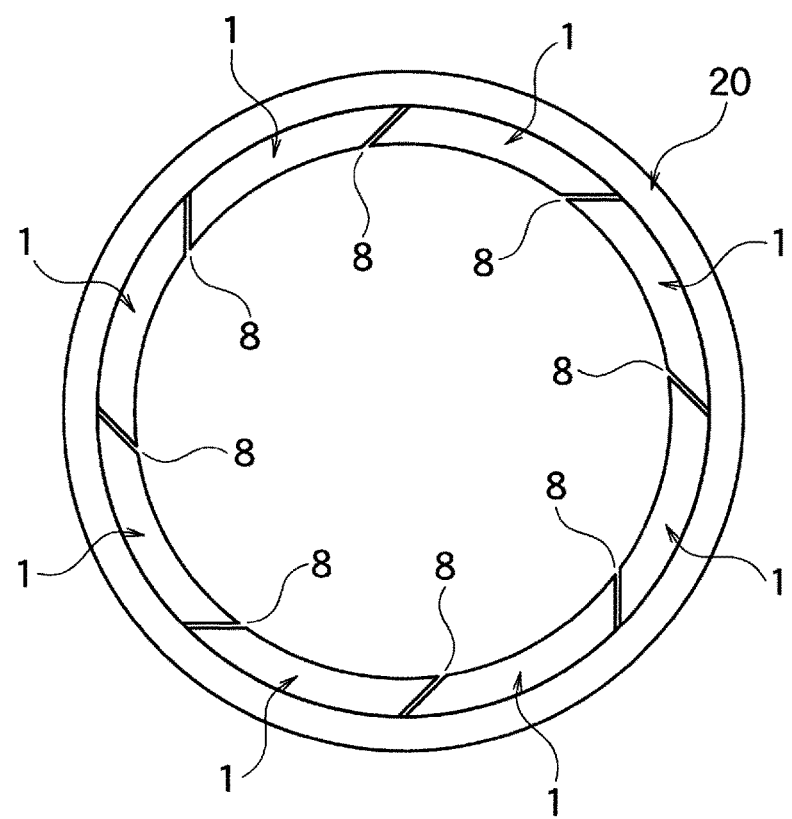
FIG. 2I is the schematic top view showing the state wherein plurality of arcuate magnet pieces according to one of other embodiments of the present invention mounting on the yoke while equally spacing out along the circumference direction.

In the present embodiment, as shown in FIG. 2I, eight arcuate magnet pieces 1 are arranged at the inner circumference side so that N pole and S pole are placed in an alternating manner along the circumference direction. Here, eight arcuate magnet pieces 1 are provided so that the spaces 8 have equal width. Also, if the constitution of the space 8 is described using FIG. 1D, then the angle ROV=the angle SOX=the angle POT=the angle QUO=1.0 degrees, and for the rest of the spaces 8 which are not shown in the figure, the angles are 1.0 degrees. Therefore, the side RS and the side VX, and the side PQ and the side TU which constitutes the space 8 are approximately parallel, and for the rest of the spaces 8 which are not shown in the figure, the sides constituting the space 8 are approximately parallel. Also, the opening angle of the magnet is the angle POR=the angle QOS=44 degrees.

For the purpose of comparison, which is not shown in the figure, the attractive torque acting in case the conventional arcuate magnet piece 10a is arranged by shifting by 0.5 degrees in the clockwise direction was −9.9 mNm.

Similarly, the attractive torque acting in case the arcuate magnet piece 10a is arranged by shifting by 0.5 degrees in the counter clockwise direction which is not shown in the figure was +9.9 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction which is not shown in the figure was −3.1 mNm which is 31% of the attractive torque acting to the conventional arcuate magnet piece 10a.

Similarly, the attractive torque acting in case the arcuate magnet piece 1b is arranged by shifting by 0.5 degrees in the counter clockwise direction, which is not shown in the figure was +3.1 mNm which is 31% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction which is not shown in the figure was +1.9 mNm.

Similarly, the repulsive torque acting in case the arcuate magnet piece 1b is arranged by shifting by 0.5 degrees in the counter clockwise direction which is not shown in the figure was −1.9 mNm.

Similarly, when the first predetermined angle θ1 is 51 degrees or less, the repulsive torque was confirmed to be acting.

Thirteenth Embodiment

The arcuate magnet piece according to the thirteenth embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

Although it is not shown in the figure, 48 arcuate magnet pieces 1 are provided so that N pole and S pole are arranged in alternating manner along the circumference direction. Here, 48 arcuate magnet pieces 1 are provided so that the spaces have equal width. Also, if the constitution of the space 8 is described using FIG. 1D, then the angle ROV=the angle SOX=the angle POT=the angle QUO=0.1 degrees, and for the rest of the spaces 8 which are not shown in the figure, the angles are 0.1 degrees. Therefore, the side RS and the side VX, and the side PQ and the side TU which constitutes the space 8 are approximately parallel, and for the rest of the spaces 8 which are not shown in the figure, the sides constituting the space 8 are approximately parallel. Also, the opening angle of the magnet is the angle POR=the angle QOS=7.4 degrees.

Also, in the present embodiment, the inner circumference surface of the arcuate magnet piece 1 is formed so that the radius of the curvature is 150 mm, the outer circumference surface is formed so that the radius of the curvature is 153 mm, and the length is 30 mm. Also, the arcuate magnet pieces 1 are adhered to the inner circumference surface of the yoke 20 having the thickness of 3 mm which is made of the magnetic material such as the cold rolled steel sheet (for example SPCC).

For the purpose of comparison, which is not shown in the figure, the attractive torque acting in case the conventional arcuate magnet piece 10a is arranged by shifting by 0.05 degrees in the clockwise direction was −97.3 mNm.

Similarly, the attractive torque acting in case the arcuate magnet piece 10a is arranged by shifting by 0.05 degrees in the counter clockwise direction which is not shown in the figure was +97.3 mNm.

Similarly, when the first predetermined angle θ1 is 60 degrees as shown in FIG. 1C, the attractive torque acting in case the arcuate magnet piece 1a is arranged by shifting by 0.05 degrees in the clockwise direction, which is not shown in the figure, was −30.8 mNm which is 32% of the attractive torque acting to the conventional arcuate magnet piece 10a.

Similarly, the attractive torque acting in case the arcuate magnet piece 1b is arranged by shifting by 0.05 degrees in the counter clockwise direction, which is not shown in the figure, was +30.8 mNm which is 32% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.05 degrees in the clockwise direction, which is not shown in the figure, was +16.8 mNm.

Similarly, the repulsive torque acting in case the arcuate magnet piece 1b is arranged by shifting by 0.05 degrees in the counter clockwise direction which is not shown in the figure was −16.8 mNm.

Similarly, when the first predetermined angle θ1 is 50 degrees or less, the repulsive torque was confirmed to be acting.

Fourteenth Embodiment

The arcuate magnet piece according to the fourteenth embodiment of the present invention comprises the same constitution and the same effect as the first embodiment, except that it is constituted by the anisotropic ferrite sintered magnet which is molded by usually employed molding method for the sintered magnet, and oriented substantially in the radial direction and then magnetized. Hereinafter, for the parts which differs from the first embodiment will be discussed, and the common parts will be omitted from explaining.

One example of the method for producing the arcuate magnet 1 constituted as such will be described in below.

In the present embodiment, first the mold having the cavity (the inner space) is prepared. Said cavity has the shape which has taken into consideration of the shape modification of the outer shape of the arcuate magnet piece 1 caused by the resin binder removal and also the reduction ratio of the outer shape of the arcuate magnet piece 1 during the sintering step. Then, the ferrite magnet material (for example, the compound formed by the resin binder and the magnet powder) comprising the magnet powder in the resin binder is supplied into the cavity (the preparation step of CIM molding).

As the source material of the magnet powder, it is not particularly limited, however preferably ferrite is used and particularly the hexagonal ferrite such as M phase and W phase of magnetoplumbite type or so may be preferably used.

Next, the ferrite magnet material is applied with the oriented magnetic field by applying the pressure to the cavity with appropriate pressure and temperature to carry out the injection molding solidification; thereby the molded article of the arcuate shape is formed (CIM molding step).

Then, the obtained arcuate shape molded article is applied with appropriate temperature to remove the resin binder, and then it is sintered at the appropriate sintering temperature pattern for the ferrite magnet material (the sintering step).

Then, the appropriate magnetic field is applied to magnetize, thereby the arcuate magnet piece 1 formed by the anisotropic ferrite magnet which is oriented in the predetermined direction is obtained (the magnetizing step).

Here, the injection molding solidification is carried out by applying the oriented magnetic field to the ferrite magnet material having good fluidity, hence compared to the conventional method of producing by dry or wet compression molding; the fluidity of the magnet powder of connecting side surfaces 6 and 7 of the arcuate magnet piece 1 is good. Hence, the anisotropy tends to easily orient to the direction of the applied oriented magnetic field, and the molding density can be secured sufficiently, therefore the magnetic characteristic of the magnet powder can be exhibited sufficiently.

In the present embodiment, the orientation degree of the magnet can be 90% or more. Note that, the orientation degree of the magnet is the ratio (Ir/Is) of the residual magnetization (Ir) with respect to the saturated magnetization (Is). The orientation degree of the magnet is strongly influenced by the level of the orientation of the anisotropy of the magnet powder in the mold after the injection molding in the oriented magnetic field, and also strongly influenced by the fine particle easily follows the orientation of the larger particles during the sintering.

Also, in the arcuate magnet piece 1 of the present embodiment, the connecting side surfaces 6 and 7 having the tip surface of the acute angle can be easily mold by the injection molding using CIM (ceramic injection molding) method, hence without increasing the necessary number of the members, the processing cost can be significantly reduced, the production step can be simplified, and the production yield and the magnetic characteristic can be improved. Thus, the cost performance and the productivity can be enhanced. Also, in the connecting side surfaces 6 and 7, the highly anisotropic ferrite sintered magnet wherein the orientation degree of the magnet is 90% or more can be obtained.

For the purpose of comparison, as shown in FIG. 2C, the attractive torque acting in case the conventional arcuate magnet piece 10a is arranged by shifting by 0.5 degrees in the clockwise direction was −10.4 mNm.

Similarly, the attractive torque acting in case the arcuate magnet piece 10a is arranged by shifting by 0.5 degrees in the counter clockwise direction as shown in FIG. 2C was +10.4 mNm.

Similarly, when the first predetermined angle θ1 is 60 degrees as shown in FIG. 1C, the attractive torque acting in case the arcuate magnet piece 1a is arranged by shifting by 0.5 degrees in the clockwise direction as shown in FIG. 2A was −3.4 mNm which is 33% of the attractive torque acting to the conventional arcuate magnet piece 10a.

Similarly, the attractive torque acting in case the arcuate magnet piece 1b is arranged by shifting by 0.5 degrees in the counter clockwise direction as shown in FIG. 2B was +3.4 mNm which is 33% of the attractive torque acting to the conventional arcuate magnet piece 10a.

Similarly, when the first predetermined angle θ1 is 45 degrees as shown in FIG. 1C, the repulsive torque acting in case the arcuate magnet piece 1a is arranged by shifting by 0.5 degrees in the clockwise direction as shown in FIG. 2A was +1.7 mNm.

Similarly, the repulsive torque acting in case the arcuate magnet piece 1b is arranged by shifting by 0.5 degrees in the counter clockwise direction as shown in FIG. 2B was −1.7 mNm.

Similarly, when the first predetermined angle θ1 is 50 degrees or less, the repulsive torque was confirmed to be acting.

Fifteenth Embodiment

Although it is not shown in the figure, the arcuate magnet piece according to the fifteenth embodiment of the present invention has the same constitution and the same effects as the fourteenth embodiment except that the arcuate magnet piece according to the fifteenth embodiment is formed by the molding method of MIM method instead of CIM method, and is substantially oriented in the radial direction and constituted by the magnetized anisotropic rare earth sintered magnet. Here, the parts which differ from the fourteenth embodiment will be described, and the overlapping parts will be omitted from explaining.

First, the method for producing the arcuate magnet 1 constituted as such will be described in below.

In the present embodiment, first the mold having the cavity (the inner space) is prepared. Said cavity has the shape which has taken into consideration of the shape modification of the outer shape of the arcuate magnet piece 1 caused by the resin binder removal, and also the reduction ratio of the outer shape of the arcuate magnet piece 1 during the sintering step. Then, the rare earth magnet material (for example, the compound formed by the resin binder and the magnet powder) comprising the magnet powder in the resin binder is supplied into the cavity (the preparation step of MIM molding).

In case of producing the rare earth sintered magnet, preferably R (rare earth element)-T-B based metal powder is used. Note that, the ratio of the rare earth element R (R includes the concept of Y, therefore it is one or two or more selected from the group consisting of Y, La, Ce, Pr, Nd, Sm, Eu, Gd, Tb, Dy, Ho, Er, Tm, Yb and Lu) in the main component of R-T-B based metal powder is not particularly limited, however for example it is 20 mass % to 40 mass %, the ratio of B is 0.5 mass % to 1.5 mass %, and the remaining part T is constituted by Fe or element constituted by one or two or more of the transition metal group selected from the group consisting of Fe and Co. Also, R-T-B based metal powder may comprise other elements as well. For example Al, Cu, Zr, Ti, Bi, Sn, Ga, Nb, Ta, Si, V, Ag, Ge or so may be comprised appropriately.

Next, the rare earth magnet material is applied with the oriented magnetic field by applying the pressure in the cavity with appropriate pressure and temperature to carry out the injection molding solidification; thereby the molded article of the arcuate shape is formed (MIM molding step).

Then, the obtained arcuate shape molded article is applied with appropriate temperature to remove the resin binder, and then it is sintered at the appropriate sintering temperature pattern for the rare earth magnet material (the sintering step).

Then, the appropriate magnetic field is applied to magnetize, thereby the arcuate magnet piece 1 formed of the anisotropic rare earth sintered magnet oriented in the predetermined direction is obtained (the magnetizing step).

Here, the injection molding solidification is carried out by applying the oriented magnetic field to the rare earth magnet material having good fluidity, hence compared to the conventional method of producing by dry or wet compression molding, the fluidity of the magnet powder of the connecting side surfaces 6 and 7 of the arcuate magnet piece 1 is good. Hence, the anisotropy tends to easily orient to the direction of the applied oriented magnetic field, and the molding density can be secured sufficiently, therefore the magnetic characteristic of the magnet powder can be exhibited sufficiently.

In the present embodiment, the orientation degree of the magnet can be 90% or more. Note that, the orientation degree of the magnet is the ratio (Ir/Is) of the residual magnetization (Ir) with respect to the saturated magnetization (Is). The orientation degree of the magnet is strongly influenced by the level of the orientation of the anisotropy of the magnet powder in the mold after the injection molding in the oriented magnetic field, and also strongly influenced by the fine particle easily follows the orientation of the larger particles during the sintering.

Also, in the arcuate magnet piece 1 of the present embodiment, the connecting side surfaces 6 and 7 having the tip surface of the acute angle can be easily molded by the injection molding using MIM method, hence without increasing the necessary number of the members, the processing cost can be significantly reduced, the production step can be simplified, and the production yield and the magnetic characteristic can be improved. Thus, the cost performance and the productivity can be enhanced. Also, in the connecting side surfaces 6 and 7, the highly anisotropic rare earth sintered magnet wherein the orientation degree of the magnet is 90% or more can be obtained.

For the purpose of comparison, as shown in FIG. 2C, the attractive torque acting in case the conventional arcuate magnet piece 10$a$ is arranged by shifting by 0.5 degrees in the clockwise direction was −96.3 mNm.

Similarly, the attractive torque acting in case the arcuate magnet piece 10$a$ is arranged by shifting by 0.5 degrees in the counter clockwise direction as shown in FIG. 2C was +96.3 mNm.

Similarly, when the first predetermined angle $\theta 1$ is 60 degrees as shown in FIG. 1C, the attractive torque acting in case the arcuate magnet piece 1$a$ is arranged by shifting by 0.5 degrees in the clockwise direction as shown in FIG. 2A was −39.3 mNm which is 41% of the attractive torque acting to the conventional arcuate magnet piece 10$a$.

Similarly, the attractive torque acting in case the arcuate magnet piece 1$b$ is arranged by shifting by 0.5 degrees in the counter clockwise direction as shown in FIG. 2B was +39.3 mNm which is 41% of the attractive torque acting to the conventional arcuate magnet piece 10$a$.

Similarly, when the first predetermined angle $\theta 1$ is 45 degrees as shown in FIG. 1C, the repulsive torque acting in case the arcuate magnet piece 1$a$ is arranged by shifting by 0.5 degrees in the clockwise direction as shown in FIG. 2A was +5.3 mNm.

Similarly, the repulsive torque acting in case the arcuate magnet piece 1$b$ is arranged by shifting by 0.5 degrees in the counter clockwise direction as shown in FIG. 2B was −5.3 mNm.

Similarly, when the first predetermined angle $\theta 1$ is 47 degrees or less, the repulsive force was confirmed to be acting.

As discussed in the above, in any of the first to fifteenth embodiment, if the predetermined angle which forms the acute angle with the outer circumference surface 2 is 60 degrees or less, the attractive torque is acting to the arcuate magnet piece 1 is weakened to 50% compared to the attractive torque acting to the conventional arcuate magnet piece 10, hence the load during the assembling can be made small. Further, if the predetermined angle is 45 degrees or less, the repulsive torque acts on the arcuate magnet piece 1, and the self-aligning position can be done.

Also, FIG. 8A shows the representative example of a graph comparing the magnetic flux density distribution (the vertical axis) of the radial direction component near the connecting side surface of the second to fifteenth embodiment, between the conventional example and the predetermined angle $\theta$ of 60 degrees (the curve $\alpha 2$), 45 degrees (the curve $\alpha 3$), 30 degrees (the curve $\alpha 4$). In all of the embodiments, the radial direction component of the magnetic flux near the connecting side surface changes more gradually than the conventional example (the curve $\alpha 1$), hence the reduction of the cogging torque and the torque ripple can be expected.

Note that, in the FIG. 8A, as the angle $\Delta\theta$ of the horizontal axis, the point where the magnetic flux density of the radial direction is 0 at the inner circumference side the connecting side surface is set as $\theta 0$, then from the point the angle shifting in the counter clockwise direction is defined as $\Delta\theta$ of the positive direction, and the angle shifting in the clockwise direction is defined as $\Delta\theta$ of the negative direction. In general, the magnetic flux density of the radial direction component is 0 at the middle point of inner circumference side between the connecting side surface 6 and 7.

Figure 7:
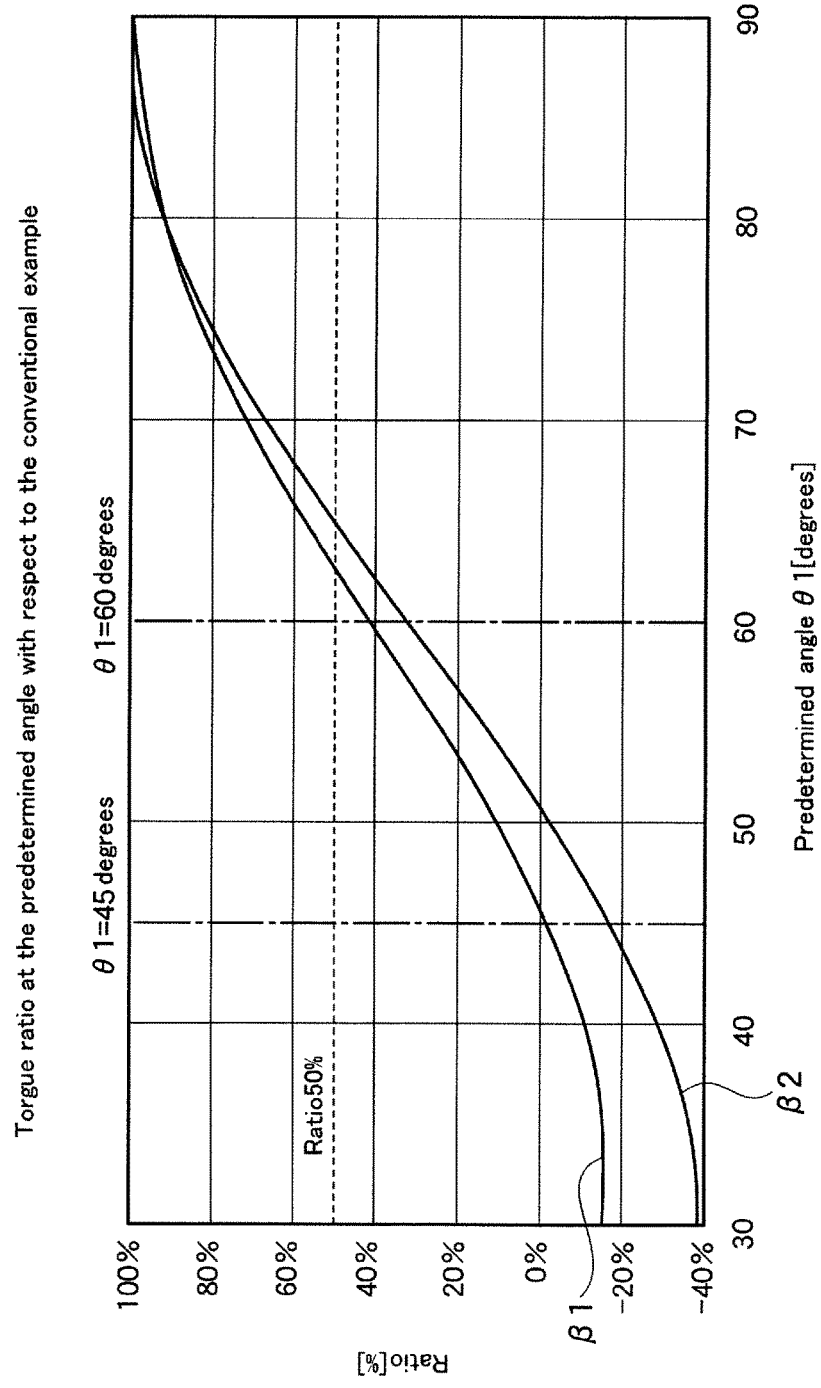
FIG. 7 is the graph showing the change of the torque in case of changing the predetermined angle of the acute angle of the example of the present invention, when the torque according to the conventional examples is 100%.

FIG. 7 is the graph showing the change in the torque in case the predetermined angle $\theta 1$ of the acute angle according to the example of the present invention when the torque according to the conventional example is 100%. In all of the above mentioned first to fifteenth embodiments, the torque changed within the range of the curve $\beta 1$ to $\beta 2$ shown in FIG. 7. That is, in each of the first to fifteenth embodiments, if the predetermined angle $\theta 1$ is 60 degrees or less, the attractive torque which is acting to enlarge the shifting will be 50% or less of the conventional example; and if the predetermined angle $\theta 1$ is 45 degrees or less, the repulsive torque which acts to correct the shifting is generated, which is on the contrary to the conventional example.

Sixteenth Embodiment

The arcuate magnet piece according to the sixteenth embodiment of the present invention has the same constitution and the effect as the first to fifteenth embodiment, except that the positioning projection parts or depression parts are formed (not shown in the figure) to at least one of the end surfaces 4 and 5 of the axial O direction shown in FIG. 1A. Hereinafter, the parts which differ from the first to fifteenth embodiment will be described, however the common parts will be omitted from explaining.

In the present embodiment, on at least one of the end surfaces 4 or 5 in the axial O direction of the arcuate magnet piece 1 shown in FIG. 1A, the positioning projection parts are formed by projecting out to the axial O direction from the end surfaces 4 or 5. Alternatively, on at least one of the end surfaces 4 or 5 in the axial O direction of the arcuate magnet piece 1 shown in FIG. 1A, the positioning depression parts are formed by depressed into the axial O direction from the end surfaces 4 or 5.

In these cases, the positioning projection parts or depression parts can be used to determine the position when the arcuate magnet piece 1 is adhered to the yoke. Hence, the mounting accuracy can be further improved.

Further, the gate for CIM molding and MIM molding may be positioned at the top surface of the positioning projection parts or the bottom surface of the positioning depression parts which are positioned approximately at the center parts of the circumference direction of the end surfaces 4 or 5. The side surface of the positioning projection part is mainly the surface for the positioning and the top surface of the projection parts is not used as the positioning surface hence there is no problem even if the trace of the gate is left on this top surface. Also, the side surface of the positioning depression part is mainly the positioning surface, and the bottom surface of the depression part is not used as the positioning surface, hence there is no problem even if the trace of the gate is left on this bottom surface.

Further, by positioning the gate for CIM molding or MIM molding at the top surface of the positioning projection part or at the bottom surface of the positioning depression part, the flow of the ferrite particle or the metal particle in the mold is improved, hence the particle can be filled uniformly and the degree of orientation is further improved.

Seventeenth Embodiment

Figure 9A:
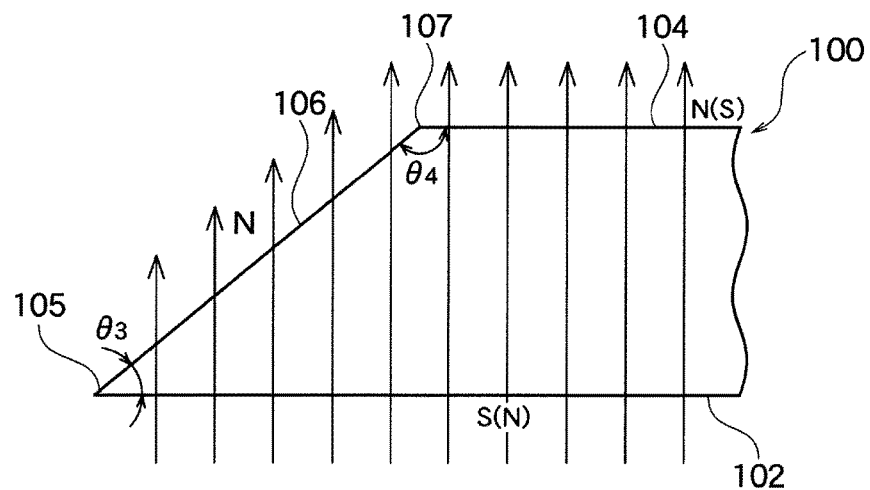
FIG. 9A is the schematic view of the permanent magnet piece according to other embodiment of the present invention.

The seventeenth embodiment of the present invention has the constitution and the effect the same as the first to sixteenth embodiment except that the permanent magnet piece 100 is not an arcuate shape but a simple flat board shape which is different from the first to sixteenth embodiment as shown in FIG. 9A. Hereinafter, the parts differ from the first to sixteenth embodiment will be described, but the common parts will be omitted from explaining.

The permanent magnet piece 100 of the seventeenth embodiment of the present invention comprises the first surface 102, the second surface 104 opposing in parallel manner with said first surface 102, and the inclined surface 106 which is formed to connect the first surface 102 and the second surface 104 while intersecting with the first surface 102 at the predetermined angle θ3 of the acute angle and intersecting with the second surface 104 at the predetermined angle θ4 of the obtuse angle. Note that, in the present embodiment, the first and the second is a relative concept, and in general, either one of the surface will be the mounting surface which is mounted on certain members, and either one surface is the functional surface which carries out certain magnetic action; however it is not particularly limited, and both may be functional surface or both may be mounting surface.

The sum of the predetermined angle θ4 of the obtuse angle and the predetermined angle θ3 of the acute angle are approximately 180 degrees. In the present embodiment, the corner part 107 having the obtuse angle where the predetermined angle θ4 of the obtuse angle of the permanent magnet piece 100 is formed is assembled with the corner part 105 of the predetermined angle θ3 of the acute angle of other permanent magnet piece which is not shown in the figure. Also, the corner part 105 having the acute angle where the predetermined angle θ3 of the acute angle of the permanent magnet piece 100 is formed is assembled with the corner part 107 of the predetermined angle θ4 of the obtuse angle of other permanent magnet piece which is not shown in the figure. Note that, in the below description, the inclined surface 106 at the corner part 105 of the acute angle may be referred as the connecting side surface.

In the present embodiment, the permanent magnet piece 100 has the coercivity of $H_{CJ}=1671000$[A/m], and the residual magnetic flux density $B_r=1.36$ [T], hence satisfies $H_{CJ} \geq 1.3 \times B_r/\mu_0$ (not that, $\mu_0$ is a magnetic permeability in vacuo, the coercivity $H_{CJ}$ and a residual magnetic flux density $B_r$ are the values at 20° C.).

Also, the corner part 105 of the acute angle comprises, if needed, the chamfered surface or the curved surface. Also, the corner part 107 of the obtuse angle may comprise if needed, the chamfered surface or the curved surface.

If the corner part 105 of the acute angle has the curved surface or the chamfered surface, for example when adhering the first surface 102 to the member not shown in the figure using the adhesive, the adhesive oozes and rises towards the corner part having the curved surface or chamfered surface, thereby the movement of the permanent magnet piece 100 towards the corner part direction is limited, and functions to suppress the position shifting. Similarly, when corner part 107 comprises the curved surface or the chamfered surface, in case the second surface 104 is adhered to the member not shown in the figure using the adhesive, the adhesive oozes and rises towards the corner part having the curved surface or chamfered surface, thereby the movement of the permanent magnet piece 100 towards the corner part direction is limited, and functions to suppress the position shifting. Further, since the corner part 105 of the permanent magnet 100 forms the acute angle, the chipping during the assembling can be prevented, and the production yield can be improved, thus the cost performance and the productivity can be improved.

In the present embodiment, the permanent magnet 100 is magnetized to have the magnetization of approximately perpendicular to the first surface 102 and the second surface 104. The magnetic pole of the main part of the inclined surface 106 and the magnetic pole of the second surface 104 are the same, and magnetic pole of the main part of the inclined surface 106 and the magnetic pole of the first surface 102 are opposite. The predetermined angle θ3 of the corner part 105 having the acute angle is preferably 60 degrees or less, and more preferably 30 to 50 degrees. The predetermined angle θ4 of the corner part 107 having the obtuse angle is preferably 120 degrees or more and more preferably 130 to 150 degrees.

For the permanent magnet piece 100 according to the present embodiment, the inclined surface 106 can be used as the connecting side surface. The magnetic pole of the main part of the inclined surface 106 is the same as the magnetic pole of the second surface 104, thus by using two or more of the permanent magnet pieces 100, in case the inclined surfaces 106 are assembled by opposing against each other, the following described effects can be anticipated.

That is, in the present embodiment, as shown in the below described embodiments as well, because relatively large surface area of the single magnetic pole surface is formed, substantially continuous surface may be formed by arranging the arbitrary two permanent magnet piece which is to be connected, wherein the first surface 102 of one of the permanent magnet piece 100 and the second surface 104 of other permanent magnet piece 100 forms said substantially continuous surface. In such case, when the first surface 102 of one of the permanent magnet piece 100 and the second surface 104 of other permanent magnet piece 100 are magnetized to have the same magnetic pole, the main part of the inclined surface 106 of the both have opposite polarity, and the attractive force is generated therebetween. Therefore, by combining plurality of permanent magnet piece 100, the permanent magnet assembly having relatively large area with single magnetic pole surface can be formed easily. That is, the cost performance and the productivity when assembling the permanent magnet assembly having relatively large area with single magnetic pole surface can be improved.

Note that as the conventional arts, it has been considered of adhering the plurality of the permanent magnets in advance, then magnetizing after assembling the permanent magnet assembly having relatively large area. However, in such case, a large scale magnetizer will be necessary. On the contrary to this, in the permanent magnet piece according to the present embodiment, the permanent magnet piece 100 which is already magnetized is assembled and the permanent magnet assembly as a whole can be formed, thus there is no need for the large scale magnetizer.

In order to show the specific effect when magnetizing the permanent magnet piece 100 according to the present embodiment, the permeance modulus Pc of the tip of the corner part 105 having the acute angle which is expected exhibit the smallest permeance coefficient when magnetizing the single permanent magnet piece 100 as shown in FIG. 9A was calculated. The results are shown in Table 1.

TABLE 1

| Predetermined angle θ 3 [degrees] | 90 | 80 | 70 | 60 | 50 | 45 | 40 | 30 | 20 |
|---|---|---|---|---|---|---|---|---|---|
| Minimuj permeance coefficient Pc | 0.569 | 0.316 | 0.190 | 0.159 | −0.112 | −0.147 | −0.167 | −0.190 | −0.170 |

According to Table 1, as θ3 decrease from 90 degrees, the minimum permeance coefficient Pc of the tip of the corner part 105 having the acute angle also decreases. When θ3=30 degrees, it shows the smallest value of −0.190.

Figure 9B:
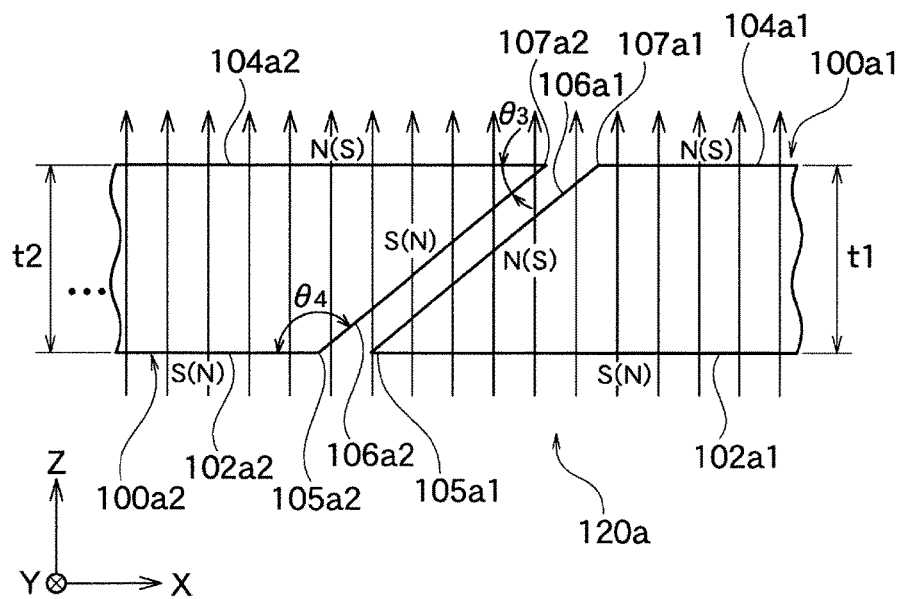
FIG. 9B is the schematic view showing the permanent magnet assembly according to the embodiment of the present invention.
Figure 9C:
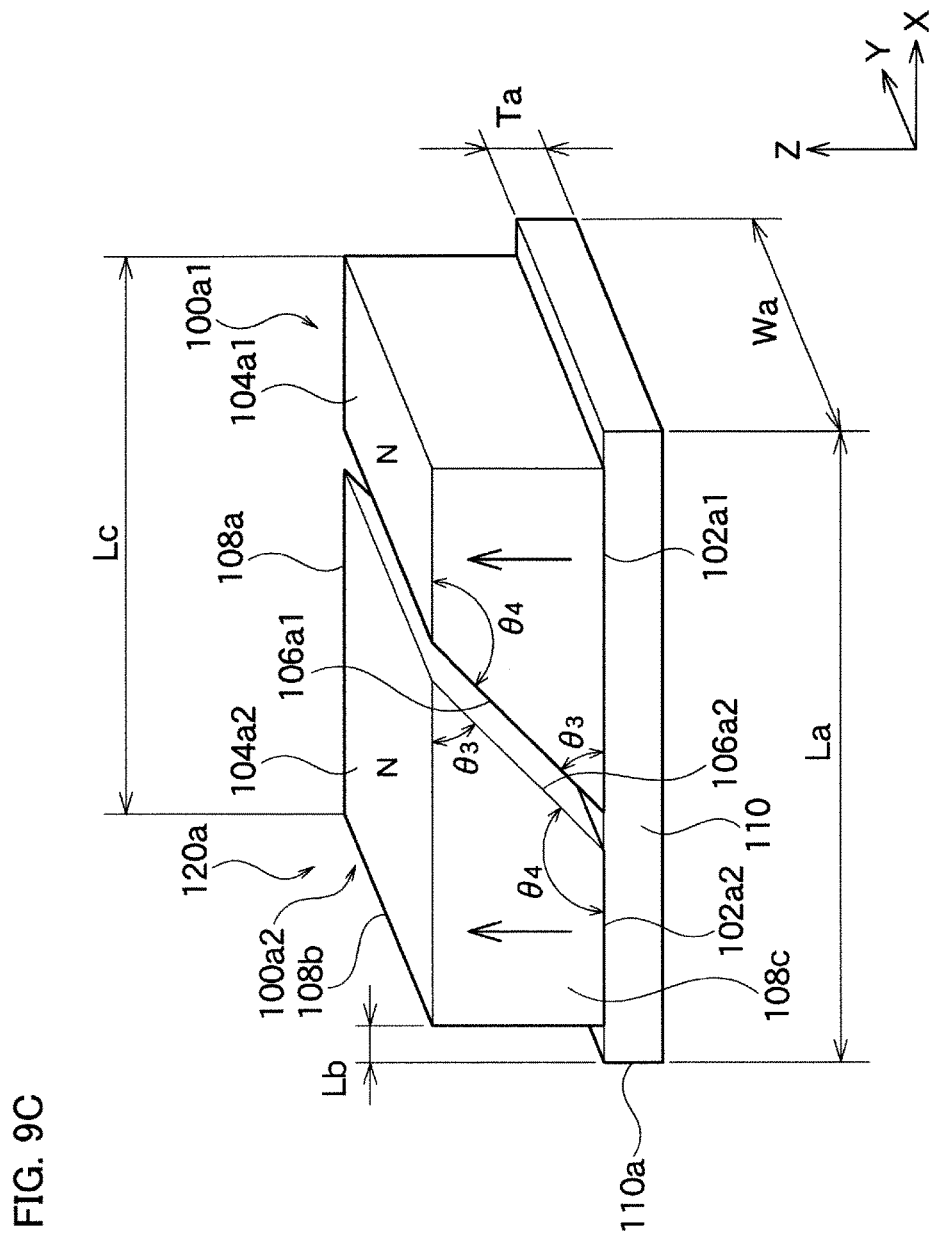
FIG. 9C is the perspective view showing the state wherein the permanent magnet assembly shown in FIG. 9B is mounted on the magnetic material.
Figure 9D:
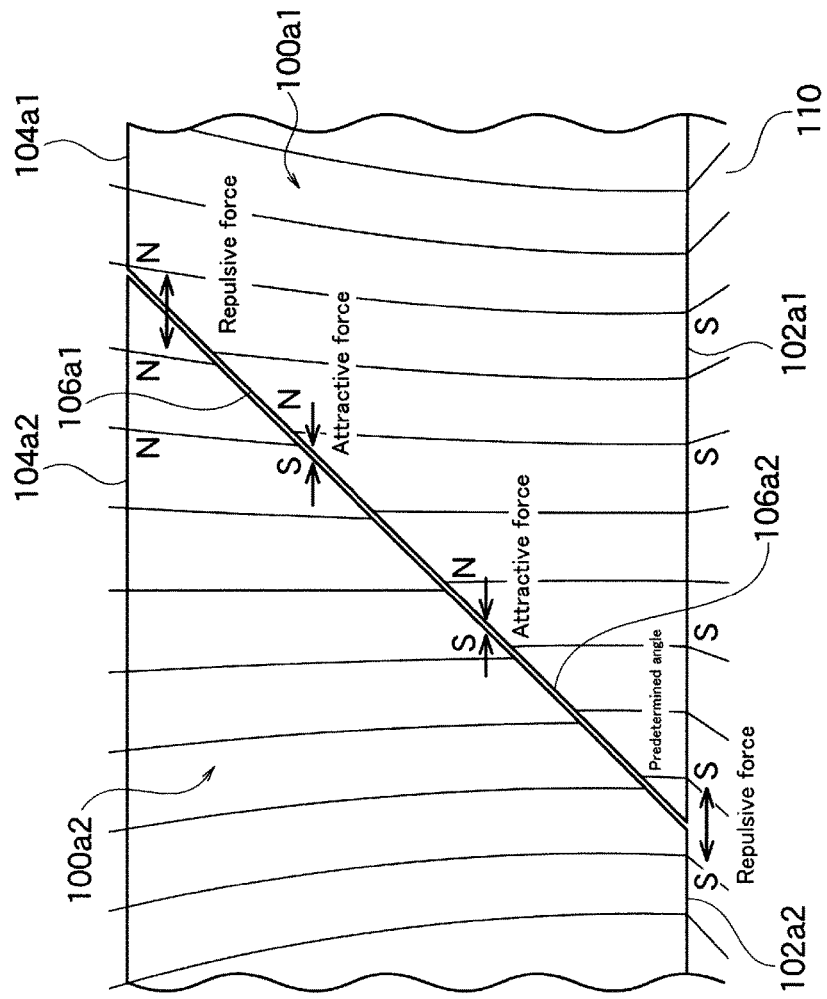
FIG. 9D is the partial schematic view showing the magnetic force of the permanent magnet assembly shown in FIG. 9B.
Figure 9E:
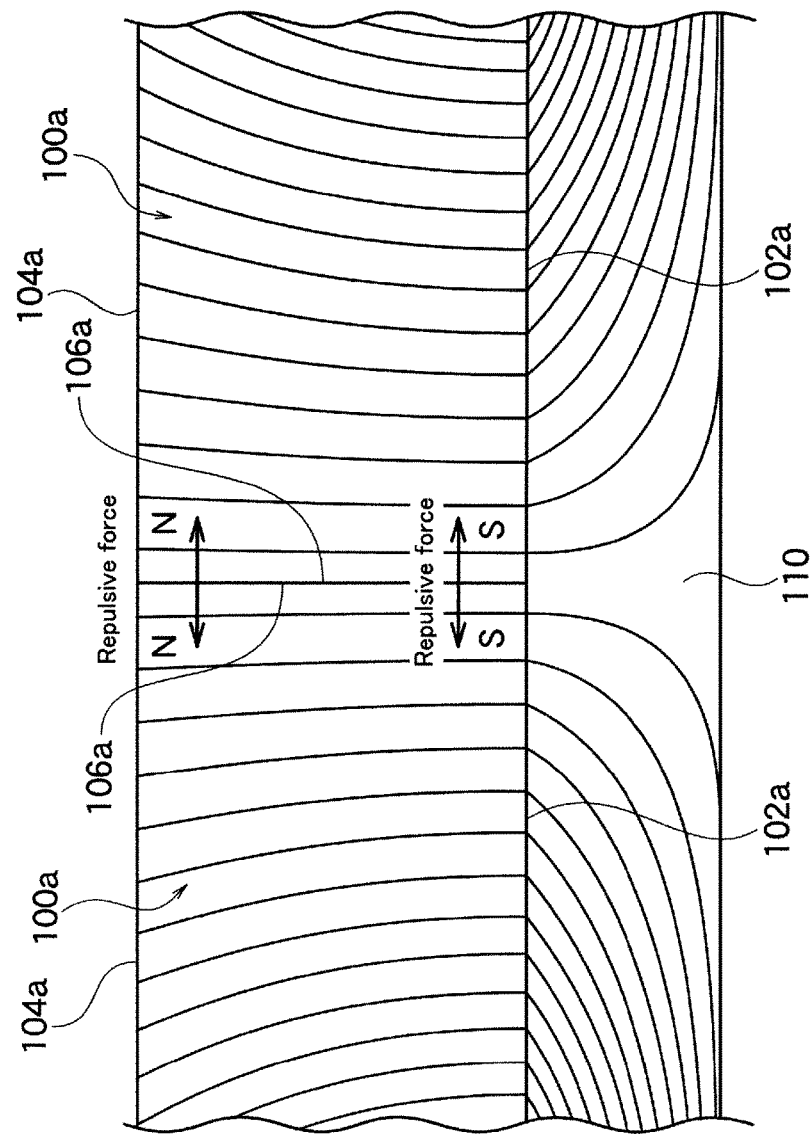
FIG. 9E is the partial schematic view showing the magnetic force of the permanent magnet assembly of the conventional examples.
Figure 9F:
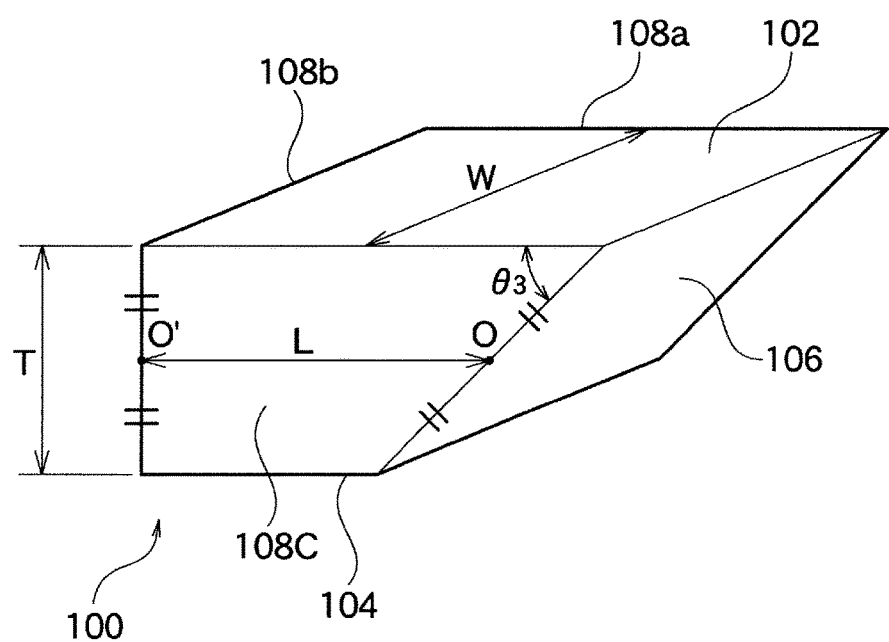
FIG. 9F is the perspective view showing the details of the permanent magnet piece constituting each of the permanent magnet assembly shown in FIG. 9B and FIG. 9C.
Figure 9G:
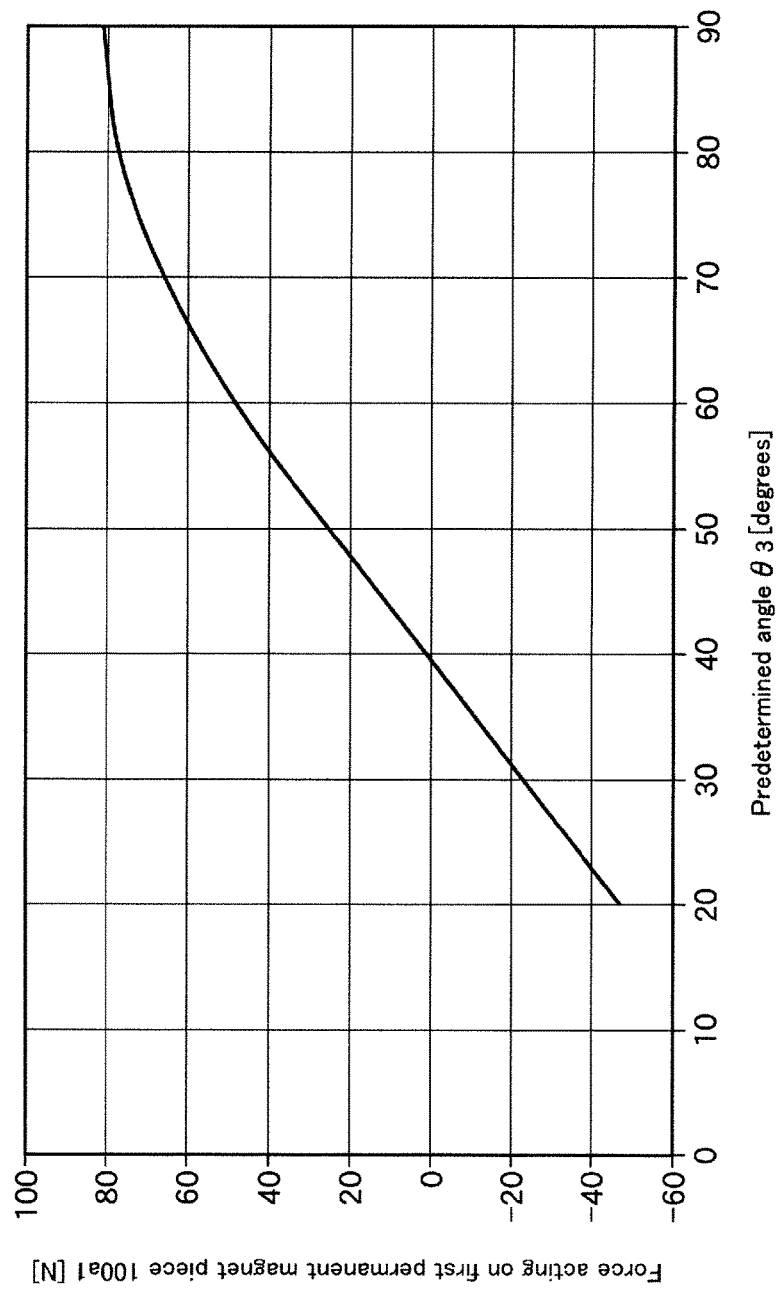
FIG. 9G is the graph showing the relation between the predetermined angle θ3 of the inclined surface which is the connecting surface and the force acting on one of the magnet, in the permanent magnet assembly according to the embodiment of the present invention.
Figure 9H:
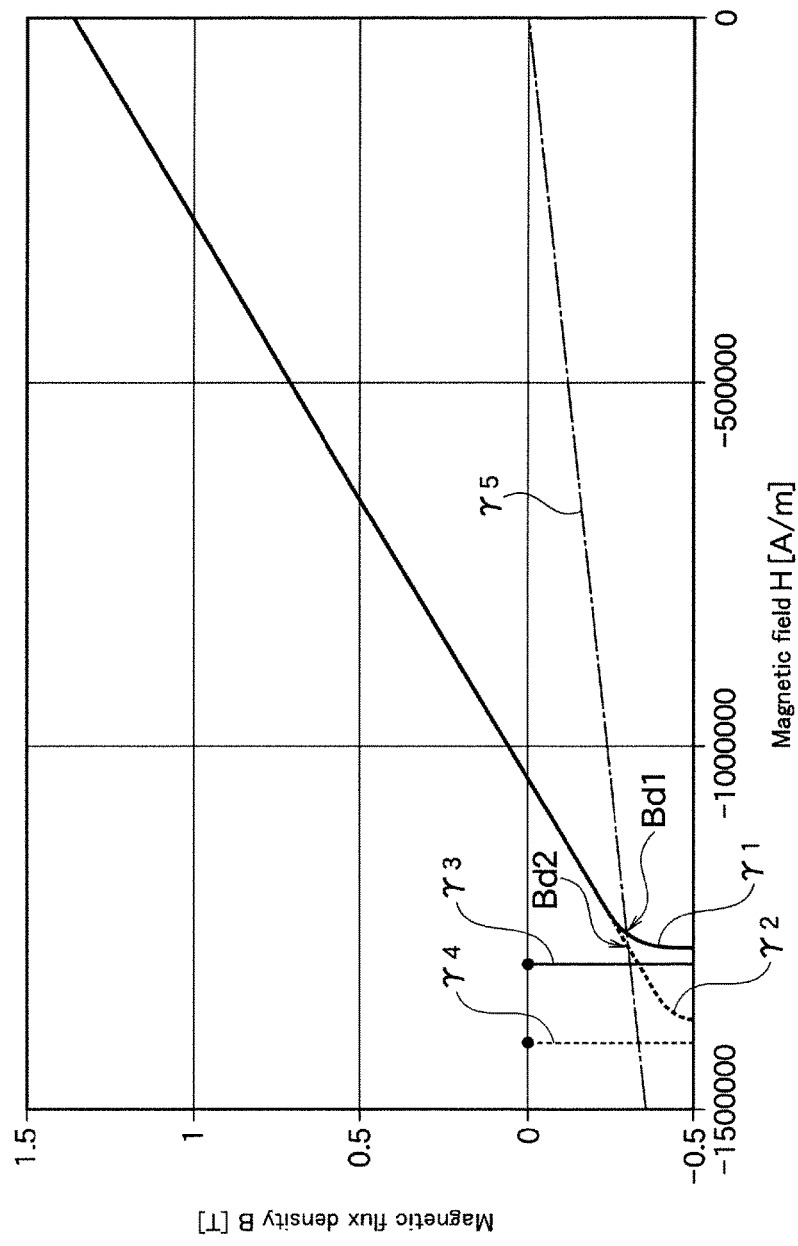
FIG. 9H is the graph showing the BH characteristic curve of the permanent magnet piece according to the embodiment of the present invention.

FIG. 9H shows the BH characteristic curve of the permanent magnet. In FIG. 9H, the curve γ1 is the BH characteristic curve when $H_{CJ}=1.2 \times B_r/\mu_0$, the curve γ2 is the BH characteristic curve when $H_{CJ}=1.3 \times B_r/\mu_0$, the straight line γ3 is the BH characteristic curve when $H_{CJ}=1.2 \times B_r/\mu_0$, the straight line γ4 is the BH characteristic curve when $H_{CJ}=1.3 \times B_r/\mu_0$, the straight line γ5 shows Pc=−0.190, Bd1 is the operation point at the minimum permeance coefficient Pc when $H_{CJ}=1.2 \times B_r/\mu_0$, and Bd2 is the operation point at the minimum permeance coefficient Pc when $H_{CJ}=1.3 \times B_r/\mu_0$.

According to FIG. 9H, when $H_{CJ}=1.2 \times Br/\mu_0$, if Pc=−0.190, the operation point Bd1 of the permanent magnet reaches near the knee point thus there is a risk of demagnetization. When $H_{CJ}=1.3 \times Br/\mu_0$, the operation point Bd2 of the permanent magnet does not exceed the knee point, thus the demagnetization does not occur. Therefore, when the coercivity of the permanent magnet piece 100 is $H_{CJ}$, and when the residual magnetic flux density of said permanent magnet piece is $B_r$, $H_{CJ} \geq 1.3 \times B_r/\mu_0$ (not that, $\mu_0$ is a magnetic permeability in vacuo, the coercivity $H_{CJ}$ and a residual magnetic flux density $B_r$ are the values at 20° C.) is preferably satisfied.

Therefore, when the coercivity $H_{CJ}$ of the permanent magnet piece 100 at 20° C. satisfy $H_{CJ} \geq 1.3 \times B_r/\mu_0$, there is no need to prepare for special environment for the magnetization, and also even if the handling of the permanent magnet 100 of after the magnetization is done under the usual environment, there is no risk of the demagnetization of the permanent magnet piece 100, thus the cost performance and the productivity can be improved.

Eighteenth Embodiment

The eighteenth embodiment of the present invention is the modified example of the seventeenth embodiment, and it has the same constitution and the effects as the seventeenth embodiment except for the points described in below. Hereinafter, the parts differs from the seventeenth embodiment will be explained, and the common parts will be omitted from explaining.

As shown in FIG. 9B, the permanent magnet assembly 120a according to the present embodiment at least comprises the first magnet piece 100a1 and the second magnet piece 100a2. The first permanent magnet piece 100a1 comprises the first mounting face 102a1, the first functional surface 104a1 opposing said first mounting surface 102a1 in parallel manner, the first inclined surface 106a1 which is formed to connect the first mounting surface 102a1 and the first functional surface 104a1 while intersecting with the first functional surface 104a1 at the predetermined angle θ4 of the obtuse angle. Note that, in the present embodiment, the first and the second are a relative concept, and in general, either one of the surface will be the mounting surface which is mounted on certain members, and either one surface is the functional surface (magnetic pole surface) which carries out certain magnetic action; however it is not particularly limited, and both may be functional surface or both may be mounting surface.

The first permanent magnet piece 100a1 is magnetized so that it is magnetized approximately perpendicular to the first mounting surface 102a1 and the first functional surface 104a1. Also, the magnetic pole of the main part of the first inclined surface 106a1 has the same magnetic pole as the first functional surface 104a1.

The second permanent magnet piece 100a2 comprises the second mounting face 102a2, the second functional surface 104a2 opposing the second mounting surface 102a2 in parallel manner, the second inclined surface 106a2 which is formed to connect the second mounting surface 102a2 and the second functional surface 104a2 while intersecting with the second mounting surface 102a2 at the predetermined angle θ4 of the obtuse angle.

The second permanent magnet piece 100a2 is magnetized to have the magnetization of approximately perpendicular to the second functional surface 104a and the second mounting surface 102a2. Also, the magnetic pole of the main part of the second inclined surface 106a2 is same as the magnetic pole of the second mounting surface 102a2.

In the permanent magnet assembly 120a according to the present embodiment, the corner part 107a1 of the obtuse angle of the first permanent magnet piece 100a1 is connected with the corner part 107a2 of the acute angle of the second permanent magnet piece 100a2. Also, the corner part 105a1 of the acute angle of the permanent magnet piece 100a1 is connected with the corner part 105a2 of the obtuse angle of the second permanent magnet piece 100a2. Here, the first mounting surface 102a1 of the first permanent magnet piece 100a1 and the second mounting surface 102a2 of the second permanent magnet piece 100a2 are magnetized to S pole.

In this case, the mounting surface 102a1 is S pole hence the first functional surface 104a1 of the first permanent magnet piece 100a1 is N pole, and the magnetic pole of the main part of the first inclined surface 106a1 is also N pole. On the other hand, the second mounting surface 102a2 of the second permanent magnet piece 100a2 is S pole, and the magnetic pole of the main part of the second inclined surface 106a2 is S pole as well. As a result, two inclined surfaces will have different magnetic poles, thus the attractive force is generated between the first inclined surface 106a1 and the second inclined surface 106a2. Therefore, by combining pluralities of permanent magnet pieces, the permanent magnet assembly having relatively large area with single magnetic pole surface can be formed easily.

That is, the cost performance and the productivity when assembling the permanent magnet assembly having relatively large area with single magnetic pole surface can be improved. As such, by connecting two permanent magnet pieces 100a1 and 100a2 in the left and right direction of the figure, that is in the X axis direction of the figure, the single magnetic pole surface having relatively large area can be formed at least in the X axis direction.

Note that, in the figure, X axis, Y axis, and Z axis are perpendicular to each other, and Z axis corresponds to the thickness direction. In the present embodiment, the case of connecting the permanent magnet piece in the X axis direction has been described, however the permanent magnet piece may be connected in Y axis direction, and also it may be connected in both X axis and Y axis directions. Also, depending on the shape, the direction of connecting the permanent magnet piece may be circumference direction.

In order to specifically show the effect of assembling the first permanent magnet piece 100a1 and the second permanent magnet piece 100a2 according to the present embodiment, the force acting on the first permanent magnet piece 100a1 when the second permanent magnet piece 100a2 is arranged on the magnetic yoke 110 as shown in FIG. 9C was simulated.

The first permanent magnet piece 100a1 and the second permanent magnet piece 100a2 are formed by the molding method for the sintered magnet which is usually employed; and the magnetization is arranged approximately perpendicular with respect to the first mounting surface 102a1, the second mounting surface 102a2, the first functional surface 104a1 and the second functional surface 104a2. These magnet pieces 100a1 and 100a2 are constituted by the anisotropic rare earth sintered magnets which are magnetized respectively. In the present embodiment, the second mounting surface 102a2 of the second permanent magnet piece 100a2 is adhered using the adhesive on the magnetic yoke 110 as the substrate made of the magnetic material such as carbon steel for machine structure use (for example S45C).

In the present embodiment, the first permanent magnet piece 100a1 and the second permanent magnet piece 100a2 are respectively formed by the same permanent magnet piece 100; and this permanent magnet piece 100 comprises, as shown in FIG. 9F, the end surfaces 108a, 108b, 108c formed to connect the first surface 102 and the second surface 104 while intersecting with the first surface 102 and the second surface 104 perpendicularly. The first surface 102 of the permanent magnet 100 shown in FIG. 9H corresponds the first mounting surface 102a1 of the first permanent piece 100a1 or corresponds to the second functional surface 104a2 of the second permanent magnet piece 100a2 shown in FIG. 9C. Also, the second surface 104 of the permanent magnet piece 100 shown in FIG. 9F corresponds to the first functional surface 104a1 of the first permanent magnet piece 100a1 shown in FIG. 9C or corresponds to the second mounting surface 102a2 of the second permanent magnet piece 100a2.

In the permanent magnet piece 100 shown in FIG. 9F (the first permanent magnet piece 100a1 and the second permanent magnet piece 100a2), the length L is 20 mm, and the width W is 20 mm; and the second surface opposes the first surface 102 while being parallel thereto having the thickness T of 10 mm. Here, the length L is the length between the middle point O in the thickness direction on the inclined surface 106 and the middle point O' in the thickness direction of the end surface 108b formed by opposing to the inclines surface 106.

The inclined surface 106 of the permanent magnet piece 100 of the present embodiment can be formed by polishing the first surface 102 at the predetermined angle θ3 of the acute angle, and polishing the second surface 104 at the predetermined angle θ4 of the obtuse angle. Similarly, the end surfaces 108a, 108b, 108c are polished to form perpendicular angle with respect to the first surface 102 and the second surface 104. Also, as shown in FIG. 9C, the magnetic yoke 110 is formed by a mechanical processing so that the length La to the length L direction (X axis direction) of the permanent magnet assembly 120a is 100 mm, the width Wa to the width W direction (Y axis direction) is 20 mm, and the thickness Ta is 10 mm.

Here, in the second permanent magnet piece 100a2, the end surface 108b is adhered at the position of Lb=30 mm which is to the right direction from the end surface 110a of the left side of the magnetic yoke 110. Also, the end faces 108a and 108c are adhered at the matching position in the width direction of the magnetic yoke 110.

Also, the second mounting surface 102a2 of the second permanent magnet piece 100a2 is magnetized to S pole, and the second functional surface 104a2 is magnetized to N pole.

As mentioned in the above, the force applied to the first permanent magnet piece 100a1 was simulated wherein the second permanent magnet piece 100a2 is moved so that the inclined surfaces 106a1 and 106a2 are spaced out by 0.1 mm to the right and left direction of the figure. Here, the first functional surface 104a1 of the first permanent magnet piece 100a1 is magnetized to N pole and the first mounting surface 102a1 is magnetized to S pole. That is, the first functional surface 104a1 of the first permanent magnet piece 100a1 and the second functional surface 104a2 of the second permanent magnet piece 100a2 which are magnetized to have same N pole are assembled to form the length Lc=40 mm, thereby the permanent magnet assembly 120a having a single magnetic pole surface is assembled.

Further, the main parts of the first inclined surface 106a1 and the second inclined surface 106a2 have opposite polarity, thus the attractive force is generated therebetween. The force which is applied to the first permanent magnet piece 100a2 by changing the predetermined angle θ3 of the acute angle is shown in the graph of FIG. 9H. Note that, the predetermined angle θ4 of the obtuse angle satisfies the relation of θ4=180-θ3. Also, when θ4=θ3=90 degrees, this corresponds to the conventional example.

According to FIG. 9G, as θ3 decreases from 90 degrees, the force applied to the second permanent magnet piece 100a2 from the first permanent magnet piece 100a1 gradually decreases (the force towards the right direction in FIG. 9C, that is the repulsive force). This shows that along with the attractive force being generated, the repulsive force is decreasing between the main parts of the first inclined surface 106a1 and the second inclined surface 106a2.

Figure 9I:
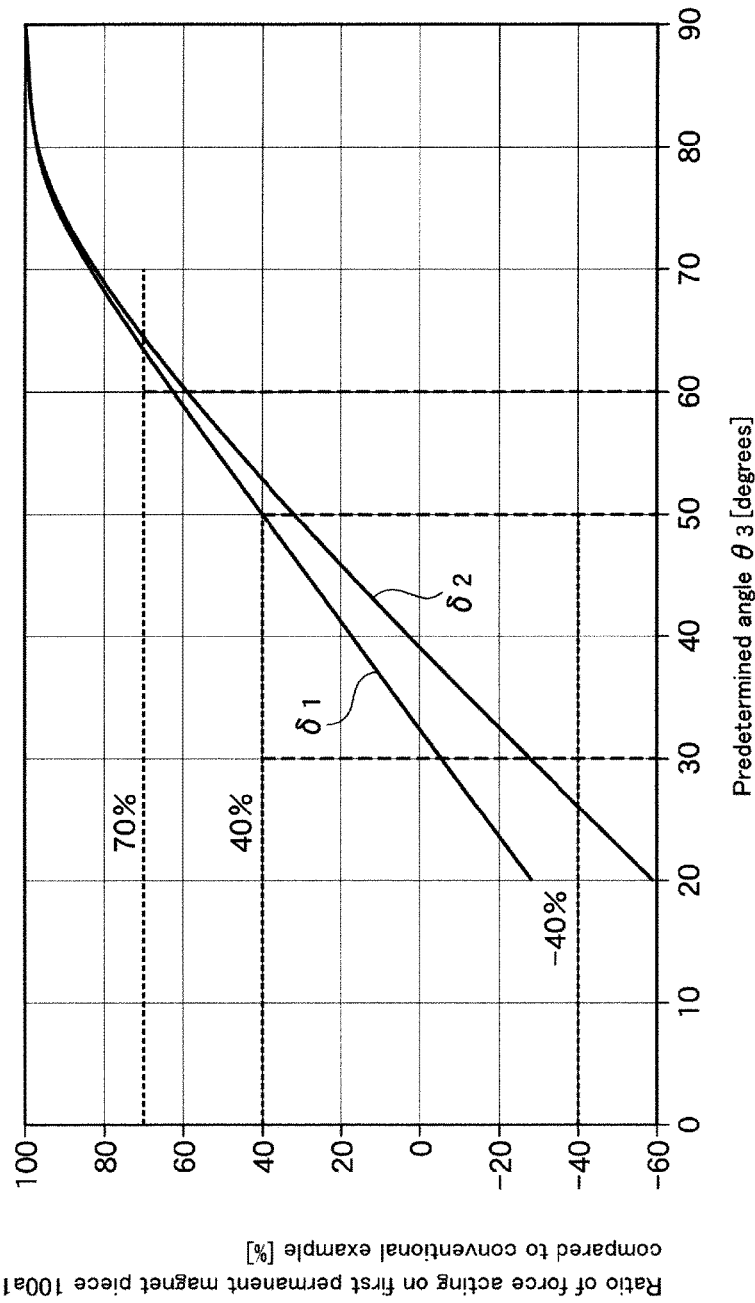
FIG. 9I is the graph wherein the relation between the predetermined angle θ3 of the inclined surface which is the connecting surface and the force acting on one of the magnet, in the permanent magnet assembly according to the embodiment of the present invention is converted to the comparison with the conventional examples.

As θ3 decreases to 60 degrees or less, the attractive force acting between the first inclined surface 106a1 and the second inclined surface 106a2 becomes even larger, hence for the second permanent magnet piece 100a2, along with the force to the left direction of FIG. 9C, that is the attractive force, the repulsive force is further decreased. Therefore, as shown in FIG. 9I, when θ3 is 60 degrees or less, the repulsive force can be suppressed to 70% or less of the conventional example. As a result, when the second permanent magnet piece 100a2 is adhered to the magnetic yoke 110, the repulsive force between the adjacent first permanent magnet piece 100a which is assembled together therewith can be significantly reduced compared to the conventional example. Hence, the cost performance and the productivity can be improved.

Note that, FIG. 9I shows that same results can be obtained even if the size and the material of the permanent magnet are changed since the results will be within the range between the curves δ1 and δ2. As one example, the permanent magnet piece 100 is formed to have the length L of 10 mm, the width W of 10 mm, and the thickness T of 5 mm, the permanent magnet assembly 120a comprising the magnetic yoke 110 which has sufficiently larger length and width with respect to said permanent magnet 100 may be mentioned. As other example, the permanent magnet piece 100 is formed to have the length L of 100 mm, the width W of 100 mm, and the thickness T of 50 mm; and the permanent magnet assembly 120a comprising the magnetic yoke 110 which has sufficiently larger length and width with respect to said permanent magnet 100 may be mentioned.

As further other example, the permanent magnet piece 100a1 is formed to have the length L1 of 20 mm, the width W1 of 20 mm and the thickness T1=10 mm, the permanent magnet piece 100a2 is formed to have the length L1 of 50 mm, the width W2 of 20 mm, and the thickness T2=10 mm; and the permanent magnet assembly 120a comprising the magnetic yoke 110 which has sufficiently larger length and width with respect to said permanent magnet pieces 100a1 and 100a2 may be mentioned.

As other example, the anisotropic sintered ferrite magnet is used as the material of the permanent magnet piece 100, and said permanent magnet piece is formed to have the length L 20 mm, the width W of 20 mm, and the thickness T of 10 mm; and the permanent magnet assembly 120a comprising the magnetic yoke 110 which has sufficiently larger length and width with respect to said permanent magnet 100 may be mentioned.

In any of the examples, the ratio of the force acting on the first permanent magnet piece 100a1 with respect to the conventional examples falls within the rage of the curves δ1 and δ2. Therefore, even if the material and the size of the permanent magnet piece is changed and then adhering the two permanent magnet pieces 100 to the magnetic yoke 110; the repulsive force against the two permanent magnet pieces which is assembled with the adjacent ones is significantly lowered compared to the conventional examples. As a result, the cost performance and the productivity are improved. Therefore, the permanent magnet assembly 120a formed by assembling the plurality of permanent magnet pieces can be considered as one permanent magnet piece 100.

When θ3 is 40 degrees or less, the attractive force between the main parts of the first inclined surface 106a1 and the second inclined surface 106a2 increases, hence the force to the left direction in FIG. 9C that is the attractive force is acting on the first permanent magnet piece 100a1.

When θ3 is 30 degrees or less, the attractive force between the main parts of the first inclined surface 106a1 and the second inclined surface 106a2 further increases, hence the force to the left direction in FIG. 9C that is the attractive force is acting stronger on the first permanent magnet piece 100a1.

On the other hand, when θ3 is near 50 degrees, the repulsive force as same as the attractive force when θ3 is near 30 degrees is acting, and within this range the absolute value of the attractive force or the repulsive force is small.

As discussed in above, when θ3 is within the range of 30 degree to 50 degrees, the absolute value of the attractive force or the repulsive force can be suppressed to 40% or less of the conventional example. As a result, when the first permanent magnet piece 100a1 and the second permanent magnet 100a2 are adhered to the magnetic yoke 110, even if the adhesive strength of the two permanent magnet pieces 100a1 and 100a2 are deteriorated, because the attractive force or the repulsive force is suppressed, the shear strength applied to the adhesive can be suppressed to small level, thus the risk of opening the connecting parts is lowered.

Also, in the present embodiment, as the repulsive force applied to the first permanent magnet piece 100a1 when the predetermined angle θ3 is 60 degrees and the inclined surfaces 106a1 and 106a2 are spaced apart by 0.2 mm to the right and left direction of the figure, 48 [N] was obtained by simulation. On the other hand, the repulsive force of the conventional example wherein the predetermined angle θ3 is 90 degrees and the space is 0.2 mm, the simulation showed 79 [N], and when the space is changed to 3 mm, the simulation showed 52 [N].

According to the above, when the space is wider, the repulsive force applied to the first permanent magnet of the conventional examples wherein the predetermined angle θ3 is 90 degrees can be made small. However, as in the present embodiment, when the space is 0.2 mm, the repulsive force at the predetermined angle θ3 of 60 degrees can be made smaller than the repulsive force of the conventional examples when the space is 3 mm and the predetermined angle θ3 is 90 degrees. Thus, this indicates the significant effect of reducing the repulsive force compared to the conventional example. Further, the larger the space is, the more unstable the magnetic flux is in such parts, and also the total magnetic flux amount is reduced as well. Therefore, in order for the permanent magnet assembly having single magnetic pole surface and relatively large area to exhibits the magnetic characteristic, preferably the space is 0.2 mm or less.

FIG. 9D is the result of the simulation showing the distribution of the magnetic flux lines which is showing the attractive force is acting actually to the main parts of the first inclined surface 106a1 and the second inclines surface 106a2 when the magnetic pole of the first functional surface 104a1 and the second functional surface 104a2 are both N pole. As shown in the figure, between the first inclined surface 106a1 and the second inclined surface 106a2 of the adjacent permanent magnet piece 100a1 and the permanent magnet piece 100a2 having the space of 0.2 mm, the distribution state of the magnetic pole can be verified from the magnetic flux line, and it can be confirmed that the attractive force is generated between these magnetic poles. Therefore, by assembling plurality of the permanent magnet pieces 100a1 and 100a2, the magnet having single magnetic pole surface and relative large area can be assembled easily. That is, the cost performance and the productivity when assembling the magnet having single magnetic pole surface and relative large area can be improved.

Note that as shown in FIG. 9E, in the conventional permanent magnet piece 100a, the connecting side surface 106a1 was approximately parallel against the inner surface 102a and the outer surface 104a, thus when the magnetic pole surface having large area and same polarity was to be formed by plurality of magnet pieces 100a on the substrate 110, the strong repulsive force was generated between the magnetic poles of the connecting side surface 106a against each other which can be confirmed from the distribution state of the magnetic pole according to the magnetic flux line. Therefore, it was difficult to assemble the magnet having single magnetic pole surface and relative large area, by assembling the plurality of the permanent magnet pieces 100a.

Also, in the present embodiment, the sum of the predetermined angle θ4 of the obtuse angle and the predetermined angle θ3 of the acute angle is approximately 180 degrees. Also, as shown in FIG. 9B, the thickness t2 in Z axis direction of the second permanent magnet piece 100a2 is approximately the same as the thickness t1 in Z axis direction of the second permanent magnet piece 100a2. When such relation is satisfied, the first functional surface 104a1 of the first permanent magnet piece 100a1 and the second functional surface 104a2 of the second permanent magnet piece 100a2 are the continuous surface. Note that, even if the thickness t2 in the Z axis direction of the second permanent magnet piece 100a2 is different from the thickness t1 in Z axis direction of the first permanent magnet piece 100a1, by forming a step of Z axis direction between the first mounting surface 102a1 of the first permanent magnet piece 100a1 and the second mounting surface 102a2 of the second permanent magnet piece 100a2, the first functional surface 104a1 and the second functional surface 104a2 can be considered as the continuous surface.

In the present embodiment, the first functional surface 104a1 of the first permanent magnet piece 100a1 and the second functional surface 104a2 of the second permanent magnet piece 100a2 form the desired single magnetic pole surface having relative large area, and the first mounting surface 102a1 of the first permanent magnet piece 100a1 and the first mounting surface 102a2 of the second permanent magnet piece 100a2 form the adhering surface to the substrate 110 as shown in FIG. 9C. The substrate 110 functions as the yoke, and the magnetic flux density generated from the magnetic pole surfaces of the magnet pieces 100a1 and 100a2 are increased.

Note that, as long as the second mounting surface 102a2 of the second permanent magnet piece 100a2 shown in FIG. 9C is adhered to the substrate 110, the permanent magnet piece 100a1 does not necessarily have to be adhered to the substrate 110. When the attractive force is acting between the first inclined surface 106a1 and the second inclined surface 106a2, the first permanent magnet piece 100a1 is connected to the second permanent magnet piece 100a2, and the second inclined surface 106a2 is engaged with the first inclined surface 106a1. Then, the first permanent magnet piece 100a1 is applied with the force which acts to the direction pulling the first permanent magnet piece 100a1 between the second inclined surface 106a2 of the second permanent magnet piece 100a2 and the substrate, thus it is prevented from being released from the substrate 110.

Figure 10:
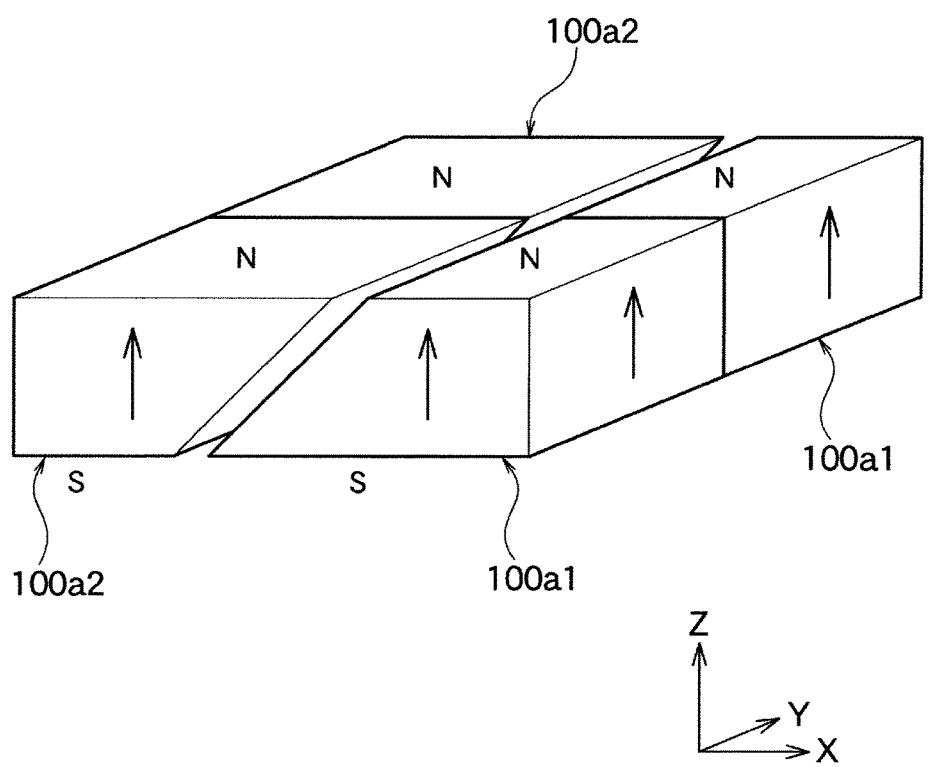
FIG. 10 is the schematic view showing the assembly of the permanent magnet pieces according to other embodiments of the present invention.

In the present embodiment, as shown in FIG. 10, the permanent magnet pieces 100a1 and 100a2 may be assembled in X axis direction and/or Y axis direction by assembling two pairs or more by placing adjacent to each other. The permanent magnet assembly constituted as such can be easily made large, hence the cost can be easily reduced, and the magnetic characteristics comprised by the magnet can be sufficiently exhibited and also it can be designed even more freely. Further, even if the adhesive strength between the assembled magnets is deteriorated, because the repulsive force is suppressed, there is only little risk of the connection portion widening, and the decline of the magnetic flux rarely occurs. Also, the large size magnet having highly accurate size can be produced easily in short period of time; furthermore because the space between the magnets can be made small, the unevenness of the magnetic flux caused by the space can be made small as possible.

In the present embodiment, the predetermined angle θ3 of the acute angle is preferably 60 degrees or less, and further preferably within the range of 30 to 50 degrees. Also, the predetermined angle θ4 of the obtuse angle is preferably 120 degrees or more, and more preferably within the range of 130 to 150 degrees. When the angle is within such range, the repulsive force between the permanent magnet pieces 100a1 and 100a2 which are assembled by placing adjacent to each other is significantly lowered compared to the conventional examples. As a result, the cost performance and the productivity can be improved.

Figure 11A:
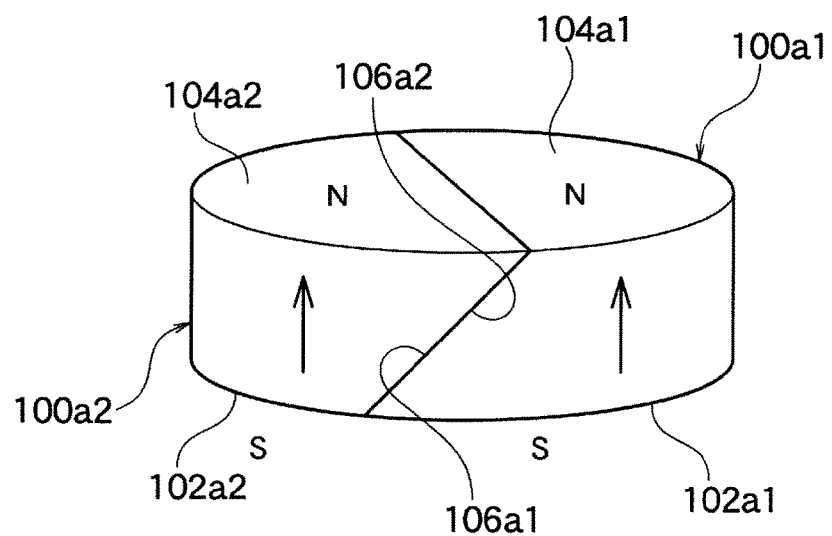
FIG. 11A is the schematic perspective view showing the assembly of the permanent magnet piece according to further other embodiment of the present invention.

In the present embodiment, the shape as a whole when the first magnet piece 100a1 and the second magnet piece 100a2 are assembled is not particularly limited, and for example it may be a square board shape, and it may be a circular plate shape as shown in FIG. 11A. Also, at least one of the first mounting surface 102a1, the second mounting surface 102a2, the first functional surface 104a1 and the second functional surface 104a2 may be a curved surface such as the cylindrical surface or so.

As one example of FIG. 11A, the material of the two permanent magnet pieces 100a1 and 100a2 are the anisotropic sintered magnets, wherein the assembled permanent magnet pieces 100a1 and 100a2 to have the diameter of 100 mm, and the thickness T=20 mm, and for the example of the permanent magnet assembly comprising the magnetic yoke, which is not shown in the figure, having sufficiently larger diameter and thickness than the permanent magnet pieces 100a1 and 100a2 may be mentioned. For the shape shown in FIG. 11A, the repulsive force between the two permanent magnet pieces which are assembled adjacent to each other is reduced significantly compared to the conventional examples, and the same results which fall in the range between the δ1 and δ2 of FIG. 9I.

Figure 11B:
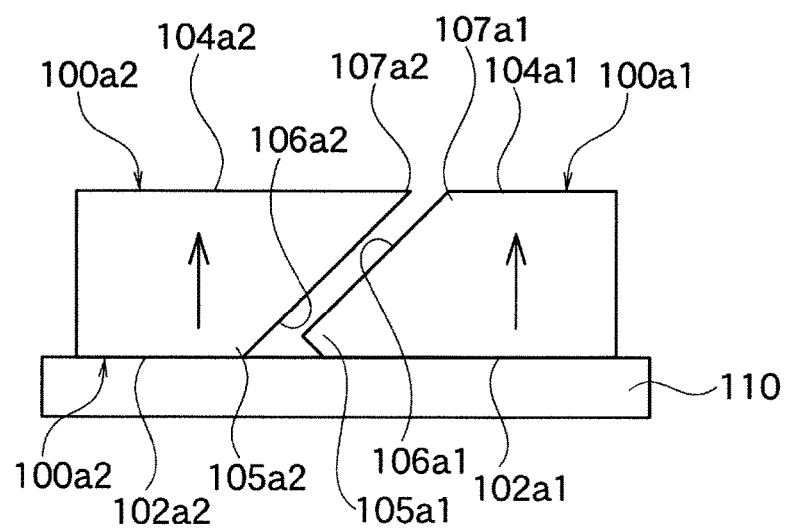
FIG. 11B is the schematic perspective view showing the assembly of the permanent magnet piece according to further other embodiment of the present invention.

Further in the present embodiment, as shown in FIG. 11B, the corner part 105a1 of the acute angle which is the tip surface intersecting with the first inclined surface 106a1 and the first mounting surface 102a1 comprises the curved surface or the chamfered surface. Alternatively, the corner part 107a2 of the acute angle which is the tip surface intersecting with the second inclined surface 106a2 and the second functional surface 107a2 comprises the curved surface and the chamfered surface.

As one example of FIG. 11B, the permanent magnet 100 having the anisotropic rare earth sintered magnet as the material, wherein the length L is 20 mm, the width W is 20 mm and the thickness T is 10 mm, and further the corner part 105a1 of the acute angle comprises the curved surface of R1 or the chamfered surface of C1; and the permanent magnet assembly comprising the magnetic yoke having sufficiently larger length and the width compared to the permanent magnet 100 may be mentioned. For the shape shown in FIG. 11B, the repulsive force between the two permanent magnet pieces which are assembled adjacent to each other is reduced significantly compared to the conventional examples, and the same results which fall in the range between the δ1 and δ2 of FIG. 9I are obtained.

Further, when the permanent magnet piece comprises the curved surface or the chamfered surface, for example when the first mounting surface 102a1 is adhered to the substrate 110 made of magnetic material using the adhesive, the adhesive will oozes and rises towards the corner part having the curved surface or chamfered surface, thereby the movement of the permanent magnet piece 100a1 to the corner direction is limited, and functions to suppress the position shifting. Further, when the corner parts 105a1 and 107a2 of the permanent magnet pieces 100a1 and 100a2 forms the acute angle, the chipping during the assembling can be prevented, and the production yield improves, thus the cost performance and the productivity can be improved.

Nineteenth Embodiment

The nineteenth embodiment is the modified example of the eighteenth embodiment, and has the same constitution and the effects as the eighteenth embodiment except for the following described points. Hereinafter, the parts which differ from the eighteenth embodiment will be described, however the common parts will be omitted from explaining.

Figure 12A:
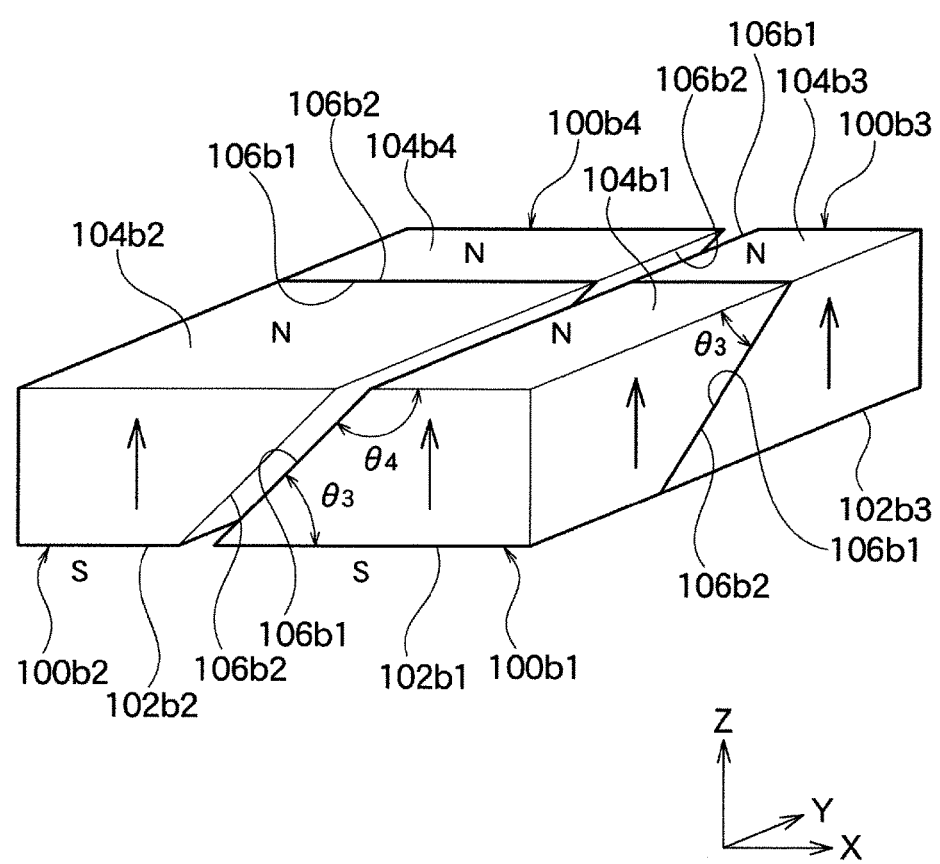
FIG. 12A is the schematic perspective view showing the assembly of the permanent magnet piece according to further other embodiment of the present invention.

As shown in FIG. 12A, the permanent magnet assembly according to the present embodiment comprises the first permanent magnet piece 100b1, the second permanent magnet piece 100b2, the third permanent magnet piece 100b3 and the fourth permanent magnet piece 100b4. The first permanent magnet piece 100b1 comprises the first mounting surface 102b1 and the first functional surface 104b1 opposing in parallel manner with the first mounting surface 102b1. The end part in X axis direction of the first permanent magnet piece 102b1 comprises the first inclined surface 106b1 formed to connect the first mounting surface 102b1 and the first functional surface 104b1 while intersecting at the predetermined angle θ4 of the obtuse angle with respect to the first mounting surface 104b1.

The end surface in Y axis direction of the first permanent magnet piece 100b1 comprises the second inclined surface 106b2 formed to connect the first mounting surface 102b1 and the first functional surface 104b1 while intersecting at the predetermined angle θ3 of the acute angle with the first functional surface 104b1.

The first permanent magnet piece 100b1 is magnetized to have the magnetization which is approximately perpendicular to the first mounting surface 102b1 and the first mounting surface 104b1. The magnetic pole of the first functional surface 104b1 is N pole.

The second permanent magnet piece 100b2 comprises the second mounting surface 102b2 and the functional surface 104b2 opposing in parallel manner with the second mounting surface 102b2. The end part in X axis direction of the second permanent magnet piece 100b2 comprises the second inclined surface 106b2 formed to connect the second mounting surface 102b2 and the second functional surface 104b2 intersecting at the predetermined angle θ3 of the acute angle with the second functional surface 104b2.

The end part in Y axis direction of the second permanent magnet piece 100b2 comprises the second inclined surface 106b2 formed to connect the second mounting surface 102b2 and the second functional surface 104b2 intersecting at the predetermined angle θ3 of the acute angle with the second functional surface 106b2.

The second permanent magnet piece 100b2 is magnetized to have the magnetization which is approximately perpendicular to the second mounting surface 102b2 and the second mounting surface 104b2. The magnetic pole of the second functional surface 104b2 is N pole.

The third permanent magnet piece 100b3 comprises the third mounting surface 102b3 and the third functional surface 104b2 opposing in parallel manner with the third mounting surface 102b3. The end part in X axis direction of the third permanent magnet piece 104b3 comprises the first inclined surface 106b1 formed to connect the third mounting surface 102b3 and the third functional surface 104b3 intersecting at the predetermined angle θ4 of the obtuse angle with the third functional surface 104b3.

The end surface in Y axis direction of the third permanent magnet piece 100b3 comprises the first inclined surface 106b1 formed to connect the third mounting surface 102b3 and the third functional surface 104b3 intersecting at the predetermined angle θ4 of the obtuse angle with the third functional surface 104b3.

The third permanent magnet piece 100b3 is magnetized to have the magnetization which is approximately perpendicular to the third mounting surface 102b3 and the third functional surface 104b3. The magnetic pole of third functional surface 104b3 is N pole.

The fourth permanent magnet piece 100b4 comprises the fourth mounting surface (not shown in the figure) and the fourth functional surface 104b4 opposing in parallel manner to the fourth mounting surface. The end part in X axis direction of the fourth permanent magnet piece 100b4 comprises the inclined surface 106b2 formed to connect the fourth mounting surface and the fourth functional surface 104b4 intersecting at the predetermined angle θ3 of the acute angle with the second functional surface 106b2.

The end part in Y axis direction of the fourth permanent magnet piece 100b4 comprises the first inclined surface 106b1 formed to connect the fourth mounting surface and the functional surface 104b4 intersecting at the predetermined angle θ4 of the obtuse angle with the first functional surface 106b1.

The fourth permanent magnet piece 100b4 is magnetized to have the magnetization which is approximately perpendicular to the fourth mounting surface and the fourth functional surface 104b4. The magnetic pole of the fourth functional surface 104b4 is N pole.

In the permanent magnet assembly according to the present embodiment, the first inclined surface 106b1 and the second inclined surface 106b2 are assembled between each permanent magnet pieces 100b1 to 100b4 to X axis direction and Y axis direction. As similar to the aforementioned embodiment, the attractive force is generated between the first inclined surface 106b1 and the second inclined surface 106b2, thus in the present embodiment, the single magnetic pole surface (in the present embodiment it is N pole, but it may be S pole as well) having relatively large area in X axis direction and Y axis direction can be formed.

As one example of FIG. 12A, the permanent magnet piece 100 having the anisotropic rare earth sintered magnet as the material, wherein after each permanent magnet pieces 100b1 to 100b4 are assembled, the length L is 50 mm, the width W is 50 mm and the thickness T is 20 mm; and the permanent magnet assembly comprising the magnetic yoke not shown in the figure comprising sufficiently larger size and thickness compared to the length and the width of after assembling each permanent magnet pieces 100b1 to 100b4 may be mentioned. For the shape shown in FIG. 12A, the repulsive force between two permanent magnet pieces assembled adjacent to each other is significantly lowered compared to the conventional examples, the same results which fall in the range between the δ1 and δ2 of FIG. 9I are obtained.

Figure 12B:
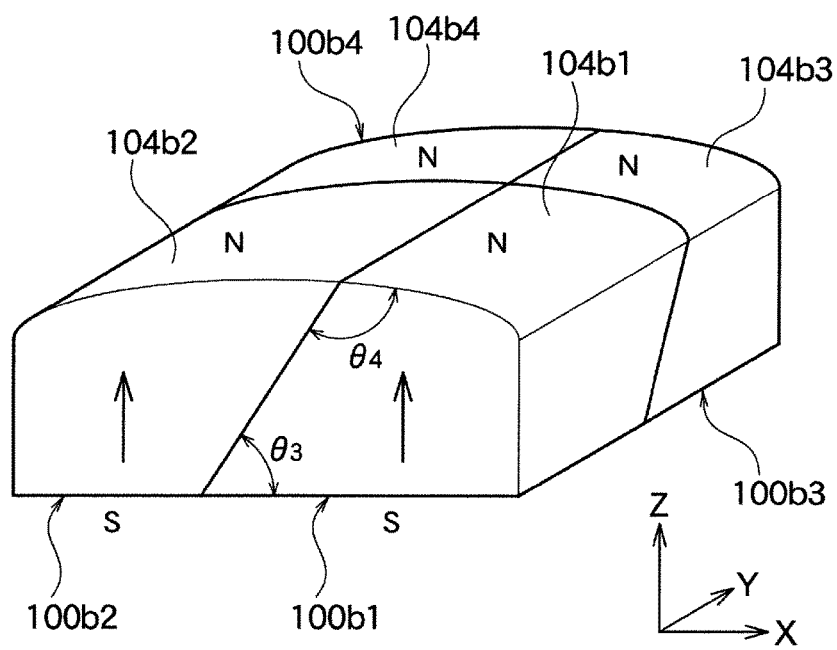
FIG. 12B is the schematic perspective view showing the modification example of the embodiment shown in FIG. 12A.

Note that, the shape of the magnetic pole surface formed by assembling the functional surfaces 104b1 to 104b4 of each of permanent magnet pieces 100b1 to 100b4 are not limited to a flat surface shape, and for example as shown in FIG. 12B, the entire functional surface may be a curved surface such as a part of the cylindrical surface. Further, the shape of the permanent magnet assembly as a whole formed by assembling the permanent magnet pieces 100b1 to 100b4 are not limited to square board shape, and for example as shown in FIG. 12C, it may be ring board shape or so.

As one example of FIG. 12B, the permanent magnet piece 100 comprising the anisotropic rare earth sintered magnet, wherein after each permanent magnet pieces 100b1 to 100b4 are assembled so that curved surface satisfies the length L of 50 mm, the width W of 50 mm and the thickness T of 20 mm at the maximum; and the permanent magnet assembly comprising the magnetic yoke not shown in the figure comprising sufficiently larger size and thickness compared to the length and the width of after assembling each permanent magnet pieces 100b1 to 100b4 may be mentioned. For the shape shown in FIG. 12B, the repulsive force between two permanent magnet pieces assembled adjacent to each other is significantly lowered compared to the conventional examples, the same results which fall in the range between the δ1 and δ2 of FIG. 9I are obtained.

Figure 12C:
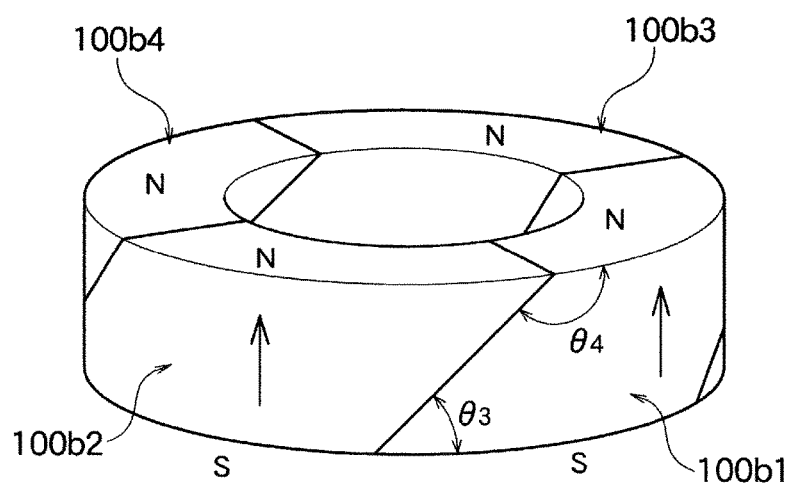
FIG. 12C is the schematic perspective view showing further other modification example of the embodiment shown in FIG. 12A.

As one example of FIG. 12C, the permanent magnet piece 100 having the anisotropic rare earth sintered magnet as the material, wherein after each permanent magnet pieces 100b1 to 100b4 are assembled so that ring plate form satisfies the outer diameter of 100 mm, the inner diameter of 60 mm and the thickness T of 20 mm; and the permanent magnet assembly comprising the magnetic yoke not shown in the figure comprising sufficiently larger size and thickness compared to the length and the width of after assembling each permanent magnet pieces 100b1 to 100b4 may be mentioned. For the shape shown in FIG. 12C, the repulsive force between two permanent magnet pieces assembled adjacent to each other is significantly lowered compared to the conventional examples, the same results which fall in the range between the δ1 and δ2 of FIG. 9I are obtained.

Twentieth Embodiment

The twentieth embodiment of the present embodiment is the modified example of the nineteenth embodiment, and has the same constitution and the effects as the nineteenth embodiment except for the following described points. Hereinafter, the parts which differ from the nineteenth embodiment will be described, however the common parts will be omitted from explaining.

Figure 13:
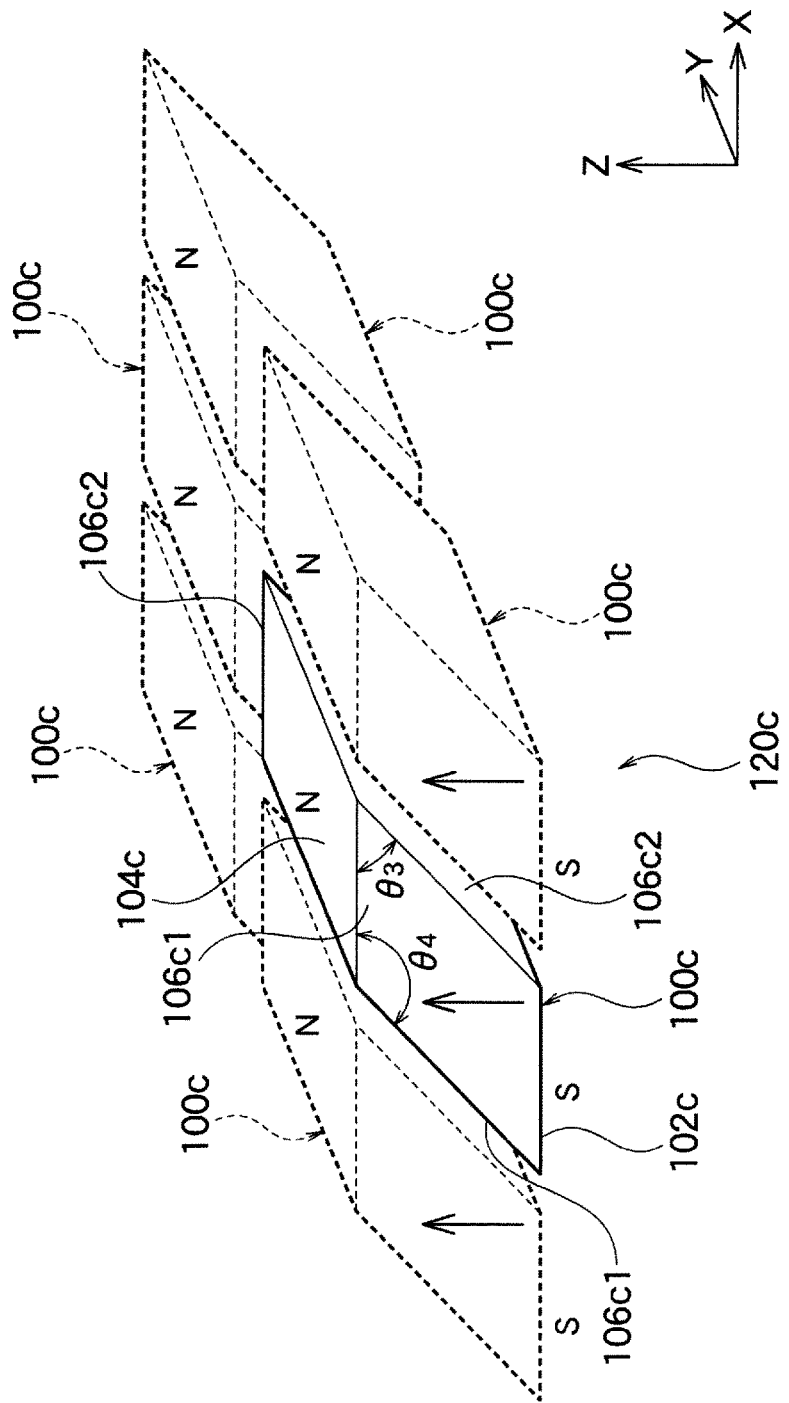
FIG. 13 is the schematic perspective view showing the assembly of the permanent magnet piece according to further other embodiment of the present invention.

As shown in FIG. 13, the permanent magnet assembly 120c according to the present embodiment is assembled by aligning the plurality of the permanent magnet pieces having the same constitution in X axis and Y axis direction. The permanent magnet piece 100c comprises the mounting surface 102c and the functional surface 104c opposing in the parallel manner with the mounting surface 102c. The both end parts in X axis direction of the permanent magnet piece 100c comprises the first inclined surface 106c1 intersecting at the predetermined angle θ4 of the obtuse angle with the functional surface 104c, and the second inclined surface 106c2 intersecting at the predetermined angle θ3 of the acute angle with the mounting functional surface 104c, wherein said first inclined surface and the second inclined surface are formed to connect the mounting surface 102c and the functional surface 104c.

The both end parts in Y axis direction of the permanent magnet piece 100c comprises the first inclined surface 106c1 intersecting at the predetermined angle θ4 of the obtuse angle with the functional surface 104c, and the second inclined surface 106c2 intersecting at the predetermined angle θ3 of the acute angle with the mounting functional surface 104c, wherein said first inclined surface and the second inclined surface are formed to connect the mounting surface 102c and the functional surface 104c.

The permanent magnet piece 100c is magnetized to have the magnetization which is approximately perpendicular to the mounting surface 102c and the functional surface 104c. The magnetic pole of the functional surface 104c is N pole. Note that, the mounting surface and the functional surface are relative concept and these are not particularly limited, and for example the mounting surface refers to the surface which is mounted to the substrate, and the functional surface refers to the magnetic pole surface.

The permanent magnet assembly 120c according to the present embodiment comprises the combination of the first inclined surface 106c1 and the second inclined surface 106c2 between each permanent magnet piece 100c in X axis direction and Y axis direction. As mentioned in above, the attractive force is generated between the first inclined surface 106c1 and the second inclined surface 106c2, hence in the present embodiment, the single magnetic pole surface (in the present embodiment it is N pole, however it may be S pole) having relatively large area in X axis direction and Y axis direction can be formed.

Twenty First Embodiment

The twenty first embodiment of the present embodiment is the modified example of the eighteenth embodiment shown in FIG. 10, and has the same constitution and the effects as the eighteenth embodiment except for the following described points. Hereinafter, the parts which differ from the eighteenth embodiment will be described, however the common parts will be omitted from explaining.

Figure 14:
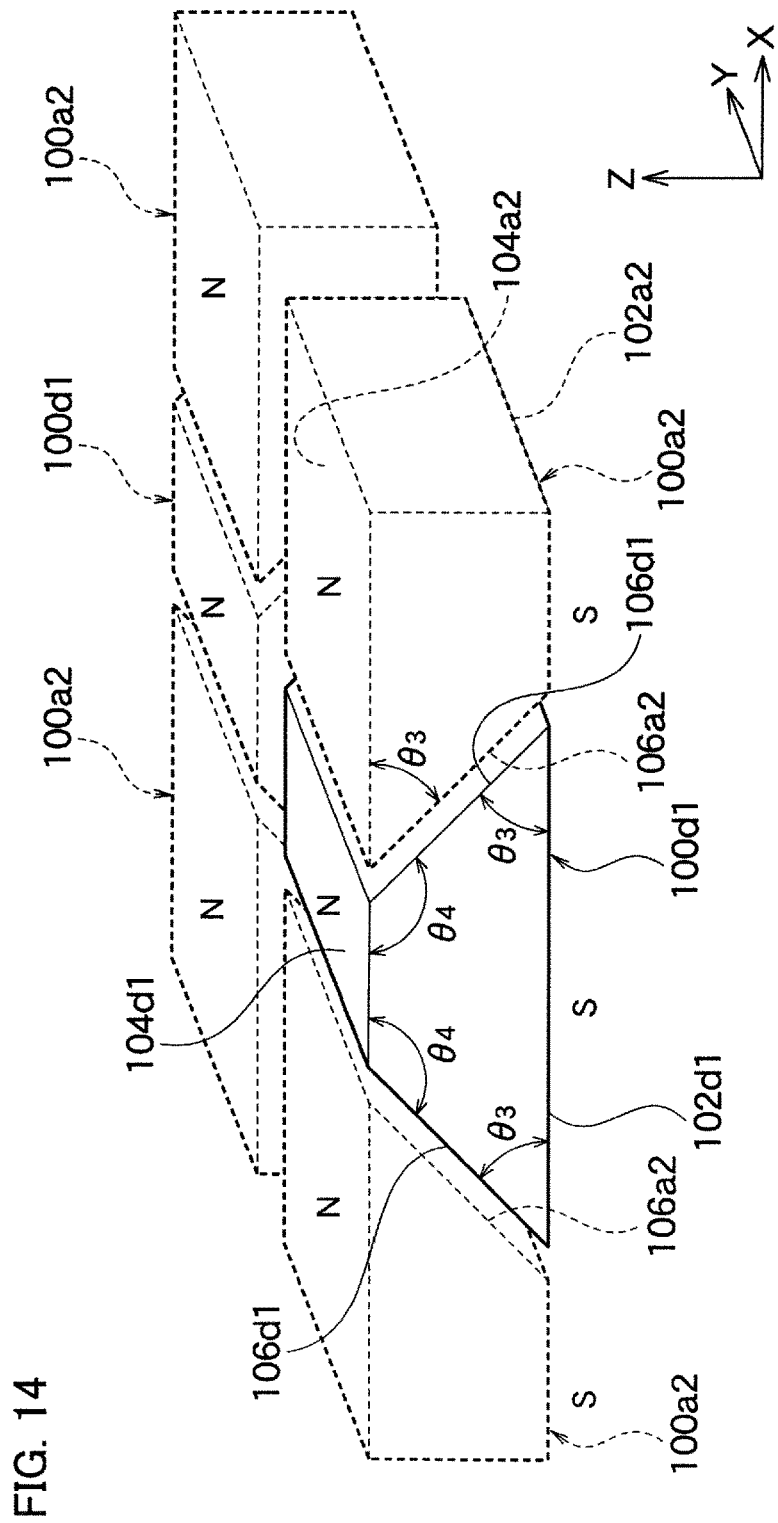
FIG. 14 is the schematic perspective view showing the assembly of the permanent magnet piece according to further other embodiment of the present invention.

As shown in FIG. 14, the permanent magnet assembly according to the present embodiment comprises at least the first permanent magnet 100d1 and the second permanent magnet pieces 100a2 which are arranged at both sides in X axis direction of the first permanent magnet piece. The first permanent magnet piece 100d1 comprises the first mounting surface 102d1, and the first functional surface 104d1 opposing in a parallel manner with the first mounting surface 102d1. The both sides in X axis direction of the first permanent magnet piece 100d1 comprises the first inclined surface 106d1 which is formed to connect the first mounting surface 102d1 and the first functional surface 104d1 while intersecting at the predetermined angle θ4 of the obtuse angle with the first functional surface 104d1.

The first permanent magnet piece 100d1 is magnetized to have the magnetization which is approximately perpendicular with the first mounting surface 102d1 and the first functional surface 104d1. Also, the magnetic pole of the main part of the first inclined surface 106d1 has the magnetic pole (N pole) which is same as the first functional surface 104a1.

The second permanent magnet pieces 100a2 which are arranged at both sides in X axis direction of the first permanent magnet piece 100a1 is the same as the second permanent magnet piece 100a2 shown in FIG. 10. That is, the second permanent magnet piece 100a2 comprises the second mounting surface a2, the second functional surface 104a2 opposing in parallel manner with the second mounting surface 102a2, and the second inclined surface 106a2 formed to connect the second mounting surface 102a2 and the second functional surface 104a2 while intersecting at the predetermined angle θ3 of the acute angle with the second functional surface 104a2.

The second permanent magnet piece 100a2 is magnetized to have the magnetization which is approximately perpendicular to the second mounting surface 102a2 and the second functional surface 104a2. Also, the magnetic pole of the main part of the second inclined surface 106a2 is the opposite magnetic pole (N pole) of the second functional surface 104a2. The assembly of the first permanent magnet piece 100d1 and a pair of the second permanent magnet pieces 100d2 can be arranged continuously in Y axis direction as well. The space may be formed between the first magnet pieces 100d1 arranged in Y axis direction, however as similar to the embodiment shown in FIG. 13, at the both ends in Y axis direction of the first permanent magnet pieces 100d1, the first inclined surface 106d1 or the second inclined surface may be formed.

In the permanent magnet assembly of present embodiment, the combination of the first inclined surface 106d1 and the second inclined surface 106a2 is formed between the first permanent magnet piece 100d1 and the second permanent magnet piece 100a2 at least along X axis direction. As similar to the aforementioned embodiment, the attractive force is generated between the first inclined surface 106d1 and the second inclined surface 106a2, hence in the present embodiment, the single magnetic pole surface (in the present embodiment it is N pole, however it may be S pole) having relatively large area can be formed at least in X axis direction.

Twenty Second Embodiment

The twenty second embodiment of the present invention is the modified example of the twentieth embodiment shown in FIG. 13, and has the same constitution and the effects as the twentieth embodiment except for the following described points. Hereinafter, the parts which differ from the eighteenth embodiment will be described, however the common parts will be omitted from explaining.

Figure 15:
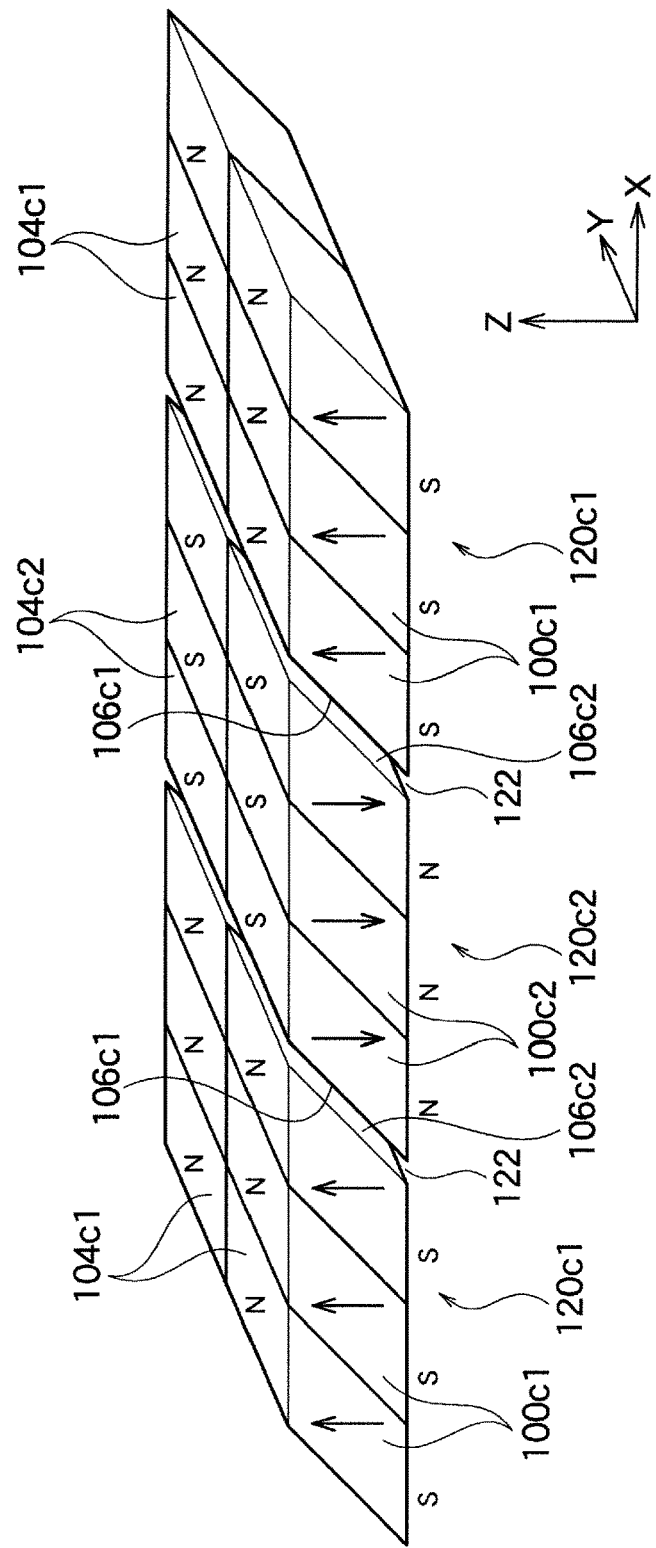
FIG. 15 is the schematic perspective view showing the assembly of the permanent magnet piece according to further other embodiment of the present invention.

As shown in FIG. 15, the permanent magnet assembly according to the present embodiment comprises the permanent magnet assembly 120c1 and the permanent magnet assembly 120c2 having relatively large area along X axis direction and/or in Y axis direction in alternating manner while taking predetermined space 122. The permanent magnet assembly 120c1 is the same constitution as the permanent magnet assembly 120c shown in FIG. 13, and the functional surface 104c1 has the magnetic pole of N pole. On the contrary, the permanent magnet assembly 120c2 has the same constitution as the permanent magnet piece 120c1 except that the magnetic pole of the functional surface 104c2 is S pole.

The space 122 is the space formed between the first permanent magnet piece (the first permanent magnet assembly) 100c1 and the second permanent magnet piece (the second permanent magnet assembly) 100c2, wherein the first permanent magnet piece and the second permanent magnet piece respectively comprises the functional surface 104c1 and the functional surface 104c2 which are magnetized to different magnetic pole (S pole and N pole). Therefore, as shown in the first to sixteenth embodiments, the attractive force is not acting but the repulsive force is acting at the space between the inclined surface 106c1 and the inclined surface 106c2 which are opposing across space 122.

For example, when placing the large magnets having different magnetic pole in alternating manner, for example of the magnetic pole of the linear motor, the magnets having different magnetic poles may be provided with a space in between considering the thermal expansion thereof. Here, by using the structure shown in FIG. 15, the magnet groups can be assembled without causing the attraction between the different poles by placing the space in between each magnet group (the permanent magnet assembly 120c1 and 120c2) having large area.

Note that, in the structure shown by FIG. 15, as the permanent magnet assembly, the functional surface 104c1 and the functional surface 104c2 which are magnetized to have different magnetic pole (S pole and N pole) and fixed in alternating manner, the attractive force acts as in the conventional example. Also, the repulsive force, not the attractive force, is acting between the inclined surface 106c1 and the inclined surface 106c2 opposing across the space 122. As a result, the direction of the force described in the seventeenth embodiment to twenty first embodiments will be the opposite direction; however the ratio thereof showed that the same results which fall in the range between the δ1 and δ2 of FIG. 9I are obtained.

That is, the ratio with respect to the force acting on the first permanent magnet piece 100c1 of the conventional example was confirmed to be within the range between the δ1 and δ2 of FIG. 9I. Therefore, even if the material and the size of the permanent magnet piece is changed and then adhering the two permanent magnet pieces 100 to the magnetic yoke 110; the attractive force against the two permanent magnet pieces which is assembled with the adjacent ones is significantly decreased compared to the conventional examples. As a result, the cost performance and the productivity are improved.

Also, as shown in FIG. 15, the second permanent magnet piece (the permanent magnet assembly) 100c2 is arranged so that it is placed between two first permanent magnet pieces (the permanent magnet assembly), and due to its repulsive force, the self-aligning positioning can be done.

Twenty Third Embodiment

The permanent magnet pieces and the permanent magnet assembly according to the above mentioned embodiments can be used for the wide range of the technical field such as MRI magnetic field generator, a magnetic field generator for the plasma device, a magnetic circuit of the rotary machine, a linear motor, a linear transportation system or so.

Figure 16A:
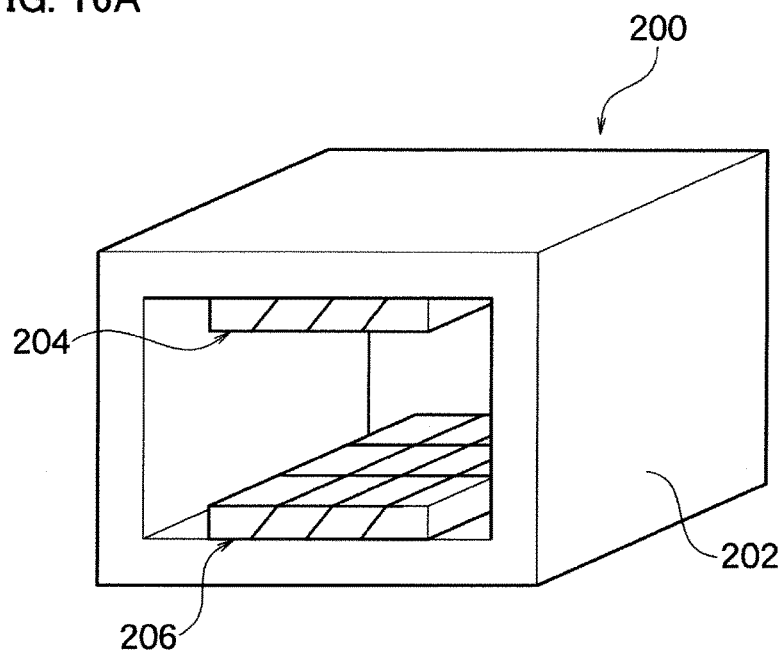
FIG. 16A is the schematic perspective view of MRI magnetic field generator using the assembly of the permanent magnet piece according to the embodiment of the present invention.

FIG. 16A shows the MRI magnetic field generator. The magnetic field generator comprises the case 202 which is constituted by the strong magnetic material; and inside of it, N pole magnet 204 having the magnetic pole surface of large area, and the S pole magnet 206 having the magnetic pole surface of large area are arranged by opposing to each other while taking predetermined space in between. In this embodiment, N pole magnet 204 and S pole magnet 206 can be constituted by the permanent magnet assembly of the above mentioned embodiment.

Figure 16B:
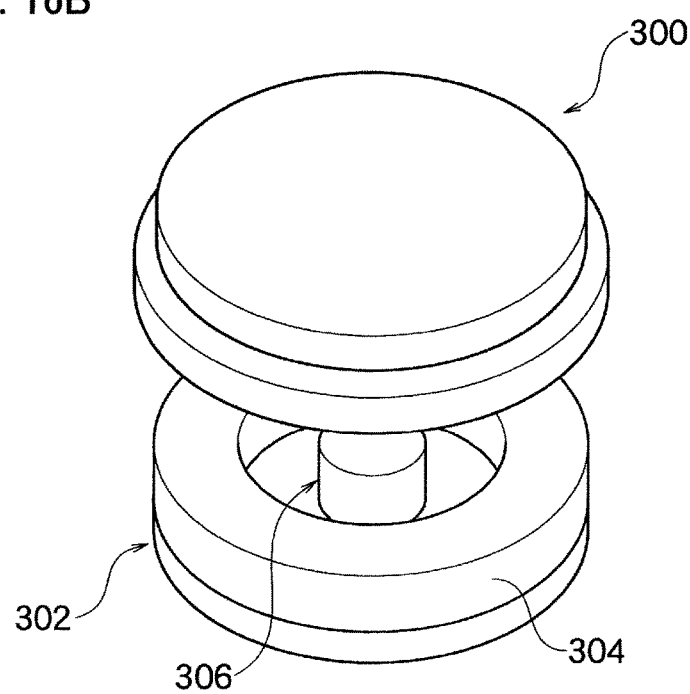
FIG. 16B is the schematic perspective view of a plasma generator using the assembly of the permanent magnet piece according to the embodiment of the present invention.

FIG. 16B shows a magnetic field generator 302 for the plasma device 300. The magnetic field generator 302 comprises the ring form magnet 304, and the circular plate form magnet 306. In the present embodiment, the ring form magnet 304 and the circular plate form magnet 306 can be constituted by the permanent magnet assembly of the above mentioned embodiment.

Figure 16C:
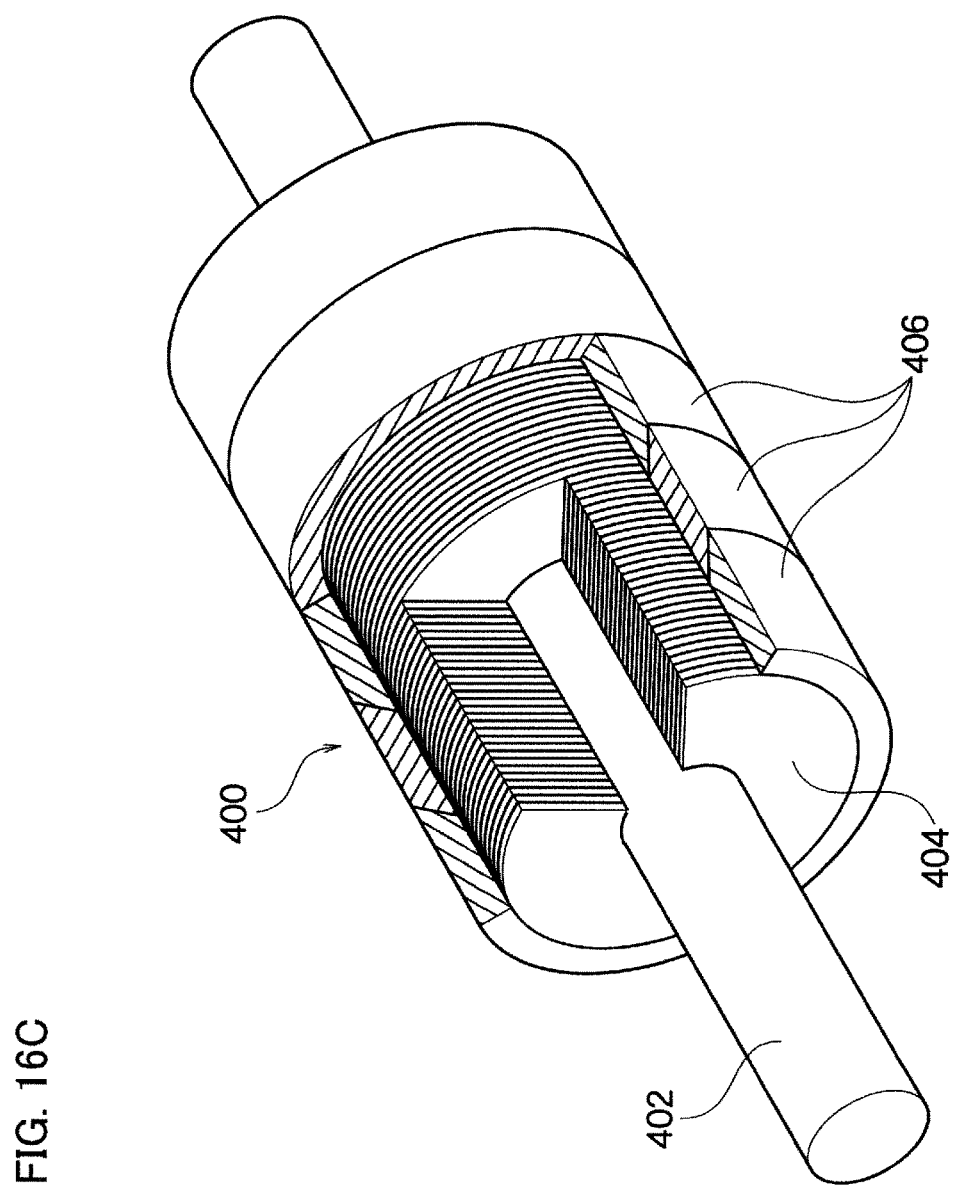
FIG. 16C is the schematic perspective view of a rotary machine using the assembly of the permanent magnet piece according to the embodiment of the present invention.

FIG. 16C shows a magnetic circuit rotary machine 400. The magnetic circuit rotary machine 400 comprises the rotary axis 402. The rotary axis 402 is stacked with the multilayer electromagnetic steel board 404 along the axis direction thereof, and at the outer circumference thereof, plurality of magnets 406 are mounted. In the present embodiment, each magnet 406, or the combination of the magnets 406 can be constituted by the permanent magnet assembly of the above mentioned embodiment.

Figure 16D:
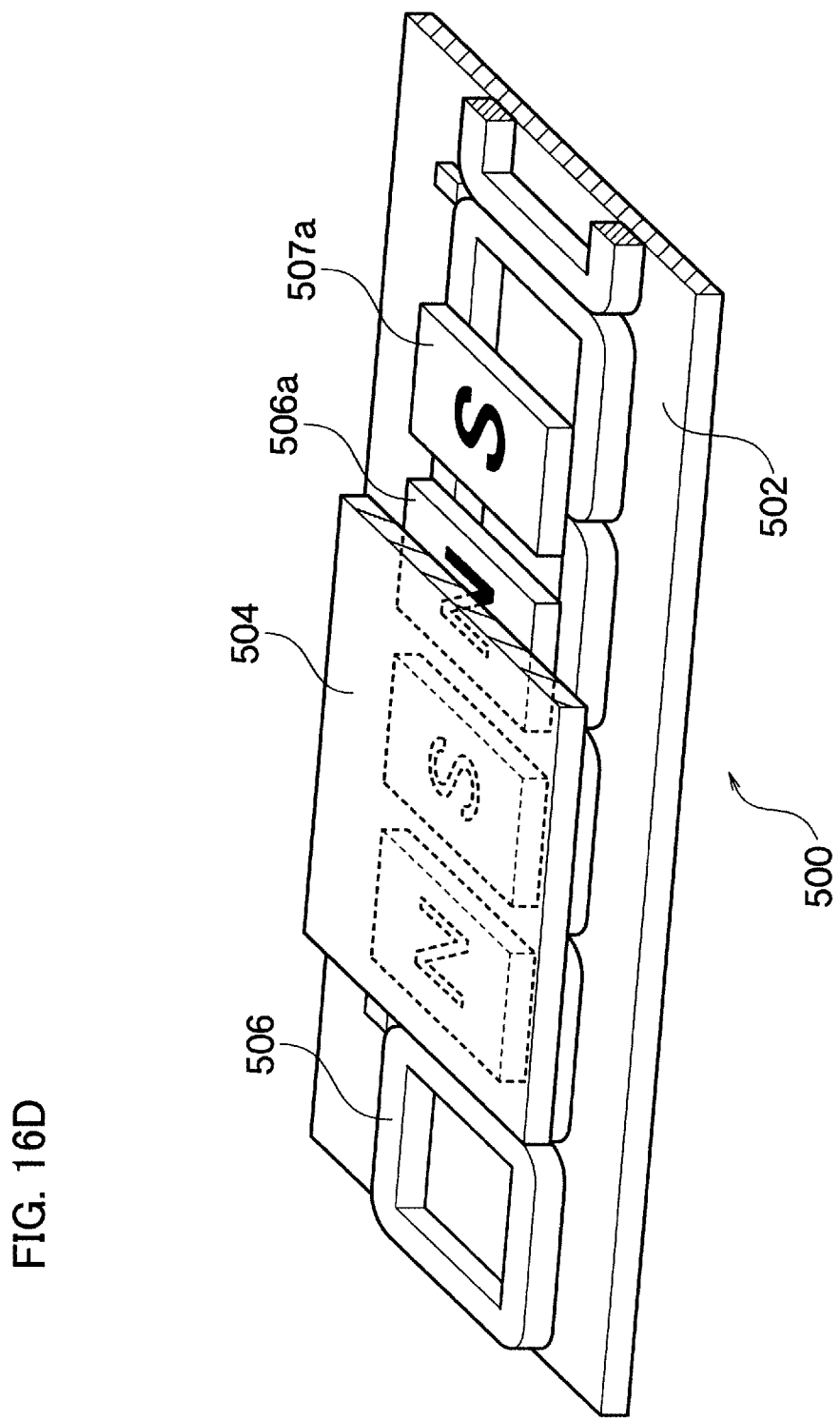
FIG. 16D is the schematic perspective view of a linear motor using the assembly of the permanent magnet piece according to the embodiment of the present invention.

FIG. 16D shows the liner motor 500. The linear motor 500 comprises the stator 502 and the mover 504. At the surface of the stator 502, the electromagnetic coil 506 is arranged along the moving direction of the mover 504. The mover 504 is opposing against the stator 502 while taking predetermine space in between. To the mover 504, the permanent magnet 506a which is magnetized to N pole and the permanent magnet 507a which is magnetized to S pole are fixed in alternating manner along the moving direction. The permanent magnet 506a and the permanent magnet 507a are constituted by the permanent magnet assembly described in the above embodiments.

Note that, the present invention is not to be limited to the embodiments described in above, and it can be variously modified within the scope of the present invention. For example, in the present invention, not only to use the above mentioned embodiments singularly, but also two or more of the embodiments may be combined for use. Also, in the above mentioned embodiments, the inclined surfaces and the connecting surfaces were all flat surface shape, however, it is not limited to flat surface and it may be a curved surface as well.

INDUSTRIAL APPLICABILITY

As discussed hereinabove, according to the arcuate magnet piece of the present invention and the motor comprising said magnet, while maintaining the large surface magnetic flux density, the cogging torque and the torque ripple can be sufficiently suppressed, and the torque characteristic can be improved. Also, since the structure is simple and the production cost is reduced, the cost performance and the productivity can be improved. Hence, the present invention is applicable to general use of the cylindrical shape permanent magnet, and the motors in general comprising these such as SPM motor or so, and also the present invention is effectively applicable to various devices, equipment and systems comprising these.

Also, according to the permanent magnet piece and the permanent magnet assembly of the present invention, the magnet having large area can be easily assembled, and for example, it can be used for the wide range of the technical field such as MRI magnetic field generator, a magnetic field generator for the plasma device, a magnetic circuit of the rotary machine, a linear motor, a linear transportation system or so.

REFERENCES OF NUMERALS

1 . . . Arcuate magnet piece
2 . . . Outer circumference surface
3 . . . Inner circumference surface
4,5 . . . End surface
6 . . . First connecting side surface
6a . . . Tip surface
6b . . . Tip corner part
6c . . . Base end surface
6d . . . Base end corner part
7 . . . Second connecting side surface
7a . . . Tip surface
7b . . . Tip corner part
7c . . . Base end surface
7d . . . Base end corner part
8,8a,8b . . . Space
20 . . . Yoke
21 . . . Shaft
50 . . . Armature
51 . . . Slot
100 . . . Permanent magnet piece of the present invention
100a . . . Permanent magnet piece of the conventional example
102 . . . First surface
104 . . . Second surface
106 . . . Inclined surface
100a1 . . . First permanent magnet piece
102a1 . . . First mounting surface
104a1 . . . First functional surface
106a1 . . . First inclined surface
100a2 . . . Second permanent magnet piece
102a2 . . . Second mounting surface
104a2 . . . Second functional surface
106a2 . . . Second inclined surface
110 . . . Substrate (magnetic yoke)
120a, 120c . . . Permanent magnet assembly

The invention claimed is:

1. An arcuate magnet piece, comprising:
an inner circumference surface which is curved;
an outer circumference surface which is curved and opposes the inner circumference surface;
a first connecting side surface configured to connect with another arcuate magnet piece assembled adjacently, the first connecting side surface comprising a first corner part of a first acute angle, the first connecting side surface intersecting at a first predetermined angle with respect to a tangent line in a curving direction of the outer circumference surface; and
a second connecting side surface configured to connect with another arcuate magnet piece assembled adjacently, the second connecting side surface comprising a second corner part of a second acute angle, the second connecting side surface intersecting at a second predetermined angle with respect to the tangent line, the second connecting side surface being arranged in an opposite position along the curving direction from the first connecting side surface, wherein each connecting side surface is configured to have a space and be approximately parallel with an adjacent connecting side surface with magnetizing directions near the respective connecting side surface and adjacent connecting side surface being substantially parallel,
magnetic poles of the inner circumference surface and an inner circumference surface of an adjacent other arcuate magnetic piece are different, or magnetic poles of the outer circumference surface and an outer circumference surface of the adjacent other arcuate magnet piece are different, and
a sum of the first predetermined angle and the second predetermined angle is approximately 180 degrees.

2. The arcuate magnetic piece as set forth in claim 1 wherein when the first predetermined angle is an acute angle, the first predetermined angle is 60 degrees or less.

3. The arcuate magnetic piece as set forth in claim 1 wherein when the first predetermined angle is an obtuse angle, the first predetermined angle is 120 degrees or more.

4. The arcuate magnetic piece as set forth in claim 1, wherein the first corner part comprises a curved surface or a chamfered surface.

5. The arcuate magnet piece as set forth in claim 1, wherein a sum of the first predetermined angle and a predetermined angle of the adjacent connecting side surface corresponding to the first connecting side surface is approximately 180 degrees so that the first connecting side surface and the adjacent connecting side surface are approximately parallel to each other via the space.

6. The arcuate magnet piece as set forth in claim 1 wherein the arcuate magnet piece is obtained by sintering a molded body obtained by CIM molding or MIM molding.

7. The arcuate magnet piece as set forth in claim 1, wherein at least one of an end surface of an axial direction of the arcuate magnet piece is formed with a positioning projection part or a positioning depression part from the end surface along the axial direction, and
the arcuate magnet piece is obtained by sintering a molded body by CIM molding or MIM molding.

8. A motor comprising a magnet wherein even numbers of the arcuate magnet pieces as set forth in claim 1 are assembled.

9. A permanent magnet piece comprising:
a first surface;
a second surface opposing the first surface;
a first inclined surface connecting the first surface and the second surface while intersecting at a first predetermined angle with respect to an extending line of a direction of the second surface, the first predetermined angle being an acute angle of 60 degrees or less; and
a second inclined surface formed to connect the first surface and the second surface while intersecting at a second predetermined angle with respect to the extending line, the second predetermined angle being an obtuse angle of 120 degrees or more, wherein the permanent magnet piece is magnetized to have approximately perpendicular magnetization to the first surface or the second surface, and
a sum of the first predetermined angle and the second predetermined angle is approximately 180 degrees.

10. The permanent magnet piece as set forth in claim 9, wherein the first surface and the second surface are parallel.

11. The permanent magnet piece as set forth in claim 9, wherein the first predetermined angle is 50 degrees or less.

12. The permanent magnet piece as set forth in claim 9, wherein the second predetermined angle is 130 degrees or more.

13. The permanent magnet piece as set forth in claim 9, wherein a corner part of an acute angle where the first surface and the second inclined surface intersect comprises a curved surface or a chamfered surface.

14. The permanent magnet piece as set forth in claim 9, wherein a coercivity $H_{CJ}$[A/m] satisfies $H_{CJ} \geq 1.3 \times B_r/\mu_0$ with respect to residual magnetic flux density $B_r$[T] of the permanent magnet piece, where $\mu_0$ is a magnetic permeability in vacuo, and the coercivity $H_{CJ}$[A/m] and residual magnetic flux density are values at 20° C.

15. A permanent magnet assembly comprising:
a first permanent magnet piece comprising:
a first mounting surface;
a first functional surface opposing the first mounting surface;
a first inclined surface connecting the first mounting surface and the first functional surface while intersecting at a first predetermined angle that is an obtuse angle of 120 degrees or more with respect to an extending line in a direction of the first functional surface;
and a second inclined surface connecting the first mounting surface and the first functional surface while intersecting at a second predetermined angle that is an acute angle with respect to the extending line; and
a second permanent magnet piece, comprising:
a second mounting surface;
a second functional surface opposing the second mounting surface; and
a third inclined surface connecting the second mounting surface and the second functional surface while intersecting at a third predetermined angle that is an acute angle of 60 degrees or less with respect to the second functional surface, wherein the first permanent magnet piece is magnetized approximately perpendicular to the first mounting surface or the first functional surface, the second permanent magnet piece is magnetized approximately perpendicular to the second mounting surface or the second functional surface, and a sum of the first predetermined angle and the second predetermined angle is approximately 180 degrees.

16. The permanent magnet assembly as set forth in claim 15 wherein a sum of the first predetermined angle and the third predetermined angle is 180 degrees.

17. The permanent magnet assembly as set forth in claim 15, wherein a magnetic pole of the first functional surface and a magnetic pole of the second functional surface are opposite, and the first inclined surface and the third inclined surface repel against each other by magnetic force.

18. A permanent magnet application device such as a magnetic circuit of a rotary machine, a linear motor or a linear transportation system using the permanent magnet assembly as set forth in claim 17.

19. The permanent magnet assembly as set forth in claim 15, wherein a magnetic pole of the first functional surface and a magnetic pole of the second functional surface are equal, and
the first inclined surface and the third inclined surface attract each other by magnetic force.

20. A permanent magnet application device such as a magnetic field generating device for MRI or a magnetic field generating device for plasma device using the permanent magnet assembly as set forth in claim 19.

21. The permanent magnet assembly as set forth in claim 17, wherein the first functional surface and the second functional surface are cylindrical surfaces, or the first mounting surface and the second mounting surface are cylindrical surfaces.

22. The permanent magnet assembly as set forth in claim 19, wherein at least one of the first permanent magnet piece and the second permanent magnet piece are adhered to a substrate.

23. The permanent magnet assembly as set forth in claim 22, wherein the second mounting surface is adhered to the substrate.

24. The permanent magnet assembly as set forth in claim 22, wherein the substrate is a magnetic material.

25. A permanent magnetic piece, comprising: a first surface;
a second surface opposing the first surface; a first connecting side surface configured to connect with another permanent magnetic piece assembled adjacently, the first connecting side surface intersecting at a first predetermined angle with respect to an extending line in an extending direction of the second surface, the first predetermined angle being an acute angle of 60 degrees or less;
and a second connecting side surface configured to connect with another permanent magnetic piece assembled adjacently, the second connecting side surface intersecting at a second predetermined angle with respect to the extending line, the second connecting side surface being arranged in an opposite position along the extending direction from the first connecting side surface, the second predetermined angle being an obtuse angle of 120 degrees or more, wherein each connecting side surface is configured to have a space and be approximately parallel with an adjacent connecting side surface with magnetizing directions near the respective connecting side surface and adjacent connecting side surface being substantially parallel, the permanent magnetic piece is magnetized so that magnetic poles of the first surface and a second surface of an adjacent other permanent magnetic piece are equal, or magnetic poles of the second surface and a first surface of the adjacent other permanent magnetic piece are equal, and a sum of the first predetermined angle and the second predetermined angle is approximately 180 degrees.

26. The permanent magnetic piece as set forth in claim 25 wherein the first predetermined angle is 50 degrees or less.

27. The permanent magnetic piece as set forth in claim 25, wherein the second predetermined angle is 130 degrees or more.

28. The permanent magnetic piece as set forth in claim 25, wherein a corner part of an acute angle where the first surface and the second connecting side surface intersect comprises a curved surface or a chamfered surface.

29. The permanent magnetic piece as set forth in claim 25, wherein a coercivity $H_{CJ}$[A/m] satisfies $H_{CJ} \geq 1.3 \times B_r/\mu_0$ with respect to the residual magnetic flux density $B_r$[T] of the permanent magnet piece, where $\mu_0$ is a magnetic permeability in vacuo, and the coercivity $H_{CJ}$[A/m] and residual magnetic flux density are values at 20° C.

30. The permanent magnetic piece as set forth in claim 25, wherein the first surface is adhered to a magnetic material.

31. A permanent magnetic assembly wherein a plurality of the permanent magnetic pieces as set forth in claim 25 are assembled.

32. The permanent magnetic assembly of claim 31, wherein the space is 0.2 mm or less.

33. A permanent magnet piece, comprising: a first surface; a second surface opposing the first surface; a first connecting side surface configured to connect with another permanent magnet piece assembled adjacently, the first connecting side surface intersecting at a first predetermined angle with respect to an extending line in an extending direction of the second surface, the first predetermined angle being an acute angle of 60 degrees or less;

and a second connecting side surface configured to connect with another permanent magnet piece assembled adjacently, the second connecting side surface intersecting at a second predetermined angle with respect to the extending line, the second connecting side surface being arranged in an opposite position along the extending direction from the first connecting side surface, the second predetermined angle being an obtuse angle of 120 degrees or more, wherein each connecting side surface is configured to have a space and be approximately parallel with an adjacent connecting side surface with magnetizing directions near the respective connecting side surface and the adjacent connecting side surface being substantially parallel, the permanent magnet piece is magnetized so that magnetic poles of the first surface and a second surface of an adjacent other permanent magnet piece are equal, or magnetic poles of the second surface and a first surface of the adjacent other permanent magnet piece are equal, and a sum of the first predetermined angle and the second predetermined angle is approximately 180 degrees.

34. The permanent magnet piece as set forth in claim 33 wherein the first predetermined angle is 50 degrees or less.

35. The permanent magnet piece as set forth in claim 33, wherein the second predetermined angle is 130 degrees or more.

36. The permanent magnet piece as set forth in claim 33, wherein a corner part of an acute angle where the first surface and the second connecting side surface intersect comprises a curved surface or a chamfered surface.

37. The permanent magnet piece as set forth in claim 33, wherein a coercivity $H_{CJ}$[A/m] satisfies $H_{CJ} \geq 1.3 \times B_r/\mu_0$ with respect to the residual magnetic flux density $B_r$[T] of the permanent magnet piece, where $\mu_0$ is a magnetic permeability in vacuo, and the coercivity $H_{CJ}$[A/m] and residual magnetic flux density are values at 20° C.

38. The permanent magnet piece as set forth in claim 33, wherein the first surface is adhered to a magnetic material.

39. A permanent magnet assembly wherein a plurality of the permanent magnet pieces as set forth in claim 33 are assembled.

* * * * *